(12) United States Patent
Yamazaki et al.

(10) Patent No.: US 8,071,404 B2
(45) Date of Patent: Dec. 6, 2011

(54) METHOD FOR FABRICATING LIGHT EMITTING DEVICE

(75) Inventors: Shunpei Yamazaki, Tokyo (JP); Koichiro Tanaka, Kanagawa (JP); Hisao Ikeda, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 78 days.

(21) Appl. No.: 12/536,069

(22) Filed: Aug. 5, 2009

(65) Prior Publication Data
US 2010/0035371 A1    Feb. 11, 2010

(30) Foreign Application Priority Data

Aug. 8, 2008   (JP) .................................. 2008-205664

(51) Int. Cl.
H01L 21/00      (2006.01)

(52) U.S. Cl. ................ 438/31; 438/30; 438/44; 438/69; 257/E21.033; 257/E21.527

(58) Field of Classification Search ............ 438/44, 438/676, 679; 257/E21.527
See application file for complete search history.

(56) References Cited

U.S. PATENT DOCUMENTS

| 5,851,709 | A | * | 12/1998 | Grande et al. ............ 430/7 |
| 5,937,272 | A | | 8/1999 | Tang |
| 6,165,543 | A | | 12/2000 | Otsuki et al. |
| 6,283,060 | B1 | | 9/2001 | Yamazaki et al. |
| 6,689,492 | B1 | | 2/2004 | Yamazaki et al. |
| 6,703,179 | B2 | | 3/2004 | Tyan |
| 6,776,847 | B2 | | 8/2004 | Yamazaki et al. |
| 7,309,269 | B2 | | 12/2007 | Yamazaki et al. |
| 7,316,983 | B2 | | 1/2008 | Yamazaki et al. |
| 2004/0031442 | A1 | | 2/2004 | Yamazaki et al. |
| 2004/0065902 | A1 | | 4/2004 | Yamazaki et al. |
| 2005/0005848 | A1 | | 1/2005 | Yamazaki et al. |
| 2006/0243377 | A1 | | 11/2006 | Matsuo et al. |
| 2007/0054051 | A1 | | 3/2007 | Arai et al. |
| 2007/0087130 | A1 | | 4/2007 | Arai |
| 2008/0081115 | A1 | | 4/2008 | Yamazaki et al. |
| 2008/0282984 | A1 | | 11/2008 | Yamazaki et al. |
| 2008/0299496 | A1 | | 12/2008 | Hirakata et al. |
| 2009/0074952 | A1 | | 3/2009 | Yamazaki et al. |
| 2009/0104403 | A1 | | 4/2009 | Aoyama et al. |
| 2009/0104835 | A1 | | 4/2009 | Aoyama et al. |

* cited by examiner

*Primary Examiner* — Cheung Lee
(74) *Attorney, Agent, or Firm* — Husch Blackwell LLP

(57) ABSTRACT

By using a first substrate which has a light-transmitting property and whose first face is provided with a light-absorbing layer, a mixture including an organic compound and an inorganic material is irradiated with light having a wavelength, which is absorbed by the inorganic material to heat the mixture, and thereby a film of the organic compound included in the mixture is formed on the first face of the first substrate. Then, the first face of the first substrate and a deposition surface of a second substrate are arranged to be adjacent to or in contact with each other, irradiation with light having a wavelength, which is absorbed by the light-absorbing layer is conducted from a second face side of the first substrate, to heat the organic compound, and thereby at least part of the organic compound is formed as a film on the deposition surface of the second substrate.

52 Claims, 24 Drawing Sheets

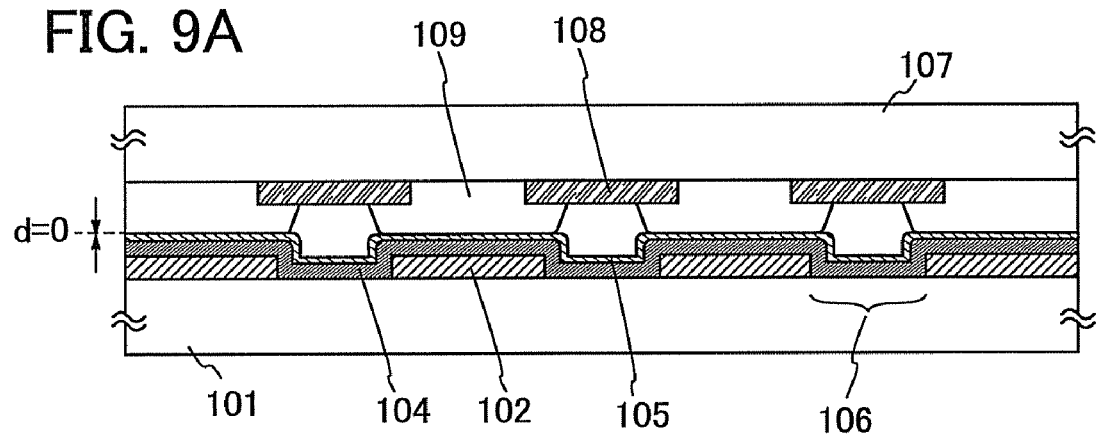
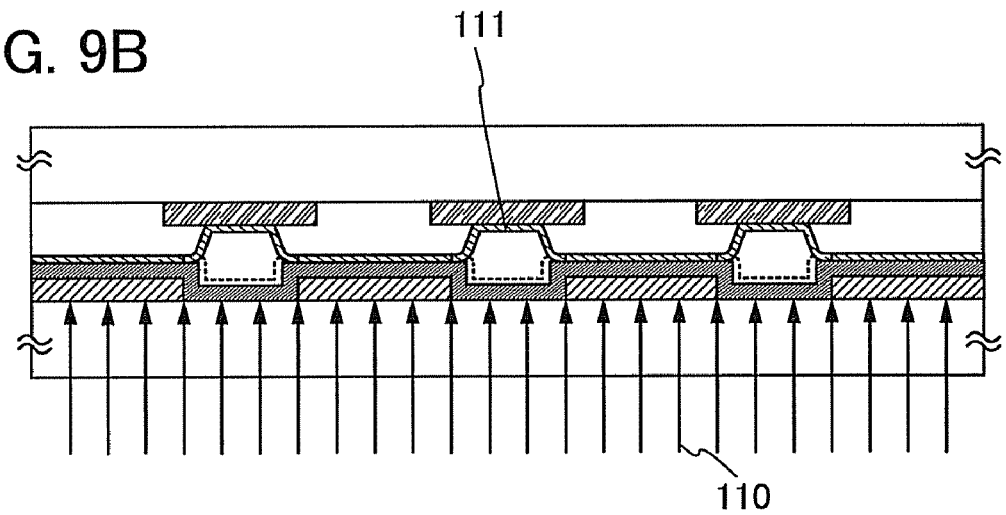

METHOD FOR FABRICATING LIGHT EMITTING DEVICE

CROSS REFERENCE TO RELATED APPLICATIONS

This application claims priority under 35 USC §116 to serial no. JP 2008-205664 filed Aug. 8, 2008 in Japan, the entire contents which are hereby incorporated by reference.

BACKGROUND OF THE INVENTION

1. Field of the Invention

The present invention relates to a method for fabricating a light emitting device.

2. Description of the Related Art

An organic compound can take a wider variety of structures than an inorganic compound, and it is possible to synthesize a material having various functions by appropriate molecular-design of an organic compound. Owing to these advantages, electronics which utilize functional organic materials have been attracting attention in recent years.

For example, a solar cell, a light emitting element, an organic transistor, and the like are exemplified as an electronic device utilizing an organic compound as a functional material. These devices utilize electric properties and optical properties of such an organic compound.

In particular, light emitting elements including an organic compound as a light emitting material, which have features such as thinness, lightness, high-speed responses, and DC drive at low voltage, are expected to be applied to next-generation flat panel displays. In particular, advantageously, display devices in which light emitting elements are arranged in matrix are superior in viewing angle and visibility to conventional liquid crystal display devices.

The following is said to be a general light emitting mechanism of a light emitting element: when voltage is applied between a pair of electrodes with an electroluminescent (hereinafter also referred to as EL) layer interposed therebetween, electrons injected from a cathode and holes injected from an anode are recombined at emission centers in the EL layer to form molecular excitons, and energy is released when the molecular excitons relax to the ground state. As excited states, a singlet excited state and a triplet excited state are known, and light emission is considered to be possible through either of the excited states.

An EL layer included in a light emitting element has at least a light emitting layer. An EL layer can also have a stacked-layer structure including a hole injecting layer, a hole transporting layer, an electron transporting layer, an electron injecting layer, and/or the like, in addition to a light emitting layer.

EL materials for forming EL layers are broadly classified into a low molecular (monomer) material and a high molecular (polymer) material. In general, a low molecular material is often deposited by an evaporation method and a high molecular material by an inkjet method, a spin coating method, or the like.

When the evaporation method is employed to manufacture a full-color display device with red, green, and blue light emitting elements, a shadow mask is provided in contact with a substrate between the substrate and an evaporation source and selective formation of a light emitting element for each color can be achieved through this mask.

However, a shadow mask which is used to manufacture a full-color display device is very thin because of the necessity for precise formation of its opening portion. Thus, if the size of a shadow mask is increased as the size of a substrate is increased, problems may arise in that a shadow mask sags and the size of an opening portion is changed. It is difficult to adopt a means for reinforcing a shadow mask because an extremely fine pattern is formed in a region of the shadow mask corresponding to a pixel portion.

Furthermore, miniaturization of each display pixel pitch is increasingly demanded with higher definition of a display device (with an increase in the number of pixels), and there is a trend toward even thinner shadow masks.

On the other hand, a method for directly forming an EL layer over a deposition substrate by a wet method such as an inkjet method or a spin coating method can also be employed when the size of a substrate is increased; however, it is difficult to make a uniform thickness by this method. When a wet method is employed, it is necessary that a composition or a solution including an EL material is applied and then baked to remove a solvent. Thus, in the case of stacking layers including an EL material, an application step and a baking step should be repeated, and it takes a lot of time. In the case of stacking layers by a wet method such as an inkjet method, a layer should be formed using a solvent in which a previously formed layer is not to be soluble, and there are only limited choices of materials and stacked-layer structures to be used. If there are only limited choices of materials or stacked-layer structures to be used, there is a significant limitation on the performance of a light emitting element (such as emission efficiency or lifetime). Thus, a wet method may cause a major obstacle to improvement in the performance of a light emitting device; for example, it may prevent the application of even a light emitting element with an excellent structure to a light emitting device.

SUMMARY OF THE INVENTION

Therefore, it is an object of one embodiment of the present invention to provide a method for fabricating a light emitting device of which an EL layer structure is not limited. It is another object to increase use efficiency of a material in fabrication of a light emitting device. It is still another object to reduce a fabrication cost of a light emitting device.

One embodiment of the present invention is a method for fabricating a light emitting device in which an organic compound provided for a first substrate is irradiated with light so as to form a film of the organic compound on a second substrate. By using the first substrate which has a light-transmitting property and whose first face is provided with a light-absorbing layer, a mixture including the organic compound and an inorganic material is irradiated with light having a wavelength, which is absorbed by the inorganic material to heat the mixture, and thereby a film of the organic compound included in the mixture is formed on the light-absorbing layer and the first face of the first substrate. Then, the first face of the first substrate and a deposition surface of the second substrate are arranged so as to be adjacent to or in contact with each other, irradiation with light having a wavelength, which is absorbed by the light-absorbing layer is conducted from a rear face side (a second face side) of the first substrate, to heat the organic compound in contact with the light-absorbing layer, and thereby at least part of the organic compound is formed as a film on the deposition surface of the second substrate.

One embodiment of the present invention is a method for fabricating a light emitting device in which an organic compound provided for a first substrate is irradiated with light so as to form a film of the organic compound on a second substrate provided with an electrode. By using the first substrate which has a light-transmitting property and whose first face is provided with a light-absorbing layer, a mixture including an organic compound and an inorganic material is irradiated with light having a wavelength, which is absorbed by the inorganic material to heat the mixture, and thereby a film of the organic compound included in the mixture is formed on the light-absorbing layer and the first face of the first substrate, the first face of the first substrate and the first face of the second substrate are arranged so as to be adjacent to or in contact with each other, irradiation with light having a wavelength, which is absorbed by the light-absorbing layer is conducted from a rear face side (a second face side) of the first substrate, to heat the organic compound in contact with the light-absorbing layer, and thereby at least part of the organic compound is formed as a film on the first electrode on the second substrate, and a second electrode is formed on the organic compound formed as the film on the first face of the second substrate.

In any of the above-described structures, a reflective layer having an opening portion may be formed between the first substrate and the light-absorbing layer. By provision of the reflective layer, light delivered to the first substrate is blocked and only light delivered to the opening portion can be used for film formation. In addition, by the reflective layer, light can be prevented from being delivered to the deposition substrate through the material layer. The reflective layer preferably has a reflectance of 85% or higher of light delivered to the first substrate. As examples of the reflective layer, aluminum, silver, gold, platinum, copper, an alloy containing aluminum, an alloy containing silver, and the like can be given.

In any of the above-described structures, a relieving layer for easing heat conduction may be provided between the reflective layer and the light-absorbing layer. The use of the relieving layer can prevent the outline of a film-formation pattern from becoming vague. Preferably, the relieving layer has a transmittance of 60% or higher of light delivered to the first substrate, and a material used for the relieving layer has lower thermal conductivity than materials used for the reflective layer and the light-absorbing layer. In addition, as examples of the relieving layer, titanium oxide, silicon oxide, silicon nitride oxide, zirconium oxide, silicon carbide, and the like are given. Further, the thickness of the relieving layer is from 10 nm to 2 µm.

In any of the above-described structures, the light-absorbing layer preferably has a reflectance of 70% or lower of the light delivered to the first substrate. In addition, the thickness of the light-absorbing layer is preferably from 10 nm to 600 nm. Further, as examples of materials for the light-absorbing layer, metal nitride, metal, carbon, and the like are given.

In any of the above-described structures, preferably, the light delivered to the first substrate is laser light or lamp light.

In any of the above-described structures, preferably, the organic compound is a light-emitting material.

In any of the above-described structures, the inorganic material is preferably metal nitride, metal, carbon or the like. In particular, a carbon material such as graphite or a carbon nanotube which is easy to be uniformly mixed with an organic compound is preferable.

Note that the "light emitting devices" in this specification refer to image display devices, light emitting devices, and light sources (including lighting devices, illumination device and the like). In addition, light emitting devices include all of the following modules: modules provided with a connector, for example, a flexible printed circuit (FPC), a tape automated bonding (TAB) tape, or a tape carrier package (TCP); modules provided with a printed wiring board at the end of a TAB tape or a TCP; and modules where an integrated circuit (IC) is directly mounted by a chip-on-glass (COG) method.

According to one embodiment of the present invention, a light emitting device having an EL layer whose structure is not limited can be fabricated. In addition, use efficiency of a material can be enhanced in fabrication of a light emitting device. In addition, a fabrication cost of a light emitting device can be reduced.

BRIEF DESCRIPTION OF THE DRAWINGS

In the accompanying drawings:

FIGS. 9A and 9B illustrate a method for fabricating a light emitting device according to one embodiment of the present invention;

DETAILED DESCRIPTION OF THE INVENTION

Figure 1:
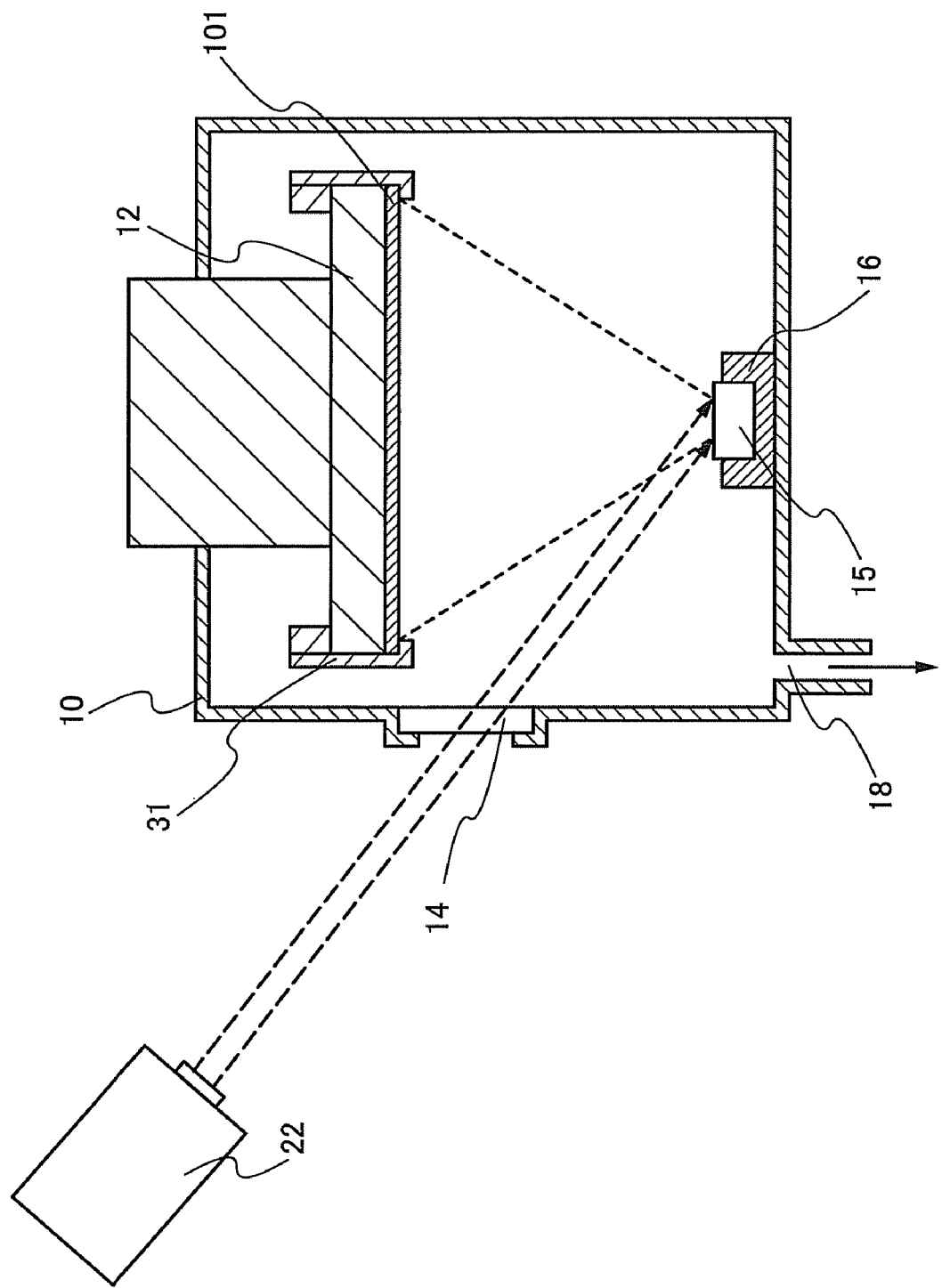
FIG. 1 illustrates a film-formation apparatus according to one embodiment of the present invention.

Embodiments of the present invention will be described in detail with reference to the drawings. However, the present invention is not limited to the following description and the mode and detail of the present invention can be changed in various ways without departing from the spirit and scope thereof. Therefore, the present invention is not interpreted as being limited to the following description of the embodiments. Note that, in the embodiments of the present invention described below, the same reference numeral may be commonly used to denote the same component in different diagrams.

Embodiment 1

In Embodiment 1, a method for fabricating a light emitting device according to one embodiment of the present invention will now be described. In the method for fabricating a light emitting device according to one embodiment of the present invention, a film-formation substrate is formed first. Then, a light emitting device is fabricated using the film-formation substrate. In Embodiment 1, a method for forming the film-formation substrate is described. Note that in this specification, a substrate which is used to form a film on a deposition substrate (that is, a substrate to be provided with the film) is referred to as a "film-formation substrate". The film-formation substrate according to one embodiment of the present invention is provided with a layer including a desired material to be deposited on a deposition substrate and a layer for heating a layer including the material.

First, a first substrate 101 is prepared. The first substrate preferably has high light transmittance of irradiation light. Also, the first substrate is preferably formed from a material having low thermal conductivity. As the first substrate, for example, a glass substrate, a quartz substrate, or the like can be used. Impurity (such as moisture) is less likely to be adsorbed on or attached to a glass substrate, a quartz substrate, or the like than a film substrate or the like. Thus, impurities can be prevented from being mixed in during film formation.

Then, a light-absorbing layer is formed over the first substrate. The light-absorbing layer is patterned so as to correspond to a region to be desirably provided with a film of the deposition substrate. Alternatively, a reflective layer is formed and patterned between the first substrate and the light-absorbing layer so as to correspond to a region to be desirably provided with a film of the deposition substrate.

Over the first substrate provided with at least the light-absorbing layer, a material layer including a desired material is formed on the deposition substrate using a mixture including an organic compound and an inorganic material.

Figure 6A:
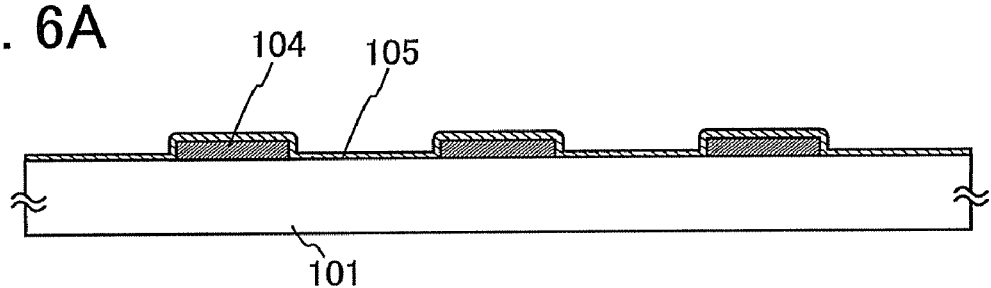
FIGS. 6A to 6C each illustrate a film-formation substrate according to one embodiment of the present invention.
Figure 6B:
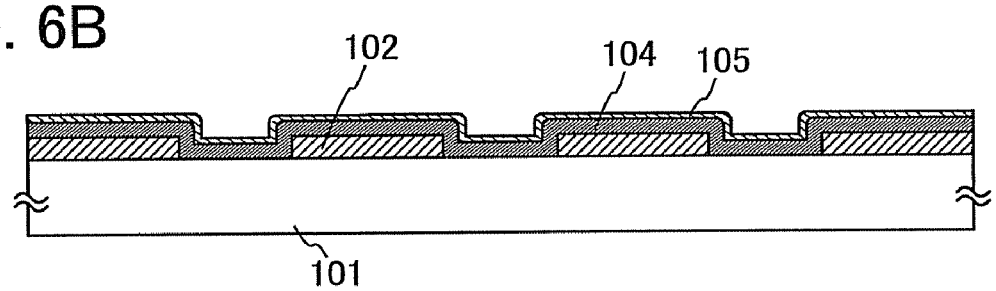
Figure 6C:
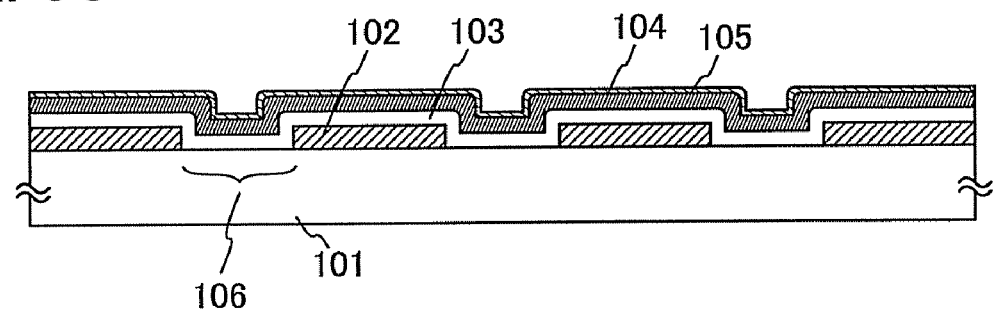

FIGS. 6A to 6C each exemplify a film-formation substrate according to one embodiment of the present invention. FIG. 6A illustrates a film-formation substrate in which a light-absorbing layer 104 is patterned and a material layer 105 is formed over the light-absorbing layer 104. FIG. 6B illustrates a film-formation substrate in which a reflective layer 102 is provided between the light-absorbing layer 104 and the first substrate 101, and the material layer 105 is formed over the light-absorbing layer 104. The film-formation substrate may include at least the light-absorbing layer and the material layer, or may include a layer having another function as well as the light-absorbing layer and the material layer. For example, as illustrated in FIG. 6C, a relieving layer 103 may be provided between the reflective layer 102 and the light-absorbing layer 104.

The inorganic material included in the mixture is preferably fine particles. In addition, the inorganic material is preferably uniformly included in the mixture. By irradiating such a mixture with light, the inorganic material absorbs light and generates heat. The heat is conducted to the organic compound existing around the inorganic material, and the organic compound is heated, evaporated and deposited on the first substrate 101.

The mixture includes the organic compound and the inorganic material. The inorganic material absorbs irradiation light and converts it to heat, and thus is preferably a material having high absorptance of irradiation light. For example, metal nitrides, metal, carbon, and the like are preferable. In particular, a carbon material such as graphite or a carbon nanotube which is easy to be uniformly mixed with an organic compound is preferable.

In addition, preferably, in order to uniformly conduct heat to the organic compound, the inorganic material is uniformly dispersed in the mixture. Further, for high efficiency of heat conduction, the inorganic material is preferably fine particles. For example, particles having a size of approximately from 1 nm to 100 nm, called nanoparticles, are preferably used.

As the organic compound included in the mixture, various types of materials can be used. A low molecular compound is preferably used, for example, a light emitting material, a carrier transporting material or the like which is used for a light emitting element can be used. In addition, preferably, the organic compound does not absorb irradiation light so that the inorganic material included in the mixture can efficiently generate heat.

The mixture can be obtained by mixing an organic compound and an inorganic material. For example, an organic compound and an inorganic material may be compressed and packed to form a pellet. Alternatively, an organic compound and an inorganic material may be mixed and heated so that the organic compound is dissolved, thereby forming a state in which the inorganic material is dispersed in the organic compound in a glassy state. By employing the organic compound in a glassy state like this, scattered light due to the organic compound can be reduced and thus the inorganic material can efficiently absorb light delivered to the mixture (i.e., light with which the mixture is irradiated).

The light delivered to the mixture is preferably light with a wavelength, which is absorbed by the inorganic material included in the mixture. In addition, in order to prevent the organic compound included in the mixture from being decomposed by light, the delivered light (or irradiation light) is preferably visible light or light with a longer wavelength than visible light.

Further, preferably, a light source for the delivered light, various types of light sources such as a laser or a lamp can be used. As the delivered light, in the case of using laser light, irradiation depth can be adjusted at a location of focused light. In addition, in the case of using lamp light, a wider region can be irradiated at a time than in the case of using laser light, so that process time (or takt time) can be shortened.

Note that a thickness of a film to be formed is controlled with conditions such as intensity, irradiation area, and irradiation time of delivered light, and thus a laser or a flash lamp that can conduct a short time of light irradiation is preferably used.

For example, as the laser light, it is possible to use light emitted from one or more of a gas laser such as an Ar laser, a Kr laser, or an excimer laser; or a solid-state laser such as a laser using, as a medium, single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, to which one or more of Nd, Yb, Cr, Ti, Ho, Er, Tm, or Ta is added as a dopant, a glass laser, a ruby laser, an alexandrite laser, a Ti:sapphire laser, or a fiber laser. Alternatively, a second harmonic, a third harmonic, or higher harmonics oscillated from the above-described solid-state laser can be used. Note that, when a solid-state laser whose laser medium is solid is used, there are advantages in that a maintenance-free condition can be maintained for a long time and output is relatively stable. The laser light may be either continuous-wave (CW) laser light or pulsed laser light.

Examples of light sources of light other than laser light are as follows: discharge lamps such as a flash lamp (e.g., a xenon flash lamp and a krypton flash lamp), a xenon lamp, and a metal halide lamp; and heat-generating lamps such as a halogen lamp and a tungsten lamp. In particular, because a flash lamp is capable of repeatedly irradiating a large area with very high-intensity light in a short time (0.1 msec to 10 msec), a process time can be shortened in the case of using a mixture with a large area. In addition, the running cost can be suppressed because the flash lamp has a long life and low power consumption at the time of waiting for light emission of the flash lamp.

Preferably, film formation is performed in a reduced-pressure atmosphere. The reduced-pressure atmosphere can be obtained by evacuation of the film-formation chamber with a vacuum exhaust unit to a vacuum of about $5 \times 10^{-3}$ Pa or less, preferably, about $10^{-4}$ Pa to $10^{-6}$ Pa.

Figure 2:
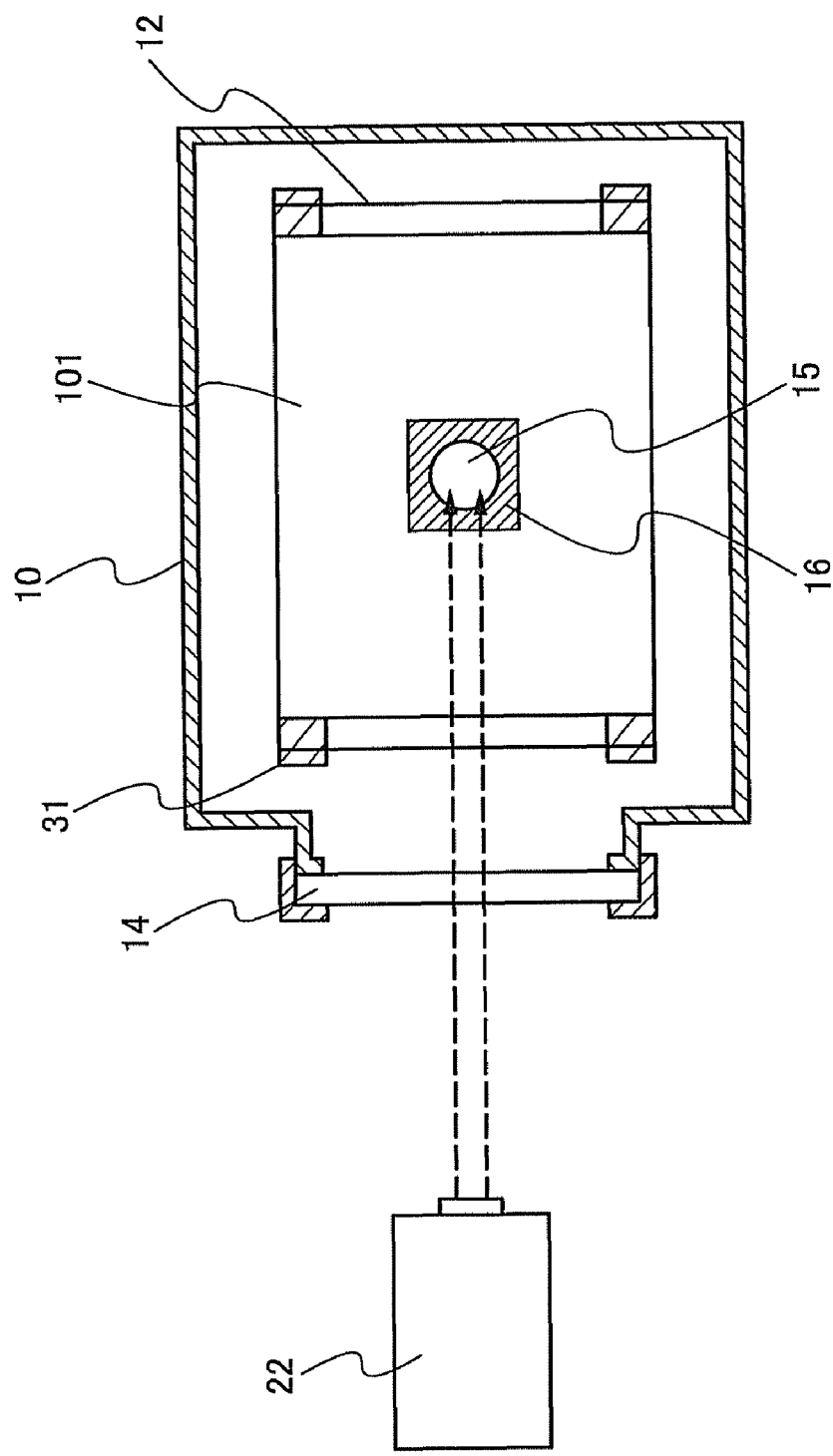
FIG. 2 illustrates the film-formation apparatus according to one embodiment of the present invention.

One example of a film-formation apparatus which is used to form a film-formation substrate according to one embodiment of the present invention is illustrated in FIG. 1 and FIG. 2. FIG. 1 is a side view illustrating a structure of the film-formation apparatus, while FIG. 2 illustrates a plan view thereof. The film-formation apparatus illustrated in FIG. 1 is provided with a film-formation chamber 10 connected to a vacuum exhaust system. The film-formation chamber 10 is provided with a substrate stage 12, an evaporation source 16 in which a mixture 15 is put, and an exhaust port 18 connected to the vacuum exhaust system.

A substrate stage 12 to which the first substrate 101 is fixed may be provided with a holding unit to fix it. The holding unit includes a substrate chuck 31 which fixes the first substrate 101, or the like. In other words, the holding unit is structured to hold the first substrate 101 such that the surface or at least a part thereof is exposed to the evaporation source. The substrate chuck 31 mechanically holds the first substrate 101 by the edge portions, using lugs at their ends. As another structure of the holding unit, a structure in which the first substrate 101 is electromagnetically held can be employed.

By the holding unit of the substrate stage 12, the first substrate 101 on which a film is to be deposited is arranged opposite to and in parallel with the evaporation source 16. In addition, in a case where the evaporation source 16 is a point source, a mechanism for rotating the first substrate 101 may be provided in order to form the material layer 105 with uniformity.

The film-formation chamber 10 is provided with a light-introducing window 14 such that the mixture 15 put in the evaporation source 16 is irradiated with light emitted from a light source 22. The light source 22 may emit light with a wavelength, which is absorbed by the inorganic material included in the mixture, and various types of light sources such as a laser light source and a lamp light source can be used. In FIG. 1, a laser light source is used as the light source 22. In the case of using the laser light source, irradiation depth can be adjusted at a location of focused light.

By irradiating the mixture 15 with light emitted from the light source 22, the inorganic material included in the mixture 15 absorbs light to generate heat, the organic compound existing around the inorganic material is heated, and the heated organic compound is evaporated to be deposited on the surface of the first substrate 101. Because the mixture is heated by light irradiation in a shorter time in this manner, so that heat conduction from the mixture to the first substrate 101 can be suppressed. Therefore, the distance between the evaporation source and the first substrate can be shortened, so that use efficiency of material can be improved.

In addition, it is unnecessary to conduct auxiliary heating for stabilizing an evaporation rate as in a conventional evaporation method using resistance heating, and the amount of an organic compound to be deposited can be controlled with conditions such as intensity, irradiation area, and irradiation time of delivered light. Therefore, a time for film formation can be shortened. Moreover, it is unnecessary to use a deposition material until the evaporation rate becomes stable, and thus the use efficiency of material can be more improved.

In addition, in FIG. 1, it is also possible that plural equivalents of the light introducing window 14 are provided for the film-formation chamber 10 so that film formation can be performed with a plurality of laser beams introduced thereinto.

The evaporation source 16 holds the mixture. The evaporation source 16 is preferably formed with a material having high heat resistance, for example, it is formed from metal such as Ti or ceramics.

In addition, the evaporation source 16 is not limited to the structure illustrated in FIG. 1, and a plurality of evaporation sources 16 may be provided. Alternatively, the evaporation source 16 may include a plurality of cells in which mixtures are put. Thus, co-evaporation can be conducted using a plurality of mixtures.

In addition, in order to form the material layer 105 on the first substrate 101 with high productivity, the first substrate 101 or the evaporation source 16, or both the first substrate 101 and the evaporation source 16 may be movably provided, and the film formation may be carried out, for example, in a raster scanning fashion. With such a structure, film formation can be easily carried out to glass substrates having the outer size of 1500 mm×1800 mm (the sixth generation), the outer size of 1870 mm×2200 mm (the seventh generation), and the outer size of 2160 mm×2400 mm (the eighth generation), which are mother glasses of a flat panel display.

In addition, in the film-formation apparatus illustrated in FIG. 1, for example, the evaporation source 16 can have a rectangular parallelepiped which extends long in one direction (for example, a shape which extends in a direction vertical to a plane of the paper of FIG. 1). While the mixture 15 put in the evaporation source 16 which extends long in one direction is being irradiated with light, the evaporation source 16 is moved relatively to the substrate, so that film formation can be conducted, scanning the substrate therewith. Thus, film formation to a large substrate as described above can be conducted with high throughput.

In the film-formation apparatus illustrated in FIG. 1, the light-introducing window 14 to take in a laser beam is provided on a side face of the film-formation chamber 10. The location of provision of the light-introducing window is not limited to the side face, and the light-introducing window may be provided at any position as long as the mixture put in the evaporation source is irradiated with a laser beam. For example, it is also possible that a laser beam enters the substrate from the rear face of the substrate (a face opposite to a face to be provided with the material layer), goes through the substrate, and is delivered to the mixture put in the evaporation source. A film-formation apparatus for a film-formation method like this is described with reference to FIG. 3 and FIG. 4.

Figure 3:
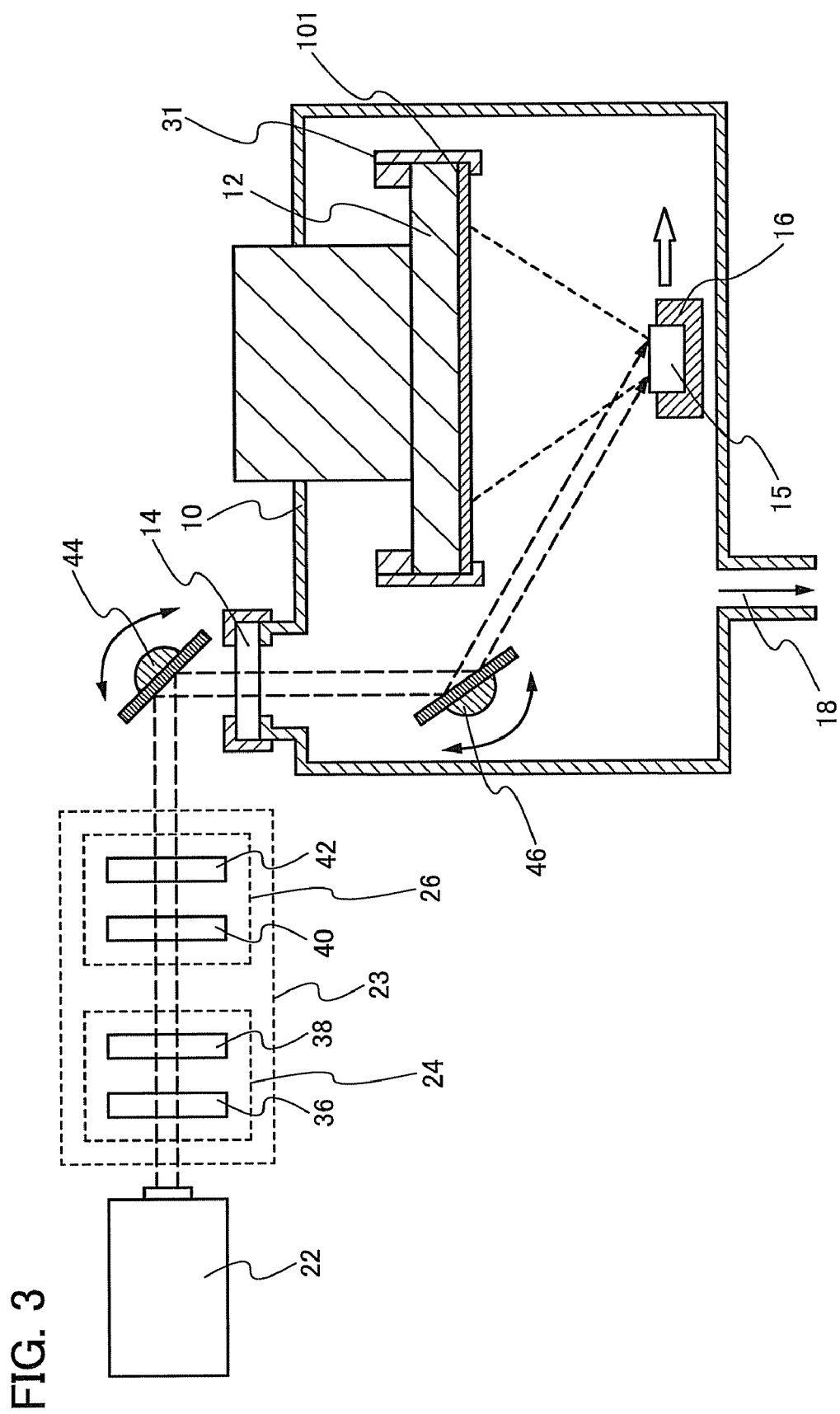
FIG. 3 illustrates a film-formation apparatus according to one embodiment of the present invention.
Figure 4:
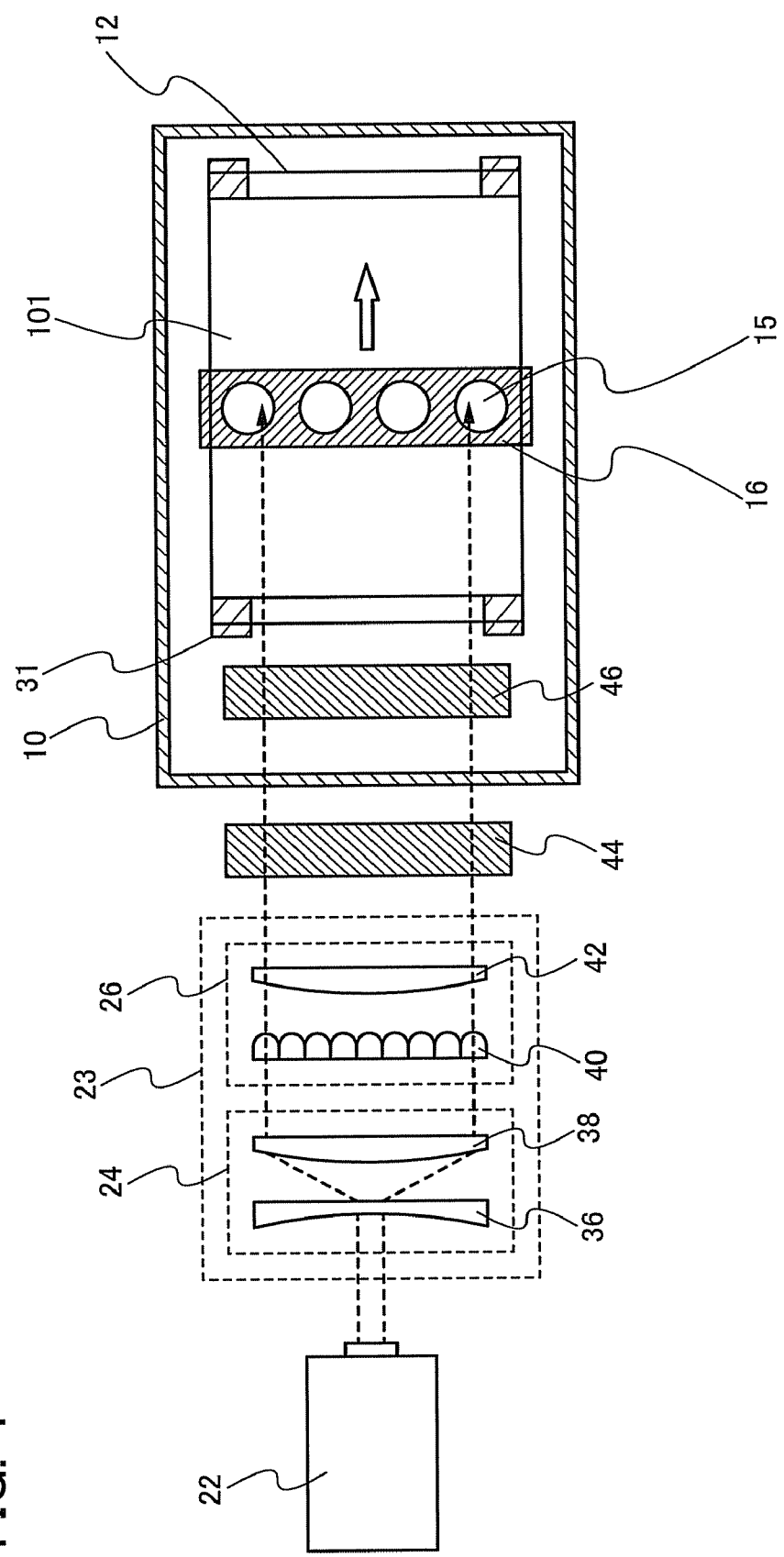
FIG. 4 illustrates the film-formation apparatus according to one embodiment of the present invention.

FIG. 3 is a side view of a film-formation apparatus, while FIG. 4 is a plan view thereof. In addition, the common reference numerals are used for the same elements as those of the film-formation apparatus in FIG. 1, and the description thereof is omitted in some cases.

Light emitted from the light source 22 can be delivered to the mixture through an optical system. A function of the optical system is preferably to uniform energy distribution of the light on an irradiation surface. Further, the optical system can be used to obtain a desired shape of light on the irradiation surface. For example, an optical system 23 can be used as illustrated in FIG. 3 and FIG. 4.

As illustrated in FIG. 3 and FIG. 4, the film-formation chamber 10 is provided with the exhaust port 18 which is connected to a vacuum exhaust system. The light-introducing window 14 to introduce laser light emitted from the light source 22 into the film-formation chamber 10 is provided for the top face of the film-formation chamber 10.

The first substrate 101 is held horizontally by the holding unit, and is arranged opposite to and in parallel with the evaporation source 16.

In the film-formation chamber 10, the evaporation source 16 which is a rectangular parallelepiped extending long in one direction (a direction vertical to a plane of the paper of FIG. 3) is provided. As illustrated in FIG. 4, a plurality of cells in which the mixtures 15 are put are arranged linearly in the evaporation source 16 so as to form a linear evaporation source. In addition, a moving mechanism for moving the evaporation source 16 is provided for the film-formation chamber 10. By the moving mechanism, while the evaporation source 16 is being moved, the mixture 15 is irradiated with light, so that a film can be formed on the surface of the first substrate 101 while the plurality of mixtures 15 are heated.

As illustrated in FIG. 4, when the length in the longitudinal direction of the evaporation source 16 is larger than one side of the first substrate 101, the evaporation source 16 may be moved at least in the direction (illustrated by the arrow in FIG. 4) perpendicular to the longitudinal direction. On the other hand, when the length in the longitudinal direction of the evaporation source 16 is smaller than one side of the first substrate 101, the evaporation source 16 may be moved in two directions, that is, both in the direction perpendicular to the longitudinal direction and the direction in parallel therewith. An optical path is partially illustrated by the dotted line and the arrow, but the optical path is not limited thereto, and laser irradiation to the evaporation source 16 may be conducted such that a film is uniformly deposited on a film-formation surface of the first substrate 101.

The laser beam to heat the mixture 15 put in the moving evaporation source 16 is shaped into a linear beam by the optical system 23 provided outside the film-formation chamber 10.

As a structure of the optical system 23, for example, a structure in which a beam expander 24 and a beam homogenizer 26 are combined in order from the light source 22 side can be employed. The beam expander 24 includes a combination of a concave cylindrical lens 36 (or a concave lens) and a convex cylindrical lens 38 (or a convex lens), and thereby the beam width of the laser beam emitted from the light source 22 can be increased. When a linear laser beam is used, a substrate having a large area can be treated by moving the laser beam or moving the substrate for scanning. In addition, the beam homogenizer 26 is provided for homogenizing an energy density distribution of a laser beam, for example, which is emitted by TEMOO mode and which has a Gaussian energy distribution. Therefore, as the beam homogenizer 26, a combination of a cylindrical lens array 40 and a convex cylindrical lens array 42 can be employed. By using the combination, the energy density distribution of the laser beam delivered to the mixture 15 can be homogenized.

As an example of a structure of the optical system for scanning with a linear beam, movable mirrors 44 and 46 that change the optical axis are provided. The angles of the movable mirrors 44 and 46 are controlled in association with the movement of the evaporation source 16, and the mixture 15 put in the evaporation source 16 is irradiated with the linear beam.

The evaporation source 16 may be relatively moved with respect to the first substrate 101, and a mechanism for moving the first substrate 101 instead, with the evaporation source 16 fixed can be provided. When the evaporation source 16 is fixed, an optical system for scanning with a linear beam may be provided, or such an optical system for scanning with a linear beam may be omitted and an incident position to the film-formation chamber 10 of the linear beam may be fixed. Alternatively, moving mechanisms for the evaporation source 16 and the first substrate 101 can be provided so that both can be moved.

Figure 5:
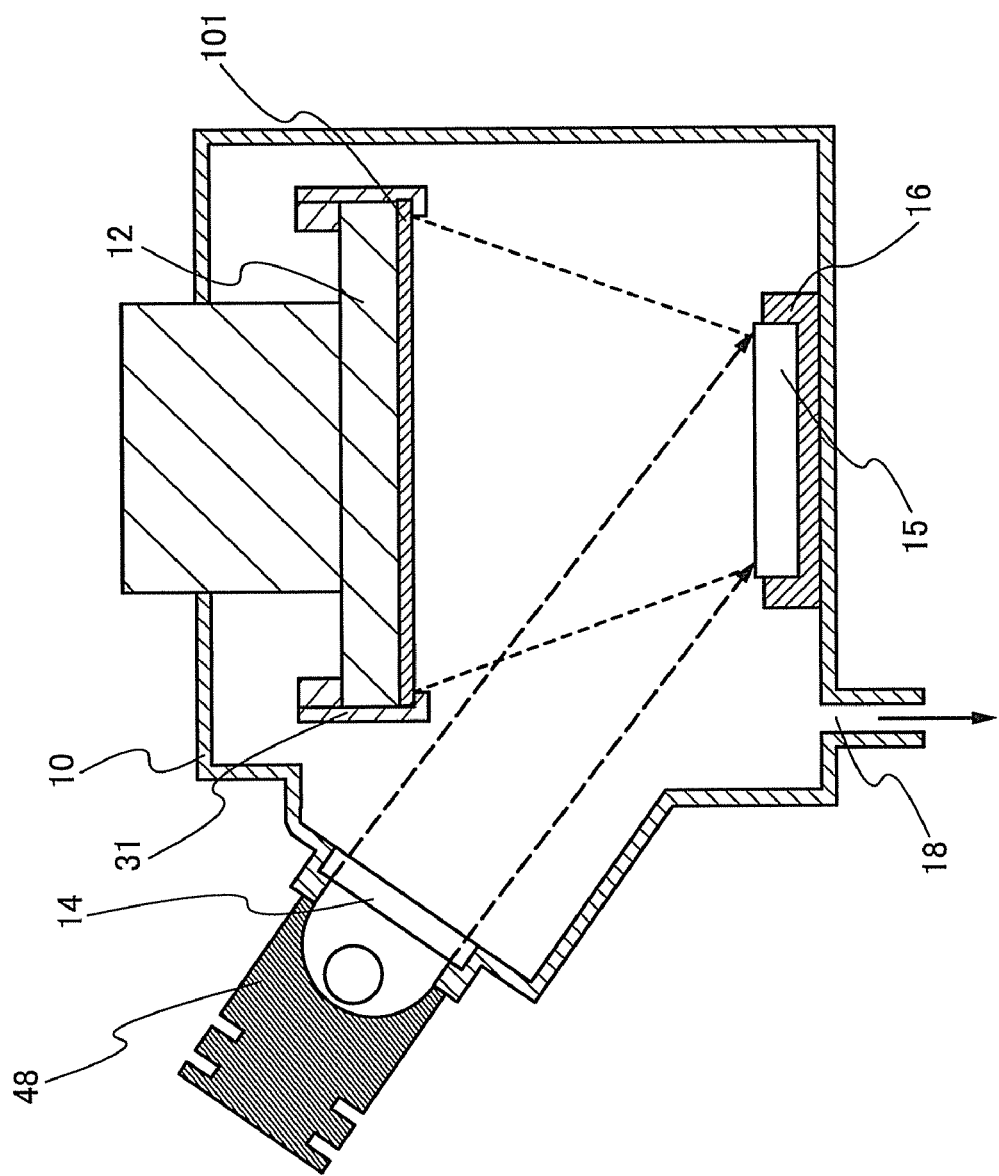
FIG. 5 illustrates a film-formation apparatus according to one embodiment of the present invention.

As the light source, a lamp light source may be used. FIG. 5 illustrates one embodiment of a film-formation apparatus using a lamp light source as the light source. FIG. 5 is a side view illustrating a structure of the film-formation apparatus.

In FIG. 5, light emitted from the lamp light source 48 is delivered to the mixture 15 through the light-introducing window 14. When the lamp light source is used as the light source, light irradiation can be conducted to a wider region at a time than a case where a laser light source is used, and a process time can be shortened, whereby productivity can be increased.

Embodiment 2

In Embodiment 2, a method for fabricating a light emitting device by using the film-formation substrate formed in Embodiment 1 is described.

A first face of the film-formation substrate formed in Embodiment 1 and a first face of the deposition substrate are arranged to face each other, wherein the first face of the film-formation substrate is provided with the material layer and the first face of the deposition substrate is desired to be a face on which a film is formed. Irradiation of light is conducted from a second face side opposite to the first face of the film-formation substrate. Irradiation light is absorbed by the light-absorbing layer, and heat is conducted to the material layer. At least part of an organic compound included in the material layer is heated and evaporated so that the organic compound is formed as a film on the first face of the deposition substrate.

The irradiation light from the second face side of the film-formation substrate, which is a first substrate, is absorbed by the light-absorbing layer formed on the first face, passing through the inside of the first substrate. Accordingly, the first substrate is preferably a substrate having high light transmittance of the irradiation light. Further, the first substrate is preferably formed using a material having low thermal conductivity. When the thermal conductivity of the first substrate is low, heat expansion from the light-absorbing layer through the first substrate can be suppressed, and thus generated heat can be efficiently used for film formation. As the first substrate, for example, a glass substrate, a quartz substrate, or the like can be used as described in Embodiment 1.

The light-absorbing layer 104 absorbs irradiation light which is used for film formation. Therefore, the light-absorbing layer is preferably formed using a material which has low reflectance and high absorptance of the irradiation light. Specifically, the light-absorbing layer 104 preferably has a reflectance of 70% or lower of the irradiation light.

Various kinds of materials can be used for the light-absorbing layer. For example, metal nitride such as titanium nitride, tantalum nitride, molybdenum nitride, or tungsten nitride; metal such as titanium, molybdenum, or tungsten; carbon; or the like can be used. Since a kind of material that is suitable for the light-absorbing layer varies depending on the wavelength of the irradiation light, the material should be selected as appropriate. Note that the light-absorbing layer is not limited to a single layer and may include a plurality of layers. For example, a stack structure of a metal and a metal nitride may be employed.

The light-absorbing layer can be formed by any of a variety of methods. For example, the light-absorbing layer can be formed by a sputtering method, an electron beam evaporation method, a vacuum evaporation method, or the like.

The thickness of the light-absorbing layer 104 varies depending on a material used, but such a thickness that cannot transmit the irradiation light is employed and thereby irradiation light can be converted to heat without being wasted. Specifically, the thickness is preferably from 10 nm to 2 vim. In addition, when the thickness of the light-absorbing layer is smaller, the smaller energy of light can entirely heat the light-absorbing layer. Therefore, the thickness is preferably from 10 nm to 600 nm. More preferably, the thickness of the light-absorbing layer is from 50 nm to 200 nm, and thereby the irradiation light can be efficiently absorbed so that heat is generated.

The light-absorbing layer may transmit part of irradiation light as long as it can be heated up to a film-formation temperature of a material included in the material layer (to a temperature at which at least part of the material included in the material layer is formed as a film on the deposition substrate). Note that when the light-absorbing layer transmits part of the irradiation light, a material that is not decomposed by light should be used as the material included in the material layer.

The material layer is a layer including a material to be formed as a film on the deposition substrate. A wide variety of organic compounds can be used for the material layer. As described in this embodiment, a material that can be deposited is used for an EL layer of a light emitting element. Note that in this specification, the "EL layer" refers to a layer provided between a pair of electrodes in a light emitting element.

For example, a carrier transporting material, a light emitting material, and/or the like for forming an EL layer can be used. A light emitting material is used for the material layer and the method for fabricating a light emitting device according to one embodiment of the present invention is applied, whereby light emitting layers for respective colors can be formed separately with ease. Thus, a full-color light emitting device can be easily fabricated. In addition, in general, as a substrate becomes larger, it is more difficult to separately form light emitting layers for respective colors; however, by employing the method for fabricating a light emitting device according to one embodiment of the present invention, light emitting layers for respective colors can be easily formed over even a large-area substrate.

The material layer may contain plural kinds of materials. The material layer may be a single layer or a stacked layer including plural layers. Accordingly, by stacking a plurality of layers each containing a different material, co-evaporation is possible. Note that in the case where the material layer has a stacked structure, it is preferable that the layers in the material layer are stacked so that a material which can be deposited at a low temperature is included on the first substrate side. With such a structure, deposition using the material layer having a stacked structure can be efficiently conducted.

The material layer can be formed by the film-formation method described in Embodiment 1. The film-formation method described in Embodiment 1 provides high use efficiency of a material, and contributes to a reduction in fabrication cost of a light emitting device.

In addition, the film-formation substrate used in the method for fabricating the light emitting device according to one embodiment of the present invention may include at least the light-absorbing layer 104 and the material layer 105 over the first substrate 101, and can be a film-formation substrate having any of various structures.

For example, as illustrated in FIG. 6B, the reflective layer 102 may be provided between the first substrate 101 and the light-absorbing layer 104. The reflective layer 102 is a layer for blocking irradiation light to be delivered the other part than part of the light-absorbing layer 104, so that the part of the light-absorbing layer 104 is selectively irradiated with light during film formation. Therefore, the reflective layer 102 is preferably formed using a material having high reflectance of the irradiation light. Specifically, the reflective layer 102 preferably has a reflectance of 85% or higher, more preferably, a reflectance of 90% or higher of the irradiation light. With the reflectance of 85% or higher, preferably 90% or higher, it can be prevented that the irradiation light is absorbed by the reflective layer and the absorbed light is converted to heat. By provision of the reflective layer, light delivered to the first substrate can be prevented from being delivered to the deposition substrate through the material layer 105.

As a material for the reflective layer 102, for example, silver, gold, platinum, copper, an alloy containing aluminum, an alloy containing silver, or the like can be used. Since a kind of material which is suitable for the reflective layer 102 varies depending on the wavelength of the irradiation light, the material of the reflective layer 102 should be selected as appropriate.

Note that the reflective layer 102 can be formed by any of a variety of methods. For example, the reflective layer 102 can be formed by a sputtering method, an electron beam evaporation method, a vacuum evaporation method, or the like. Preferably, the thickness of the reflective layer 102 is 100 nm or more although it depends on a material. With a thickness of 100 nm or more, transmission of the irradiation light through the reflective layer can be suppressed.

The opening portion 106 can be formed in the reflective layer 102 by any of a variety of methods but is preferably formed by dry etching. By dry etching, the opening portion 106 has steeper side faces and a fine pattern can be formed.

Note that the greater the difference in reflectance between the reflective layer 102 and the light-absorbing layer 104 is, the more preferable it is. Specifically, the difference in reflectance to the wavelength of the irradiation light is preferably 25% or higher, more preferably, 30% or higher.

In addition, as illustrated in FIG. 6C, the relieving layer 103 may be provided between the reflective layer 102 and the light-absorbing layer 104 in order to suppress heat expansion from the light-absorbing layer 104. By provision of the relieving layer 103, in a case where part of light absorbed by the reflective layer 102 remains as heat, the heat can be prevented from being conducted to the light-absorbing layer 104 and the material layer 105. Thus, the use of the relieving layer 103 can prevent the outline of a film-formation pattern from becoming vague.

Specifically, the relieving layer 103 should be formed using a material which has lower thermal conductivity than materials forming the reflective layer 102 and the light-absorbing layer 104. In addition, as illustrated in FIG. 6C, in the case where light passes through the opening portion 106 of the reflective layer 102, and then the relieving layer 103 such that the light-absorbing layer is irradiated with the light, the relieving layer 103 should have a light-transmitting property. In this case, the relieving layer 103 should be formed using a material which has high light transmittance as well as low thermal conductivity. Specifically, the relieving layer 103 is preferably formed using a material which has a transmittance of 60% or more of light.

A material for the relieving layer 103 can be, for example, titanium oxide, silicon oxide, silicon nitride oxide, zirconium oxide, or silicon carbide. Note that the relieving layer 103 can be formed by any of a variety of methods. For example, the relieving layer 103 can be formed by a sputtering method, an electron beam evaporation method, a vacuum evaporation method, a CVD method, or the like. Preferably, the thickness of the relieving layer 103 is from 10 nm to 2 μm although it depends on a material. The thickness of the relieving layer 103 is more preferably from 100 nm to 600 nm. With a thickness of from 10 nm to 2 μm, the relieving layer 103 can transmit the irradiation light which is transmitted through the opening portion 106 of the reflective layer 102 as well as block conduction of heat in the reflective layer 102 to the light-absorbing layer 104 and the material layer 105.

The film formation substrate like this is irradiated with light so that the material included in the material layer is heated, and at least part of the material included in the material layer is formed as a film on the deposition substrate. When the material layer is heated, at least part of the material included in the material layer is evaporated and deposited on the deposition substrate. Alternatively, thermal deformation occurs in at least part of the material layer. As a result, stress varies, and thus a film is peeled and formed on the deposition substrate.

Figure 8A:
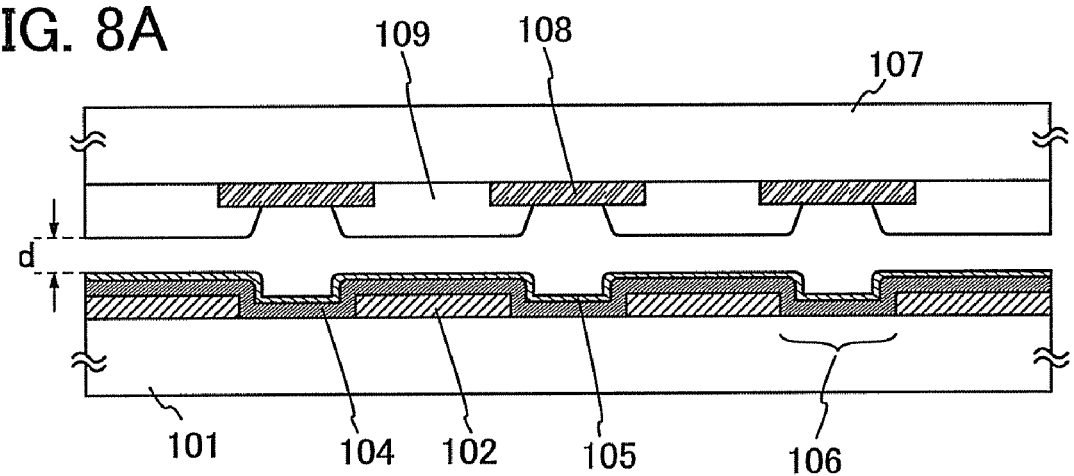
FIGS. 8A and 8B illustrate a method for fabricating a light emitting device according to one embodiment of the present invention.
Figure 8B:
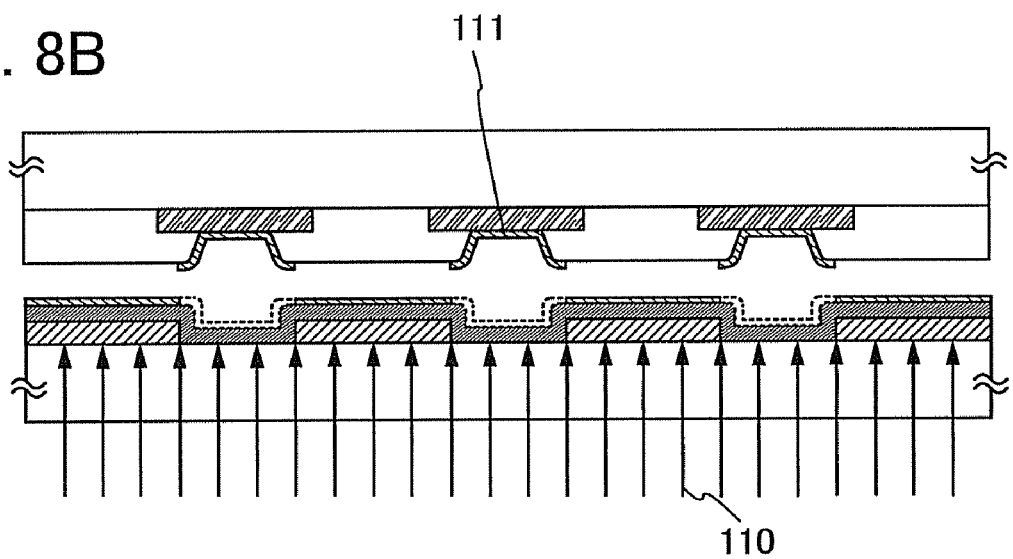

Specifically, a method for fabricating a light emitting device according to one embodiment of the present invention is described with reference to FIGS. 8A and 8B. In FIGS. 8A and 8B, the film-formation substrate illustrated in FIG. 6B is used as the film formation substrate.

Next, as illustrated in FIG. 8A, a second substrate 107 which is a deposition substrate is disposed at a position facing a surface which is one of surfaces of the first substrate 101 over which the light-absorbing layer 104 and the material layer 105 are formed. The second substrate 107 is the deposition substrate on which a desired layer is formed by a film-formation process. In addition, the case is described where an EL layer of a light-emitting element is formed using the film-formation substrate, and thus the first electrode 108 serving as one electrode of the light emitting element and the insulator 109 are formed on the second substrate 107. Then, the first substrate 101 and the second substrate 107 are disposed so as to face each other in proximity; specifically, they are disposed close to each other so that the distance d between the surface of the material layer 105 of the first substrate 101 and the second substrate 107 is from 0 mm to 2 mm, preferably from 0 mm to 0.05 mm, or more preferably from 0 mm to 0.03 mm.

Note that the distance d is defined as the distance between the surface of the material layer 105 of the first substrate 101 and the surface of the second substrate 107. In the case where a certain layer (for example, a conductive layer which functions as an electrode or an insulator which functions as a partition) is formed over the second substrate 107, the distance d is defined as the distance between the surface of the material layer 105 of the first substrate 101 and the outermost surface of the layer formed over the second substrate 107. When the surface of the material layer 105 of the first substrate 101 and the outermost surface of the layer over the second substrate 107 has projections and depressions, the distance d is defined as the shortest distance between the surface of the material layer 105 of the first substrate 101 and the outermost surface of the layer formed over the second substrate 107.

Further, FIG. 9A illustrates a case where the distance d between the first substrate 101 and the second substrate 107 is 0 mm. That is, the case is described where the material layer 105 which is formed on the first substrate 101 and the insulator 109 which is the outermost layer of the layers formed over the second substrate 107 are in contact with each other. By reduction in the distance d as described above, at the time of the irradiation with light as illustrated in FIG. 9B, the shape of a film which is formed over the second substrate 107 can be formed with higher accuracy. The distance d is preferably 2 mm or less in terms of use efficiency of a material and thickness control. Note that, in the case where the surface of the second substrate 107 does not have projections and depressions, preferably, the material layer 105 on the first substrate 101 are made not to be in contact with a deposition surface of the second substrate 107 in order to prevent heat of the material layer 105 from being conducted to the deposition surface.

Note that when a film of a material with low thermal stability, such as an organic compound, has been formed on the deposition substrate, preferably, the material layer 105 formed over the first substrate 101 is not in contact with the deposition surface of the second substrate 107 so that heat is not conducted to the film which has been formed.

Next, as illustrated in FIG. 8B, irradiation with light 110 is performed from a rear surface (a surface on which the light-absorbing layer 104 and the material layer 105 are not formed) side of the first substrate 101. The light-absorbing layer 104 formed over the first substrate 101 absorbs the irradiation light and converts it to heat. Then, the heat is given to the material layer 105 in contact with the light-absorbing layer 104, so that at least part of the material contained in the material layer 105 is formed as a film on the first electrode 108 formed on the second substrate 107. Accordingly, an EL layer 111 of the light emitting element is formed on the second substrate 107.

The irradiation light is preferably light with a wavelength that is absorbed by the light-absorbing layer 104. Further, in order to prevent the organic compound included in the material layer from being decomposed by light, the irradiation light is preferably visible light or light with a longer wavelength than visible light.

Further, as a light source for the irradiation light, various types of light sources such as a laser or a lamp can be preferably used. Because laser light is highly directional light, it is hard to be subjected to interference of light. Further, irradiation can be conducted to a wider region at a time by using lamp light than by using laser light, the process time can be shortened.

In addition, a laser that can conduct a short time irradiation or a flash lamp is preferably used to prevent an outline of a film-formation pattern from becoming vague.

For example, as the laser light, it is possible to use light emitted from one or more of a gas laser such as an Ar laser, a Kr laser, or an excimer laser; or a solid-state laser such as a laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, or Ta is added as a dopant, a glass laser, a ruby laser, an alexandrite laser, a Ti:sapphire laser, or a fiber laser. Alternatively, a second harmonic, a third harmonic, or higher harmonics oscillated from the above-described solid-state laser can be used. In addition, when a solid-state laser whose laser medium is solid is used, there are advantages in that a maintenance-free condition can be maintained for a long time and output is relatively stable. The laser light may be pulsed laser light or continuation laser light.

In addition, when laser light is used, the shape of the laser light on an irradiation surface is preferably linear or rectangular. With use of a linear beam or rectangular beam, a substrate to be processed can be efficiently irradiated with laser light. Thus, a time needed for film-formation (process time) can be shortened, and thus productivity can be improved.

As the light source other than the laser light, a discharge lamp such as a flash lamp (e.g., a xenon flash lamp or a krypton flash lamp), a xenon lamp, or a metal halide lamp; or an heat-generating lamp such as a halogen lamp or a tungsten lamp can be used. In particular, with the flash lamp, since a large area can be irradiated with light with extremely high intensity in a short period of time (0.1 to 10 msec) repeatedly, the process time can be shortened in the case where the material layer has a large area. In addition, the running cost can be suppressed because of a long life and low power consumption at the time of waiting for light emission of the flash lamp.

In one embodiment of the present invention, the material layer 105 is heated not with radiation heat of light emitted from a light source but with heat of the light-absorbing layer 104 which absorbs light emitted from a light source. Thus, since the temperature of the deposition substrate is not increased, a substrate having low heat resistance can be used as the deposition substrate.

Preferably, film formation is performed in a reduced-pressure atmosphere. The reduced-pressure atmosphere can be obtained by evacuation of a film-formation chamber with an evacuation unit to a vacuum of about $5 \times 10^{-3}$ Pa or less, preferably, about $10^{-4}$ Pa to $10^{-6}$ Pa.

A method for fabricating a light emitting device according to one embodiment of the present invention may be adopted for at least one layer between a pair of electrodes of a light emitting element, and film-formation methods of the other layers are not particularly limited.

With reference to FIGS. 8A, 8B and FIGS. 9A, 9B, an example of forming a common layer in all pixels is described. By the method illustrated in FIGS. 8A, 8B and FIGS. 9A, 9B, a light emitting device in which all light emitting elements have the same structure can be fabricated. For example, by forming a light emitting layer by the method illustrated in FIGS. 8A and 8B, a light emitting device in which all light emitting elements have the same structure and the light emitting layer is provided between a pair of electrodes can be fabricated. In addition, by conducting the process illustrated in FIGS. 8A and 8B repeatedly to stack a plurality of layers, a light emitting device in which all light emitting elements have the same structure and the plurality of layers are provided between a pair of electrodes can be fabricated. For example, the first film-formation substrate is used, and a part (e.g., a hole injecting layer, a hole transporting layer or the like) of an EL layer is formed on the second substrate 107, which is a deposition substrate. After that, a second film-formation substrate, which is previously prepared, is used, and as illustrated in FIGS. 8A and 8B, a light emitting layer may be formed on the second substrate provided with the part (e.g., a hole injecting layer, a hole transporting layer or the like) of the EL layer.

In one embodiment of the present invention, the case where the second substrate 107 is positioned above the first substrate 101 is described with reference to FIGS. 8A, 8B and FIGS. 9A, 9B, without being limited thereto. The orientation of the substrates can be determined as appropriate.

In this embodiment, the film-formation substrate having the structure illustrated in FIG. 6B has been described; however, similarly, an EL layer can be formed using the film-formation substrate illustrated in FIG. 6A or 6C. In addition, the film-formation substrate which can be applied to one embodiment of the present invention should have at least the light-absorbing layer 104 and the material layer 105 over the first substrate 101, and for example, film-formation substrates having structures illustrated in FIGS. 7A to 7H can be used as well as the film-formation substrates illustrated in FIGS. 6A to 6C.

Figure 7A:
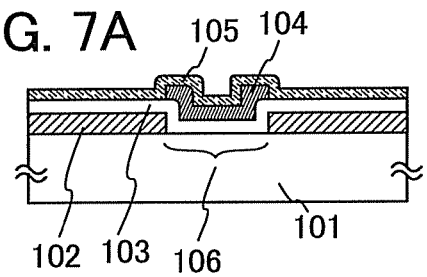
FIGS. 7A to 7H each illustrate a film-formation substrate according to one embodiment of the present invention.

In the structure illustrated in FIG. 7A, the reflective layer 102 having the opening portion 106 is formed over the first substrate 101, and the relieving layer 103 is entirely formed over the reflective layer 102. The patterned light-absorbing layer 104 is formed in a region corresponding to the opening portion 106, and the material layer 105 is entirely formed thereover. With such a structure, heat diffusion in the plane direction of the light-absorbing layer can be suppressed, and thus the outline of the film-formation pattern can be prevented from being vague. In addition, because the light-absorbing layer 104 is formed only in a desired region, heat is difficult to be conducted to the deposition substrate even in the case where the film-formation substrate and the deposition substrate are in contact with each other (the distance d is 0). Thus, by decreasing the distance d, film formation can be conducted with higher accuracy. Accordingly, a finer pattern can be formed, and a high-definition light emitting device can be fabricated.

Figure 7E:
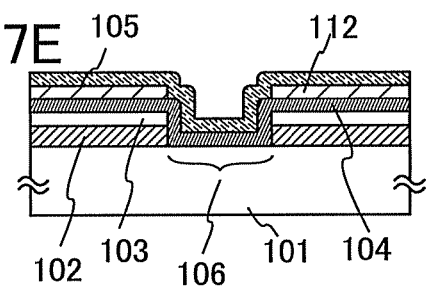
Figure 7B:
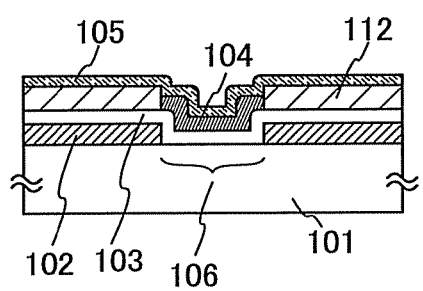

In the structure illustrated in FIG. 7B, the reflective layer 102 having the opening portion 106 is formed over the first substrate 101, and the relieving layer 103 is entirely formed over the reflective layer 102. A second relieving layer 112 is formed in a region that is above the relieving layer 103 and corresponds to the reflective layer 102, and the patterned light-absorbing layer 104 is formed in a region corresponding to the opening portion 106. The material layer 105 is entirely formed thereover. With such a structure, heat diffusion in the plane direction of the light-absorbing layer is suppressed, and thus the outline of a film-formation pattern can be prevented from being vague. In addition, because the light-absorbing layer 104 is formed in a desired region, heat is difficult to be conducted to the deposition substrate even when the film-formation substrate and the deposition substrate are in contact with each other (the distance d is 0). Thus, by decreasing the distance d, film formation can be conducted with higher accuracy. Accordingly, a finer pattern can be formed, and a high-definition light emitting device can be fabricated.

Figure 7F:
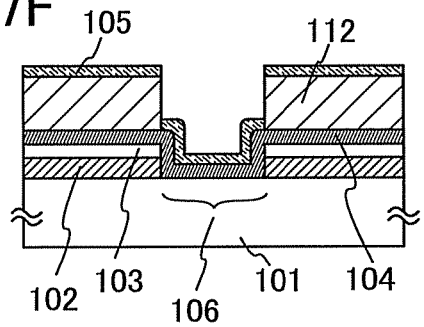
Figure 7C:
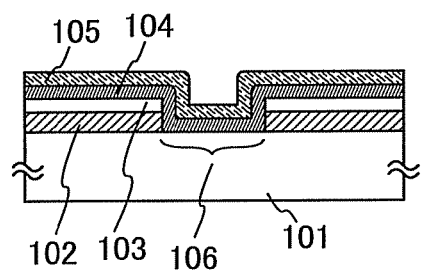

In the structure illustrated in FIG. 7C, the reflective layer 102 having the opening portion 106 is formed over the first substrate 101, and the relieving layer 103 is formed over the reflective layer 102. The relieving layer 103 is formed in a region corresponding to the reflective layer 102. The light-absorbing layer 104 and the material layer 105 are entirely formed thereover. With such a structure, when part of light absorbed by the reflective layer 102 is converted to heat, the heat can be prevented from being conducted to the light-absorbing layer 104 and the material layer 105. Thus, film formation can be conducted in only a desired region with higher accuracy. Accordingly, a finer pattern can be formed, and a high-definition light emitting device can be fabricated.

Figure 7G:
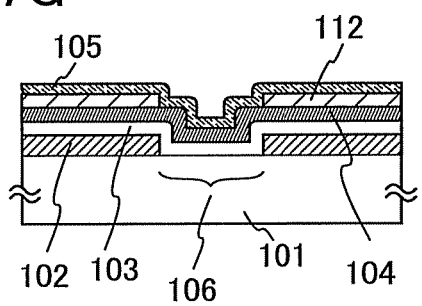
Figure 7D:
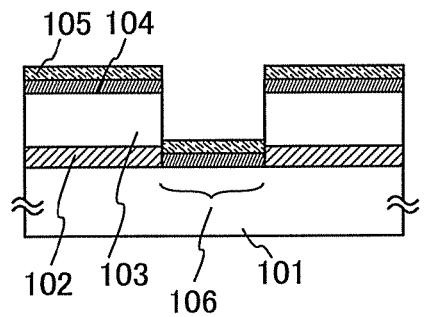

In the structure illustrated in FIG. 7D, the relieving layer 103 in the structure illustrated in FIG. 7C is made thicker (preferably 1 μm to 10 μm thick). By increasing the thickness of the relieving layer 103, the light-absorbing layer 104 can be discontinuous. In other words, in the structure, the light-absorbing layer formed in the opening portion 106 and the light-absorbing layer formed over the relieving layer 103 are not connected to each other. Thus, heat from the light-absorbing layer which has absorbed light in the opening portion 106 is not conducted to the light-absorbing layer formed over the relieving layer 103, so that heat diffusion in the plane direction of the light-absorbing layer is suppressed. Thus, the outline of a film-formation pattern can be prevented from being vague. In addition, even when film formation is conducted in a state that the film-formation substrate and the deposition substrate are in contact with each other (the distance d is 0), heat is difficult to be conducted to the deposition substrate. Thus, by decreasing the distance d, film formation can be conducted with higher accuracy. Accordingly, a finer pattern can be formed, and a high-definition light emitting device can be fabricated.

In the structure illustrated in FIG. 7E, a second relieving layer 112 is provided between the light-absorbing layer 104 and the material layer 105 in the structure illustrated in FIG. 7C. In other words, the reflective layer 102 having the opening portion 106 is formed over the first substrate 101, and the relieving layer 103 is formed over the reflective layer 102. The relieving layer 103 is formed so as to correspond to the region in which the reflective layer 102 is formed. The light-absorbing layer 104 is entirely formed thereover, and the second relieving layer 112 is formed in a region corresponding to the reflective layer 102 and the relieving layer 103. The material layer 105 is entirely formed thereover. With such a structure, even if heat is diffused in the plane direction of the light-absorbing layer 104, the heat is not conducted to the material layer in the region other than the desired region, and thus the outline of a film-formation pattern can be prevented from being vague. In addition, even when film formation is conducted in a state that the film-formation substrate and the deposition substrate are in contact with each other (the distance d is 0), heat is difficult to be conducted to the deposition substrate. Thus, by decreasing the thickness d, film formation can be conducted with higher accuracy. Accordingly, a finer pattern can be formed, and a high-definition light emitting device can be fabricated.

In the structure illustrated in FIG. 7F, the second relieving layer 112 in the structure illustrated in FIG. 7E is made thicker. By increasing the thickness of the second relieving layer 112, the material layer 105 can be discontinuous. In other words, in the structure, the material layer 105 formed in the opening portion 106 and the material layer 105 formed over the second relieving 112 are not connected to each other. Thus, even if heat is diffused in the plane direction of the light-absorbing layer 104, the heat is not conducted to the material layer in the region other than the desired region, and thus the outline of a film-formation pattern can be prevented from being vague. In addition, even when film formation is conducted in a state that the film-formation substrate and the deposition substrate are in contact with each other (the distance d is 0), heat is difficult to be conducted to the deposition substrate. Thus, by reducing the thickness d, film formation can be conducted with higher accuracy. Accordingly, a finer pattern can be formed, and a high-definition light emitting device can be fabricated.

In the structure illustrated in FIG. 7G, the relieving layer 103 in the structure illustrated in FIG. 7E is entirely formed. In the structure illustrated in FIG. 7G, a finer pattern can be formed, and a high-definition light emitting device can be fabricated as in the structure illustrated in FIG. 7E.

Figure 7H:
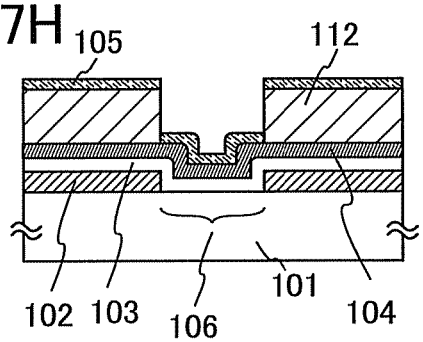

In the structure illustrated in FIG. 7H, the relieving layer 103 in the structure illustrated in FIG. 7F is entirely formed. In the structure illustrated in FIG. 7H, a finer pattern can be formed, and a high-definition light emitting device can be fabricated as in the structure illustrated in FIG. 7F.

According to the method for fabricating the light emitting device described in this embodiment, film formation can be conducted in only a desired region even when a large deposition substrate is used, and thus a finer pattern can be formed, and a high-definition light emitting device can be fabricated.

In the method for fabricating the light emitting device described in this embodiment, film formation is performed in a state where the distance between the film-formation substrate and the deposition substrate is short. Accordingly, most of the material layer which is formed over the film-formation substrate is formed on the deposition substrate; therefore, the use efficiency of the material is high. Thus, a reduction in fabrication cost can be achieved. Moreover, because film formation is conducted with a small thickness between the film-formation substrate and the deposition substrate, materials can be prevented from being attached to an inner wall of a film-formation chamber, and thus maintenance of the film-formation apparatus can be facilitated.

Film-formation substrates are prepared in advance and the used film-formation substrate is replaced with another, so that film formation can be performed on the deposition substrate one after another. Accordingly, the time needed for fabrication of the light emitting device (process time) can be shortened, and thus productivity can be increased.

The material layer of the film-formation substrate which has been used for film-formation once is removed and a new material layer is formed again, so that the film-formation substrate can be used plural times. Accordingly, the fabrication cost of a light emitting device can be reduced. A glass substrate or a quartz substrate is used as a supporting substrate of the film-formation substrate according to one embodiment of the present invention. An impurity (moisture or the like) is not likely to be adsorbed on or attached to these substrates, as compared to a film substrate or the like. Accordingly, the film-formation substrate according to one embodiment of the present invention is suitable for reuse.

In the method for fabricating a light emitting device according to one embodiment of the present invention, unlike a case where an EL layer is formed by a wet process, it is not necessary to take into consideration solubility of the layer which has been formed, or the like; therefore, a material to be formed as a film can be chosen from a wider range. Further, the number of layers to be stacked can be set freely. Accordingly, a light emitting device having a desired stacked structure can be fabricated using a desired material by the method for fabricating a light emitting element according to one embodiment of the present invention. In particular, it is important in terms of improvement in performance of the light emitting device that a kind of a material to be used or a stacked structure can be set freely when the size of a substrate is increased.

Further, in a case where a light emitting device is fabricated directly on a deposition substrate by a wet process, performance such as emission efficiency or lifetime is often inferior to a case where a light emitting device is fabricated by a dry process, because of influences of a solvent, impurities or the like. However, the method for fabricating a light emitting device according to one embodiment of the present invention can reduce adverse effects of a solvent, because at least part of a desired material is evaporated for film formation.

According to the method for fabricating a light emitting device according to one embodiment of the present invention, the thickness of the film which is formed on the second substrate, which is the deposition substrate, can be controlled by controlling the thickness of the material layer formed over the first substrate. In other words, since the thickness of the material layer on the first substrate is controlled in advance so that a film to be formed on the second substrate can have a desired thickness, a thickness monitor is not needed when a film is formed on the second substrate. Therefore, a user does not have to adjust the deposition rate with a thickness monitor, and the film-formation process can be fully automated. Accordingly, productivity can be increased.

According to the method for fabricating a light emitting device according to one embodiment of the present invention, a film of the material included in the material layer 105 formed over the first substrate can be formed uniformly. In the case where the material layer 105 includes plural kinds of materials, a film including the same deposition materials at roughly the same weight ratio as those of the material layer 105 can be formed on the second substrate, which is the deposition substrate. Therefore, by using the method for fabricating a light emitting device described in this embodiment, when film formation is performed using plural kinds of materials having different evaporation temperatures, unlike co-evaporation, the deposition rate of each material does not have to be controlled. Thus, without complicated control of the deposition rate or the like, a desired layer containing different kinds of materials can be formed easily with high accuracy.

Note that the structure described in this embodiment can be combined with any structure of the other embodiments as appropriate.

Embodiment 3

Embodiment 2 has described the case where a common layer is formed in all light emitting elements. However, the film-formation method described in Embodiment 2 makes it possible to conduct film formation in only a desired region, and thus films can be separately formed for light emitting elements. Accordingly, a full-color light emitting device can be formed by separately forming light emitting layers so as to correspond to light emitting elements by the film-formation method described in Embodiment 2. In addition, for example, when an EL layer (such as a hole injecting layer, a hole transporting layer, an electron injecting layer, or an electron transporting layer) other than the light emitting layer is formed, a suitable structure for each light emitting element can be separately formed by the film-formation method described in Embodiment 2. For example, it becomes easy to conduct an optical design, such as changing a thickness of an EL layer based on an emission wavelength, or to use different materials for light emitting elements.

A case where three different types of EL layers are formed using a film-formation substrate illustrated in this embodiment will now be described.

First, three film-formation substrates illustrated in FIG. 6B are prepared. Note that a material layer for forming an EL layer of a different emission color is formed in each film-formation substrate. Specifically, a first film-formation substrate having a material layer (R) for forming an EL layer exhibiting red light emission (an EL layer (R)), a second film-formation substrate having a material layer (G) for forming an EL layer exhibiting green light emission (an EL layer (G)), and a third film-formation substrate having a material layer (B) for forming an EL layer exhibiting blue light emission (an EL layer (B)) are prepared.

In addition, one deposition substrate having a plurality of first electrodes is prepared, which is illustrated in FIGS. 8A and 8B in Embodiment 2. Note that since end portions of the plurality of first electrodes on the deposition substrate are covered with an insulator, a light emitting region corresponds to part of the first electrode which is exposed without being overlapped with the insulating layer.

First, the deposition substrate and the first film-formation substrate are superimposed, aligned and fixed for a first film-formation process, as in FIGS. 8A and 8B. The deposition substrate is preferably provided with an alignment marker. The first film-formation substrate is preferably also provided with an alignment marker. Note that because the first film-formation substrate is provided with a light-absorbing layer, a portion of the light-absorbing layer near the alignment marker is desirably removed in advance. In addition, because the first film-formation substrate is provided with the material layer (R), a portion of the material layer (R) near the alignment marker is also desirably removed in advance.

Then, a rear surface of the first film-formation substrate (the surface on which the reflective layer 102, the light-absorbing layer 104, and the material layer 105, which are illustrated in FIGS. 8A and 8B, are not formed) is irradiated with light. The light-absorbing layer absorbs light and provides heat to the material layer (R) to heat the material contained in the material layer (R). Thus, an EL layer (R) is formed on the first electrode on the deposition substrate. After that, the first film-formation substrate is moved away, preparing for the next film formation.

Next, the deposition substrate and the second film-formation substrate are superimposed, aligned and fixed for a second film-formation process. The second film-formation substrate is provided with a reflective layer having an opening portion at a position which is shifted by one pixel from the first film-formation substrate, which has been used in the first film-formation process.

Then, a rear surface of the second film-formation substrate (the surface on which the reflective layer 102, the light-absorbing layer 104, and the material layer 105, which are illustrated in FIGS. 8A and 8B, are not formed) is irradiated with light. The light-absorbing layer absorbs light and provides heat to the material layer (G) to heat the material contained in the material layer (G). Thus, an EL layer (G) is formed on the first electrode on the deposition substrate, which is adjacent to the first electrode on which the EL layer (R) is formed in the first film-formation process. After that, the second film-formation substrate is moved away, preparing for the next film formation.

Next, the deposition substrate and the third film-formation substrate are superimposed, aligned and fixed for a third film-formation process. The third film-formation substrate is provided with a reflective layer having an opening portion at a position which is shifted by two pixels from the first film-formation substrate, which has been used in the first film-formation process.

Figure 14A:
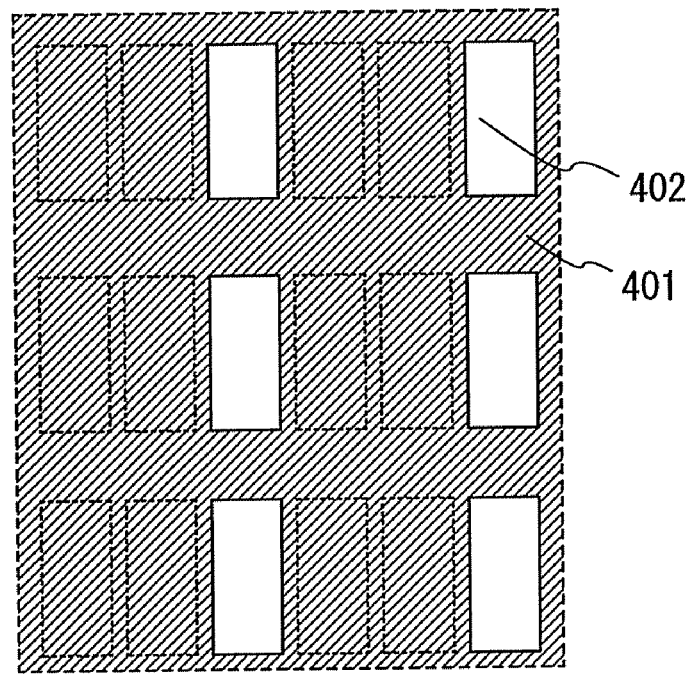
FIGS. 14A and 14B illustrate a method for fabricating a light emitting device according to one embodiment of the present invention.

Then, a rear surface of the third film-formation substrate (the surface on which the reflective layer 102, the light-absorbing layer 104, and the material layer 105, which are illustrated in FIGS. 8A and 8B, are not formed) is irradiated with light. A state of the third film-formation substrate right before the third film-formation process corresponds to the plan view of FIG. 14A. In FIG. 14A, a reflective layer 401 has an opening portion 402. Accordingly, light which have passed through the opening portion 402 of the reflective layer 401 of the third film-formation substrate is absorbed by the light-absorbing layer. A region of the deposition substrate which corresponds to the opening portion 402 of the third film-formation substrate is provided with the first electrode. In addition, below regions indicated by dotted lines in FIG. 14A, the EL layer (R) 411 formed through the first film-formation process and the EL layer (G) 412 formed through the second film-formation process are located.

Then, an EL layer (B) 413 is formed through the third film-formation process. The light-absorbing layer absorbs irradiation light and provides heat to the material layer (B) to heat the material contained in the material layer (B). Thus, the EL layer (B) 413 is formed on the first electrode on the deposition substrate, which is adjacent to the first electrode on which the EL layer (G) 412 is formed in the second film-formation process.

In this manner, the EL layer (R) 411, the EL layer (G) 412, and the EL layer (B) 413 can be formed at certain intervals on one deposition substrate. Then, second electrodes are formed over these layers. Thus, light emitting elements can be formed.

Through the above processes, light emitting elements which exhibit light emission of different colors are formed over one substrate, whereby a light emitting device capable of full-color display can be formed.

Figure 14B:
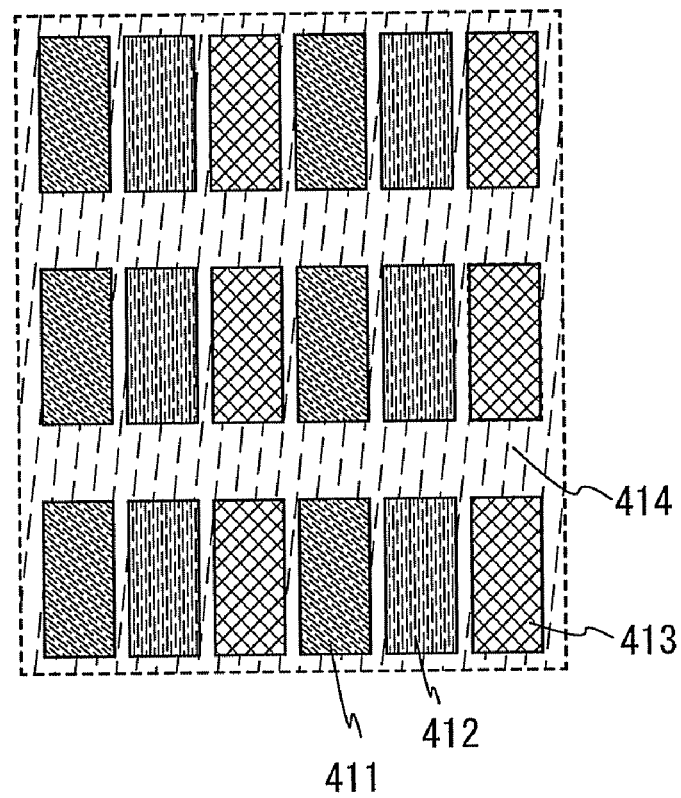

FIGS. 14A and 14B illustrate the example in which the opening portion 402 in the reflective layer formed over the film-formation substrate has a rectangular shape. However, there are no particular limitations and stripe opening portions may be employed. In the case where the stripe opening portions are employed, although film formation is also performed between light emitting regions for emitting light of the same color, the film formation is performed over the insulator 414, and thus a portion superimposed with the insulator 414 does not serve as a light emitting region.

Figure 15A:
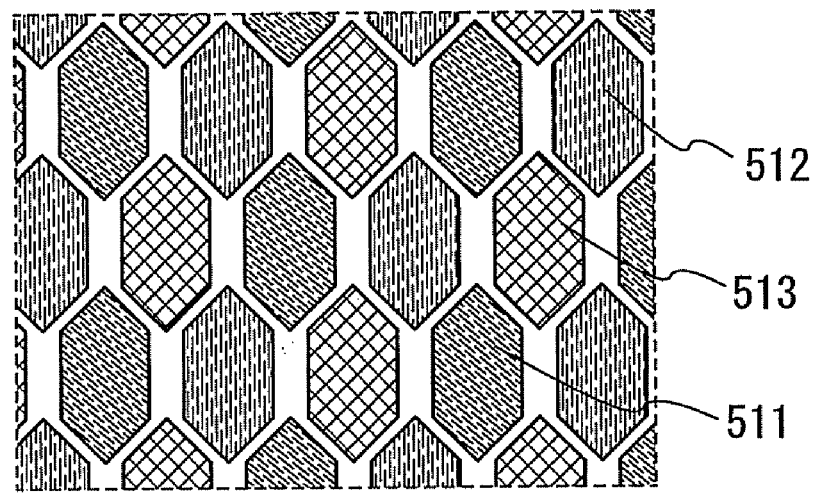
FIGS. 15A and 15B illustrate a method for fabricating a light emitting device according to one embodiment of the present invention.
Figure 15B:
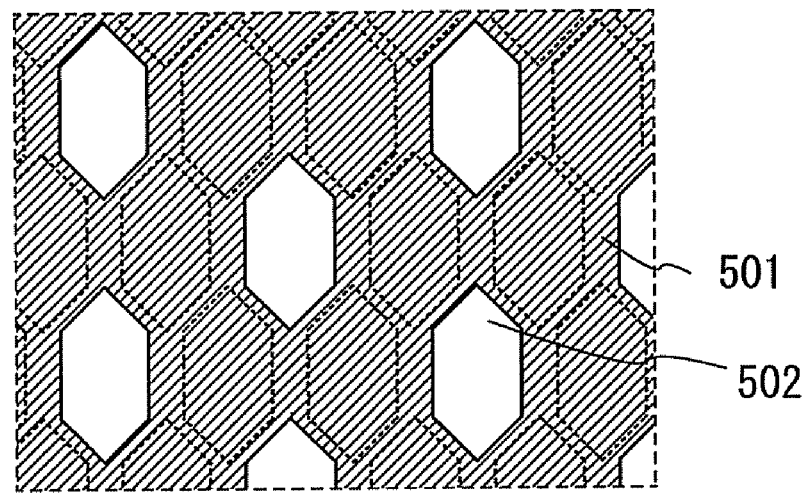

Similarly, there are no particular limitations on the arrangement of the pixels. The shape of each pixel may be a polygon, for example, a hexagon as illustrated in FIG. 15A, and a full-color light emitting device may be realized by arrangement of the EL layer (R) 511, the EL layer (G) 512, and the EL layer (B) 513. In order to form polygonal pixels in FIG. 15A, film formation may be performed using an film-formation substrate which includes a reflective layer 501 having polygonal opening portions 502 as illustrated in FIG. 15B.

According to the method for fabricating the light emitting device described in this embodiment, film formation can be conducted in only a desired region even when a large deposition substrate is used, and thus a finer pattern can be formed, and a high-definition light emitting device can be fabricated.

In the method for fabricating a light emitting device according to one embodiment of the present invention, film-formation substrates are prepared in advance and the used film-formation substrate is replaced with another, so that film formation can be performed on the deposition substrate one after another. Accordingly, the time needed for fabrication of the light emitting device (process time) can be shortened, and thus productivity can be increased.

The material layer of the film-formation substrate which has been used for film-formation once is removed and a new material layer is formed again, so that the film-formation substrate can be used plural times. Accordingly, the fabrication cost of a light emitting device can be reduced.

In the method for fabricating a light emitting device according to one embodiment of the present invention, unlike a case where an EL layer is formed by a wet process, it is not necessary to take into consideration solubility of the layer which has been formed, or the like; therefore, a material to be formed as a film can be chosen from a wider range. Further, the number of layers to be stacked can be set freely. Accordingly, a light emitting device having a desired stacked structure can be fabricated using a desired material by the method for fabricating a light emitting device according to one embodiment of the present invention. In particular, it is important in terms of improvement in performance of the light emitting device that a kind of a material to be used or a stacked structure can be set freely when the size of a substrate is increased.

Further, in a case where a light emitting device is fabricated directly on a deposition substrate by a wet process, performance such as emission efficiency or lifetime is often inferior to a case where a light emitting device is fabricated by a dry process, because of influences of a solvent, impurities or the like. However, the method for fabricating a light emitting device according to one embodiment of the present invention can reduce adverse effects of a solvent, because a desired material is heated and formed as a film.

By using the method for fabricating a light emitting device according to one embodiment of the present invention, a user does not have to adjust the deposition rate with a thickness monitor, and the film-formation process can be fully automated. Accordingly, productivity can be increased.

By using the method for fabricating a light emitting device according to one embodiment of the present invention, when film formation is performed using plural kinds of materials having different evaporation temperatures, unlike co-evaporation, the deposition rate of each material does not have to be controlled. Thus, without complicated control of the deposition rate or the like, a desired layer containing different kinds of materials can be formed easily with high accuracy.

Note that the structure described in this embodiment can be combined with any structure of the other embodiments as appropriate.

Embodiment 4

In Embodiment 4, a method for fabricating a full-color light emitting device using the film-formation method described in Embodiment 2 will now be described. In Embodiment 4, a method for fabricating a full-color light emitting device in which, in EL layers, light emitting layers are separately formed, and layers other than the light emitting layers are each formed in common is described with reference to FIGS. 10A to 10C, FIGS. 11A to 11C, FIGS. 12A to 12C, and FIG. 13.

First, a hole injecting layer 211 is formed over the first electrode 108 formed over the second substrate 107 which is a deposition substrate. The film-formation method of the hole injecting layer 211 may be any of various methods including the methods described in Embodiment 1 and Embodiment 2. Note that the hole injecting layer 211 is entirely formed in a pixel portion as a common layer for light emitting elements, or the hole injecting layers may be separately formed for light emitting elements as described in Embodiment 2. Preferably, the hole injecting layer 211 is entirely formed in the pixel portion and is a common layer for light emitting elements so that alignment of pixels becomes easy.

Next, a hole transporting layer 212 is formed over the hole injecting layer 211. The film-formation method of the hole transporting layer 212 may be any of various methods including the methods described in Embodiment 1 and Embodiment 2. Note that the hole transporting layer 212 is entirely formed in a pixel portion as a common layer for light emitting elements, or the hole transporting layers may be separately formed for light emitting elements as described in Embodiment 2. Preferably, the hole transporting layer 212 is entirely formed in a pixel portion and is a common layer for light emitting elements so that alignment of pixels becomes easy.

Figure 10A:
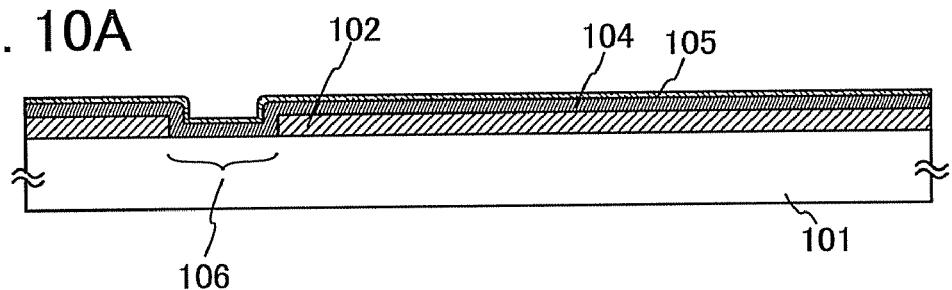
FIGS. 10A to 10C illustrate a method for fabricating a light emitting device according to one embodiment of the present invention.
Figure 10B:
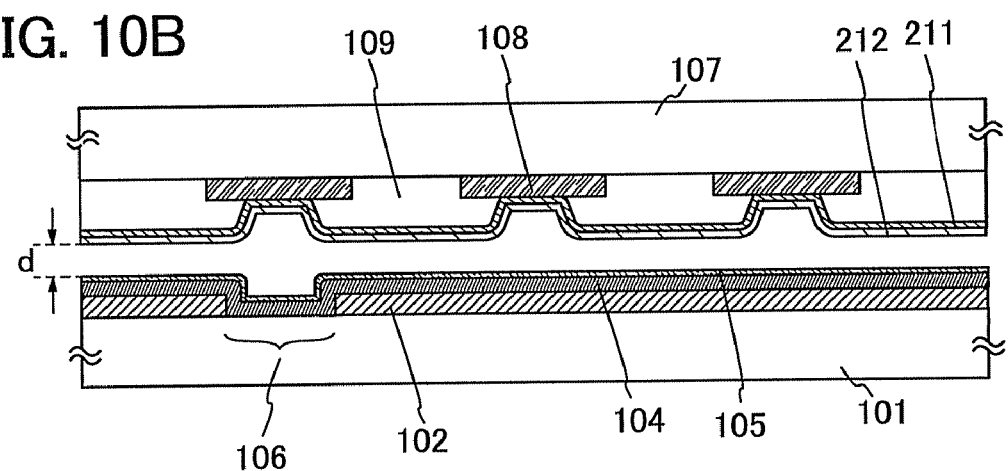
Figure 10C:
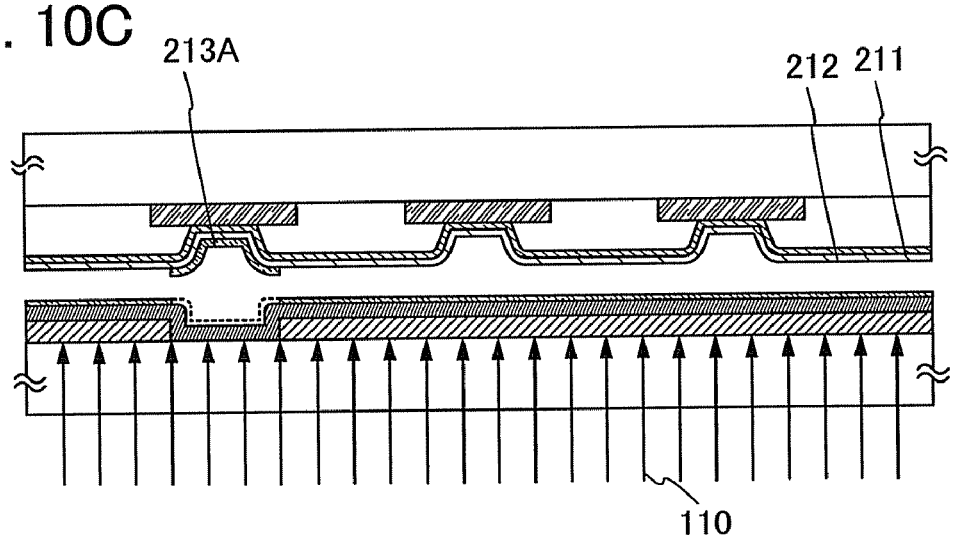

Next, as illustrated in FIGS. 10A to 10C, a light emitting layer 213A is formed. The light emitting device in this embodiment is capable of full-color display, and thus the light emitting layer 213A is formed in only a region corresponding to, for example, a red pixel (a pixel for red emission). FIG. 10A illustrates an example of a film-formation substrate in which the opening portion 106 is provided for the reflective layer 102 so that film formation can be conducted to only a region corresponding to a red pixel. By using the film-formation substrate illustrated in FIG. 10A, and using the film-formation method described in Embodiment 2, the light emitting layer 213A can be formed in only the region corresponding to a red pixel.

Figure 11A:
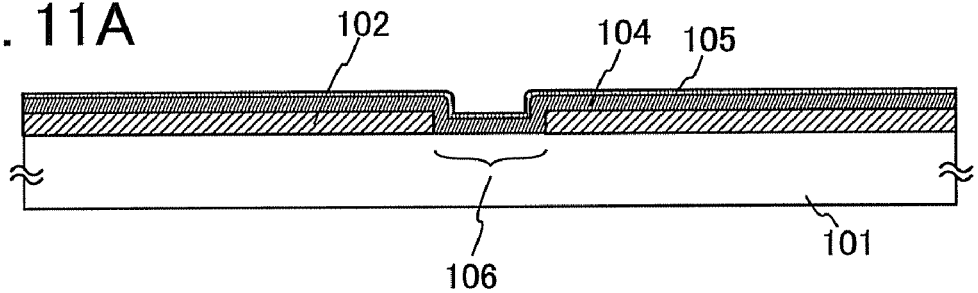
FIGS. 11A to 11C illustrate a method for fabricating a light emitting device according to one embodiment of the present invention.
Figure 11B:
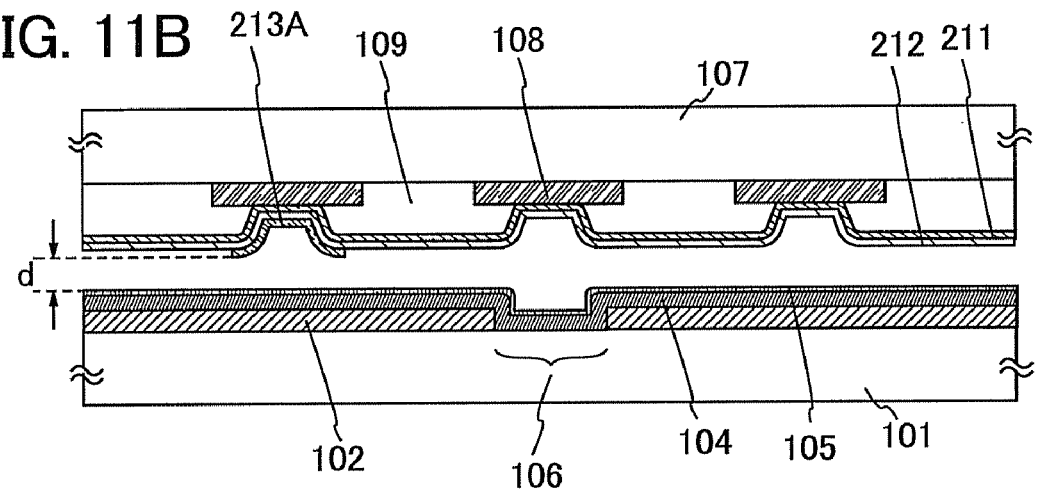
Figure 11C:
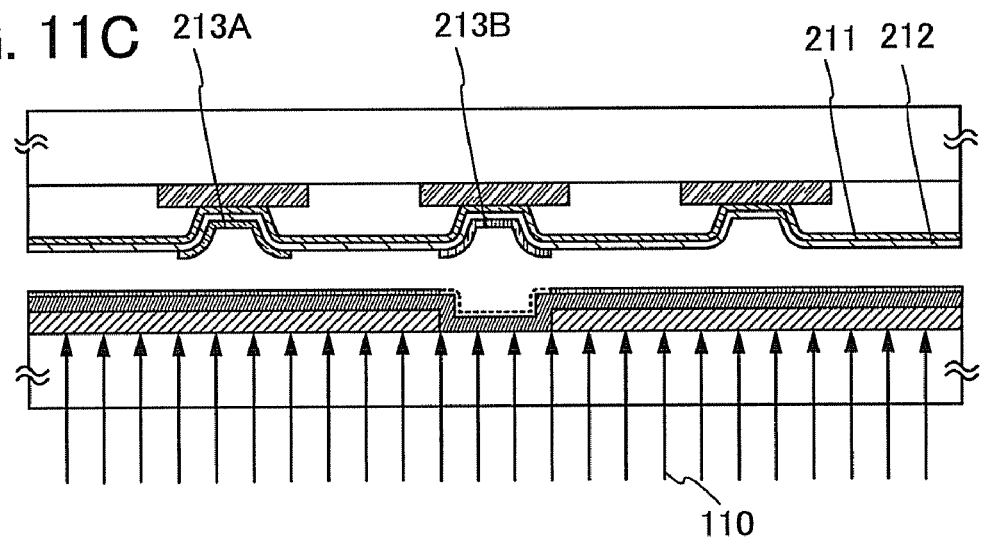

Next, as illustrated in FIGS. 11A to 11C, a light emitting layer 213B is formed. The light emitting device in this embodiment is capable of full-color display, and thus the light emitting layer 213B is formed in only a region corresponding to, for example, a green pixel (a pixel for green emission). FIG. 11A illustrates an example of a film-formation substrate in which the opening portion 106 is provided for the reflective layer 102 so that film formation can be conducted to only a region corresponding to a green pixel. By using the film-formation substrate illustrated in FIG. 11A, and using the film-formation method described in Embodiment 2, the light emitting layer 213B can be formed in only the region corresponding to a green pixel.

Figure 12A:
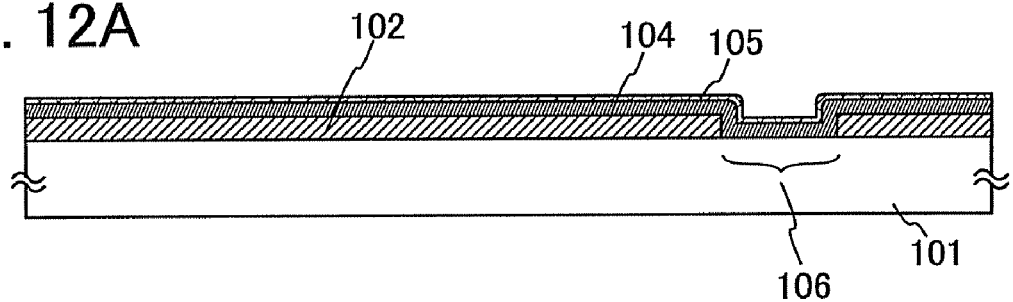
FIGS. 12A to 12C illustrate a method for fabricating a light emitting device according to one embodiment of the present invention.
Figure 12B:
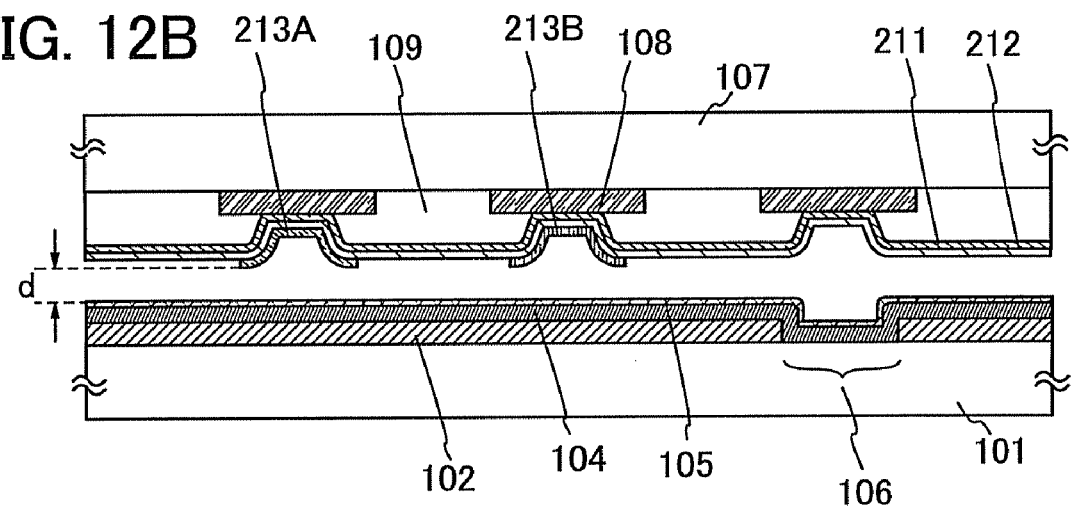
Figure 12C:
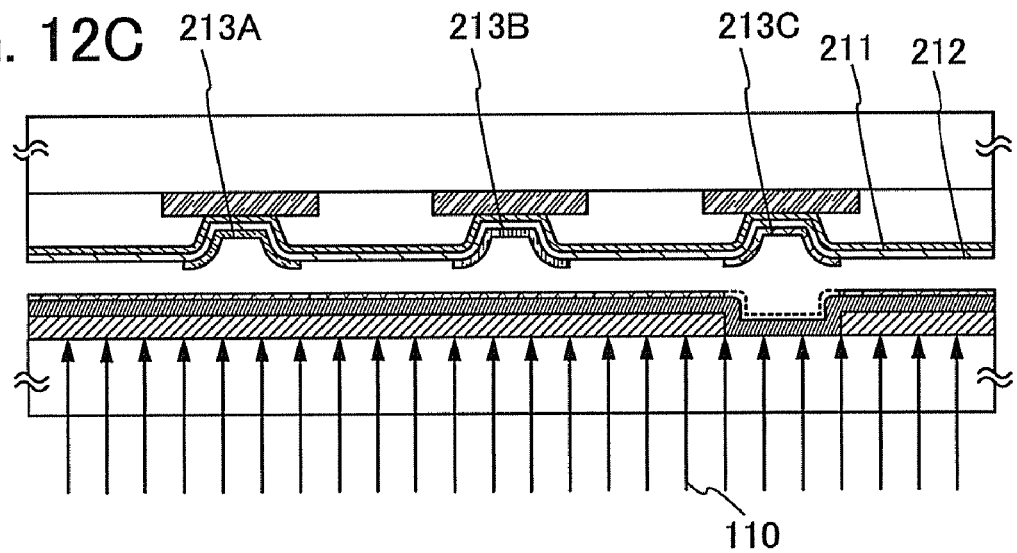

Next, as illustrated in FIGS. 12A to 12C, a light emitting layer 213C is formed. The light emitting device in this embodiment is capable of full-color display, and thus the light emitting layer 213C is formed in only a region corresponding to, for example, a blue pixel (a pixel for blue emission). FIG. 12A illustrates an example of a film-formation substrate in which the opening portion 106 is provided for the reflective layer 102 so that film formation can be conducted to only a region corresponding to a blue pixel. By using the film-formation substrate illustrated in FIG. 12A, and using the film-formation method described in Embodiment 2, the light emitting layer 213C can be formed in only the region corresponding to a blue pixel.

Next, an electron transporting layer 214 is formed over the light emitting layers 213A to 213C. The film-formation method of the electron transporting layer 214 may be any of various methods including the methods described in Embodiment 1 and Embodiment 2. Note that the electron transporting layer 214 is entirely formed in a pixel portion as a common layer for light emitting elements, or the electron transporting layers may be separately formed for light emitting elements as described in Embodiment 2. Preferably, the electron transporting layer 214 is entirely formed in a pixel portion and is a common layer for light emitting elements so that alignment of pixels becomes easy.

Next, an electron injecting layer 215 is formed over the electron transporting layer 214. The film-formation method of the electron injecting layer 215 may be any of various methods including the methods described in Embodiment 1 and Embodiment 2. Note that the electron injecting layer 215 is entirely formed in a pixel portion as a common layer for light emitting elements, or the electron injecting layers may be separately formed for light emitting elements as described in Embodiment 2. Preferably, the electron injecting layer 215 is entirely formed in a pixel portion and is a common layer for light emitting elements so that alignment of pixels becomes easy.

Figure 13:
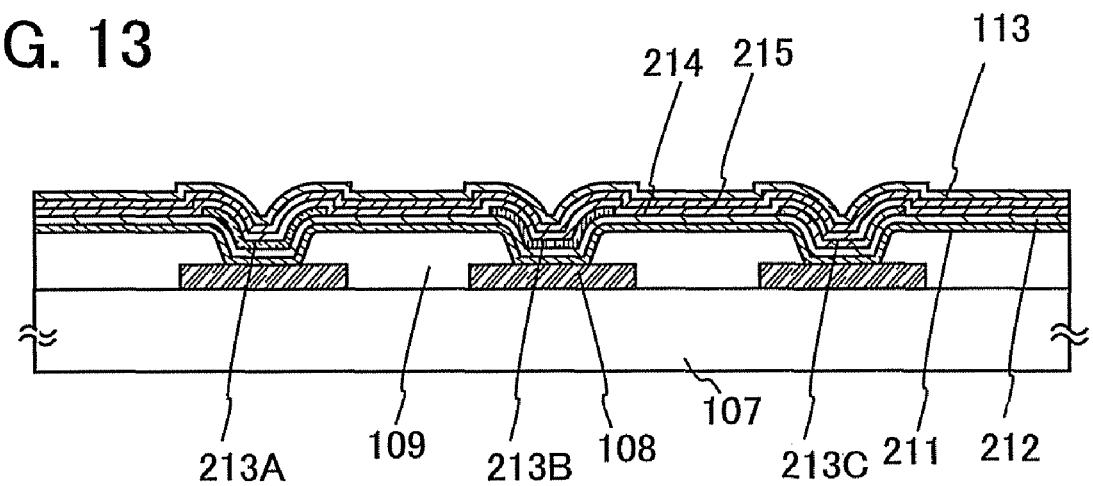
FIG. 13 illustrates a method for fabricating a light emitting device according to one embodiment of the present invention.

After that, a second electrode 113 is formed over the electron injecting layer 215, and in this manner, a light emitting element illustrated in FIG. 13 can be fabricated.

In this embodiment, each light emitting element has the hole injecting layer, the hole transporting layer, the light emitting layer, the electron transporting layer, and the electron injecting layer, and the other layers than the light emitting layer may be provided as appropriate. Alternatively, the structures of the light emitting elements may be different from each other. By the film-formation method described in Embodiment 2, the layers can be formed selectively for each light emitting element.

In addition, in this embodiment, the light emitting layer for the red pixel, the light emitting layer for the green pixel, and the light emitting layer for the blue pixel are formed in this order, but the order of forming the light emitting layers is not limited thereto. In addition, a white pixel (a pixel for white emission) may be provided, without being limited to three colors. Also in this case, the film-formation method described in Embodiment 1 or Embodiment 2 can be employed.

In this embodiment, the light emitting layer for the red pixel, the light emitting layer for the green pixel, and the light emitting layer for the blue pixel are separately formed. Alternatively, it is also possible that by entirely forming the light emitting layer for the blue pixel, the light emitting layer for the blue pixel serves as the light emitting layer in the blue pixel but serves as the hole transporting layer in the pixels for the other colors.

According to the method for fabricating the light emitting device described in this embodiment, film formation can be conducted only in a desired region even when a large deposition substrate is used, and thus a finer pattern can be formed, and a high-definition light emitting device can be fabricated.

In the method for fabricating a light emitting device according to one embodiment of the present invention, film-formation substrates are prepared in advance and the used film-formation substrate is replaced with another, so that film formation can be performed on the deposition substrate one after another. Accordingly, the time needed for fabrication of the light emitting device (process time) can be shortened, and thus productivity can be increased.

The material layer of the film-formation substrate which has been used for film-formation once is removed and a new material layer is formed again, so that the film-formation substrate can be used plural times. Accordingly, the fabrication cost of a light emitting device can be reduced.

In the method for fabricating a light emitting device according to one embodiment of the present invention, unlike a case where an EL layer is formed directly on a deposition substrate by a wet process, it is not necessary to take into consideration solubility of the layer which has been formed, or the like; therefore, a material to be formed as a film can be chosen from a wider range. Further, the number of layers to be stacked can be set freely. Accordingly, a light emitting device having a desired stacked structure can be fabricated using a desired material by the method for fabricating a light emitting device according to one embodiment of the present invention. In particular, it is important in terms of improvement in performance of the light emitting device that a kind of a material to be used or a stacked structure can be set freely when the size of a substrate is increased.

Further, in a case where a light emitting device is fabricated directly on a deposition substrate by a wet process, performance such as emission efficiency or lifetime is often inferior to a case where a light emitting device is fabricated by a dry process, because of influences of a solvent, impurities or the like. However, the method for fabricating a light emitting device according to one embodiment of the present invention can reduce adverse effects of a solvent, because a desired material is heated and formed as a film.

By using the method for fabricating a light emitting device according to one embodiment of the present invention, a user does not have to adjust the deposition rate with a thickness monitor, and the film-formation process can be fully automated. Accordingly, productivity can be increased.

By using the method for fabricating a light emitting device according to one embodiment of the present invention, when film formation is performed using plural kinds of materials having different evaporation temperatures, unlike co-evaporation, the deposition rate of each material does not have to be controlled. Thus, without complicated control of the deposition rate or the like, a desired layer containing different kinds of materials can be formed easily with high accuracy.

Note that the structure described in this embodiment can be combined with any structure of the other embodiments as appropriate.

Embodiment 5

In Embodiment 5, an example of a film-formation apparatus for performing film-formation by irradiating a film-formation substrate with lamp light is described.

Examples of film-formation apparatuses which enable fabrication of a light emitting device according to one embodiment of the present invention will now be described. FIGS. 16A and 16B and FIGS. 17A and 17B are schematic cross-sectional views of film-formation apparatuses in this embodiment.

Figure 16A:
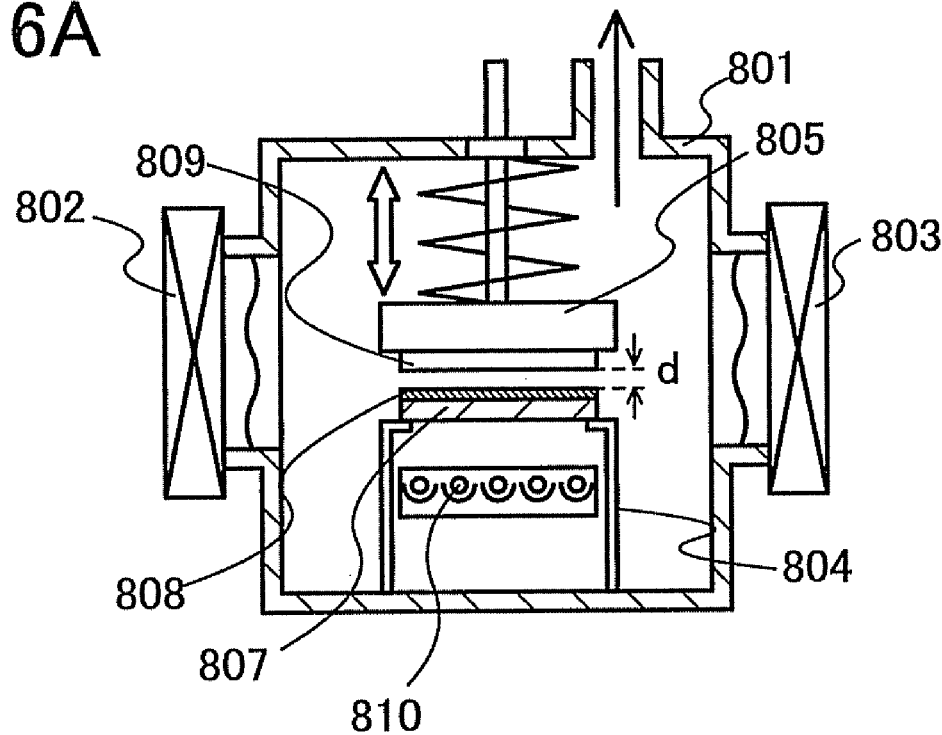
FIGS. 16A and 16B each illustrate a film-formation apparatus according to one embodiment of the present invention.

In FIG. 16A, a film-formation chamber 801 is a vacuum chamber and is connected to other treatment chambers via a first gate valve 802 and a second gate valve 803. The film-formation chamber 801 at least includes a substrate supporting unit which is a first substrate supporting unit 804, a deposition substrate supporting unit which is a second substrate supporting unit 805, and a light source 810.

First, the material layer 808 is formed over the first substrate 807, which is a film-formation substrate, by the method described in Embodiment 1. In this embodiment, the first substrate 807 corresponds to the first substrate 101 illustrated in any of FIGS. 6A to 6C, and the material layer 808 corresponds to the material layer 105 illustrated in any of FIGS. 6A to 6C. For the first substrate 807, a substrate having a light-transmitting property is used. Note that there are no particular limitations on the shape of the first substrate 807. The first substrate 807 preferably has an area larger than or the same as a deposition substrate. For the material layer 808, an organic compound which can be deposited is used. The film-formation method of the material layer 808 can be the method illustrated in Embodiment 1.

The first substrate 807 is transferred from another film-formation chamber to the film-formation chamber 801 and is set on the substrate supporting unit. In addition, the first substrate 807 is fixed to the substrate supporting unit so that a surface of the first substrate 807, on which the material layer 808 is formed, and a surface of a second substrate 809 which is the deposition substrate face each other.

Figure 16B:
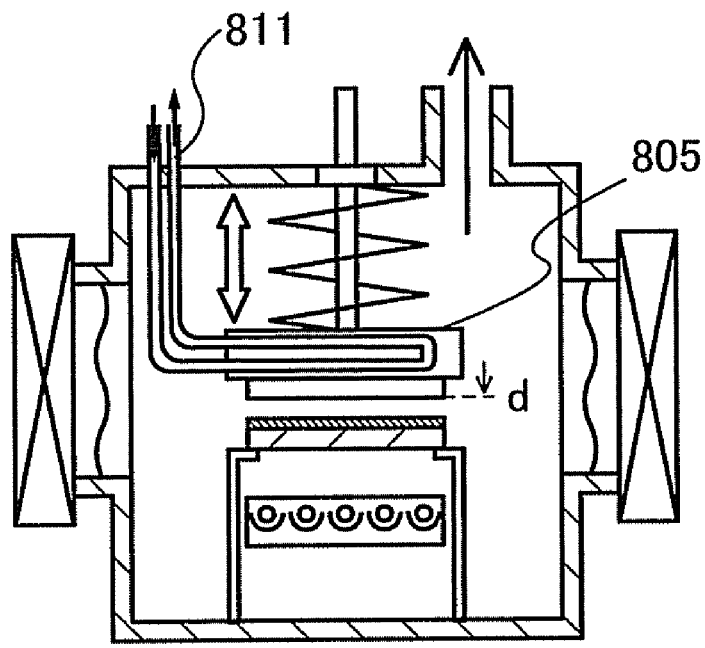

The second substrate supporting unit 805 is moved such that the distance between the first substrate 807 and the second substrate 809 becomes distance d. It is to be noted that the distance d is determined as a distance between a surface of the material layer 808 formed on the first substrate 807 and a surface of the second substrate 809. In a case where a certain layer (e.g., a conductive layer that functions as an electrode or an insulating layer that functions as a partition wall) is formed on the second substrate 809, the distance d is determined as the distance between the surface of the material layer 808 formed on the first substrate 807 and the surface of the layer formed on the second substrate 809. It is to be noted that, in a case where the second substrate 809 or the layer formed on the second substrate 809 has unevenness in its surface, the distance d is determined as the shortest distance between the surface of the material layer 808 formed on the first substrate 807 and the outermost surface of the layer formed on the second substrate 809 or the surface of the second substrate 809. In this embodiment, the distance d is set to 2 mm. In addition, if the second substrate 809 is hard like a quartz substrate and formed of a material which is hardly deformed (warped, sag or the like), the distance d can be shortened to 0 mm as the minimum distance. Although examples in which the deposition substrate supporting unit is moved while the substrate supporting unit is fixed for controlling the distance between the substrates are shown in FIGS. 16A and 16B, a structure may also be employed in which the substrate supporting substrate is moved while the deposition substrate supporting unit is fixed. Alternatively, both the substrate supporting unit and the deposition substrate supporting unit may be moved. Note that, FIG. 16A illustrates a cross section of a step in which the second substrate supporting unit 805 is moved so that the first substrate 807 and the second substrate 809 are brought close to each other with the distance d therebetween.

Alternatively, a structure may also be employed in which the substrate supporting unit and the deposition substrate supporting unit move not only in a vertical direction but also in a horizontal direction and precise alignment is performed. In addition, the film-formation chamber 801 may include an alignment mechanism such as CCD for precise alignment or measurement of the distance d. In addition, a sensor for measuring the temperature or humidity inside the film-formation chamber 801 may be provided.

The film-formation substrate is irradiated with light emitted from the light source 810. Accordingly, the material layer 808 over the film-formation substrate is heated and evaporated in a short time, and thus the organic compound included in the material layer 808 is formed as a film on a deposition surface (i.e., a lower flat surface) of the second substrate 809, which is placed so as to face the surface of the material layer 808. In the film-formation apparatus illustrated in FIG. 16A, when the material layer with a uniform film thickness is obtained on the first substrate 807 beforehand, film formation with high uniformity is possible on the second substrate 809 without using a film thickness monitor. In addition, although a substrate is rotated in a conventional evaporation apparatus, the deposition substrate is fixed during film-formation in the film-formation apparatus illustrated in FIG. 16A; therefore, this film-formation apparatus is suitable for film-formation onto a large-area glass substrate that is easily broken. In the film-formation apparatus illustrated in FIG. 16A, film formation is conducted in a state that the film-formation substrate and the deposition substrate are both still.

In addition, in order to reduce influence that heat from the light source on standby has on the material layer 808 over the film-formation substrate, an openable and closable shutter for thermal insulation on standby (before a deposition process) may be provided between the light source 810 and the first substrate 807.

In addition, the light source 810 may be a heating unit which can heat uniformly in a short time, and may be a laser light source or a lamp light source illustrated in Embodiment 2. In FIGS. 16A and 16B, a lamp light source is used as the light source 810.

Although FIG. 16A shows an example in which the light source 810 is provided in the film-formation chamber 801, part of an inner wall of the film-formation chamber may be made of a light-transmitting member and the light source 810 may be placed outside the film-formation chamber. When the light source 810 is placed outside the film-formation chamber 801, maintenance such as replacement of light bulbs of the light source 810 can be made easier.

In addition, FIG. 16B illustrates an example of a film-formation apparatus provided with a mechanism for controlling the temperature of the second substrate 809. In FIG. 16B, the same components as those in FIG. 16A are denoted by the same reference numerals. In FIG. 16B, the second substrate supporting unit 805 includes a tube 811 through which a heat medium flows. A refrigerant flows through the tube 811 as a heat medium, whereby the second substrate supporting unit 805 can be a cold plate. The tube 811 has a mechanism in which it can follow the vertical movement of the second substrate supporting unit 805. As the heat medium, for example, water, silicone oil, or the like can be used. Note that, although an example in which the tube 811 through which a refrigerant gas or a liquid refrigerant flows is used is described in this embodiment, a peltier element or the like as a cooling unit may be provided for the second substrate supporting unit 805. Alternatively, a heating unit may be provided without providing a cooling unit. For example, a heat medium for heating may be flown through the tube 811.

The film-formation apparatus shown in FIG. 16B is useful in the case where different kinds of material layers are stacked. For example, in a case where a layer is previously formed over the second substrate, a layer including an organic compound having a deposition temperature higher than the layer can be stacked. In FIG. 16A, because the second substrate and the first substrate are disposed close to each other, there is a concern that the layer which has been formed on the second substrate may be evaporated. Thus, when the film-formation apparatus in FIG. 16B is used, a layer including an organic compound can be stacked while evaporation of the layer previously formed over the second substrate is suppressed by a cooling mechanism.

In addition, the second substrate supporting unit 805 may be provided with a heating unit such as a heater, in addition to the cooling unit. A unit for controlling the temperature of the second substrate (heating or cooling) can prevent warp or the like of the substrate.

Figure 17A:
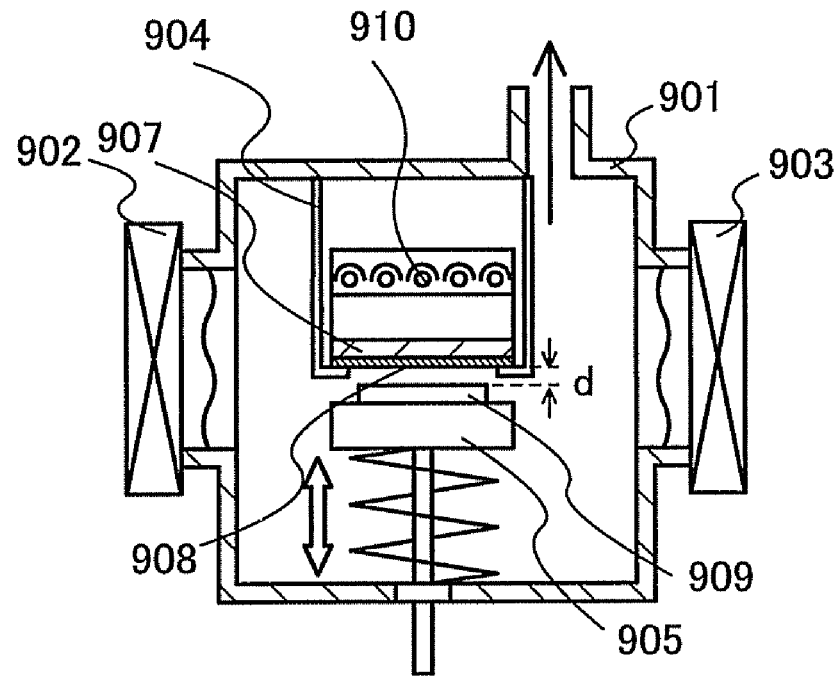
FIGS. 17A and 17B each illustrate a film-formation apparatus according to one embodiment of the present invention.
Figure 17B:
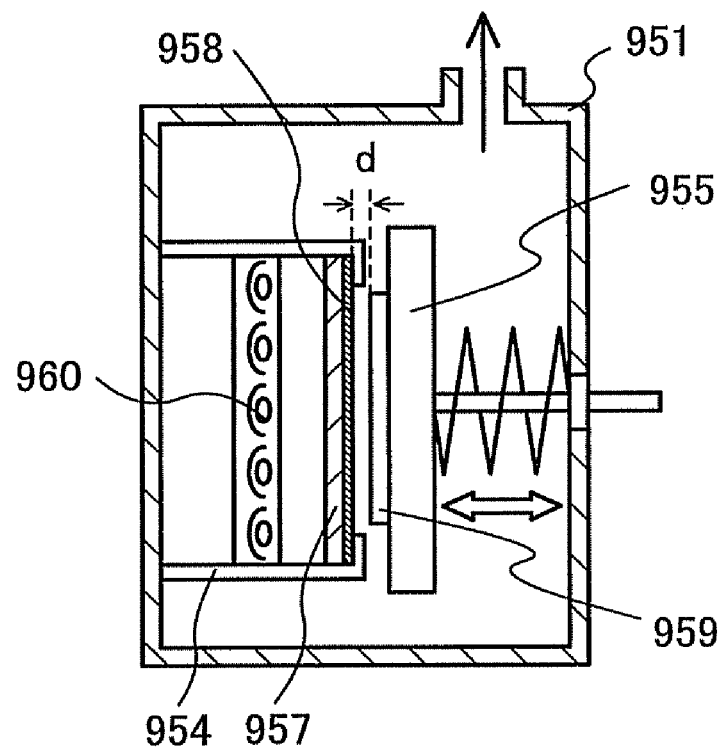

Note that, although FIGS. 16A and 16B each illustrate the example of the film-formation apparatus employing a face-down system in which the film-formation surface of the deposition substrate faces downward, a film-formation apparatus employing a face-up system as shown in FIGS. 17A and 17B may be used.

In FIG. 17A, a film-formation chamber 901 is a vacuum chamber and is connected to other treatment chambers via a first gate valve 902 and a second gate valve 903. The film-formation chamber 901 at least includes a deposition substrate supporting unit which is a second substrate supporting unit 905, a substrate supporting unit which is a first substrate supporting unit 904, and a light source 910.

A film-formation process is as follows. First, in another film-formation chamber, a material layer 908 is formed over a first substrate 907. In this embodiment, the first substrate 907 corresponds to the first substrate 101 illustrated in any of FIGS. 6A and 6B, and the material layer 908 corresponds to the material layer 105 illustrated in any of FIGS. 6A and 6B. For the first substrate 907, a substrate having a light-transmitting property is used. Note that there are no particular limitations on the shape of the first substrate 907. The first substrate 907 preferably has an area larger than or the same as a deposition substrate. For the material layer 908, an organic compound which can be deposited is used. The film-formation method of the material layer 908 can be the method illustrated in Embodiment 1.

The first substrate 907 is transported to the film-formation chamber 901 from another film-formation chamber and is set on the substrate supporting unit. In addition, the second substrate is fixed to the substrate supporting unit so that a surface of the material layer 908 formed on the first substrate 907 and a deposition surface of the second substrate 909 face each other. In addition, as shown in FIG. 17A, this structure is an example of a face-up system in which the deposition surface of the substrate face upward. In a case of the face-up system, sag of a substrate can be prevented by putting a large-area glass substrate that tends to sag on a flat base or by supporting it with a plurality of pins, so that the film-formation apparatus in which uniform film thickness can be obtained on the entire surface of the substrate can be obtained.

The second substrate supporting unit 905 is moved so that the first substrate 907 and the second substrate 909 are close to each other with a distance d therebetween. Note that the distance d is defined as the distance between a surface of the material layer 908 which is formed on the first substrate 907 and a surface of the second substrate 909. In addition, in the case where some layer (e.g., a conductive layer which functions as an electrode or an insulating layer which functions as a partition wall) is formed over the second substrate 909, the distance d is defined as a distance between the surface of the material layer 908 on the first substrate 907 and the surface of the layer which is formed over the second substrate 909. Note that in the case where the surface of the second substrate 909 or the surface of the layer formed over the second substrate 909 is uneven, the distance d is defined as the shortest distance between the surface of the material layer 908 on the first substrate 907 and the outermost surface of the second substrate 909 or the layer formed over the second substrate 909. In addition, in FIGS. 17A and 17B, although the example is described in which the deposition substrate supporting unit is moved while the substrate supporting unit is fixed, the substrate supporting unit may be moved while the deposition substrate supporting unit is fixed. Moreover, the distance d may be controlled in such a manner that both the substrate supporting unit and the deposition substrate supporting unit are moved.

As illustrated in FIG. 17A, the supporting substrate is irradiated with light emitted from the light source 910 while the distance between the substrates is retained at the distance d. Preferably, the contact area of the light source 910 with the supporting substrate is large for uniform heating.

By irradiation of the supporting substrate with light emitted from the light source 910, the material layer 908 on the supporting substrate is heated and evaporated in a short time, and thus a film of an organic compound is formed on a deposition surface (i.e., an upper flat surface) of the second substrate 909, which is placed so as to face the surface of the material layer 908. This makes it possible to realize a small-sized film-formation apparatus the capacity of which is drastically smaller than that of a conventional evaporation apparatus which is a large-capacity chamber.

There is no particular limitation on the light source as long as the light source is a heating unit capable of uniform heating in a short time. For example, a laser light source or a lamp light source may be used. In the example shown in FIG. 17A, the light source 910 is fixed above the second substrate and a film is formed on an upper surface of the second substrate 909 immediately after the light source 910 emits light.

Note that, although FIGS. 16A and 16B and FIG. 17A each illustrate the example of the film-formation apparatus employing a system in which substrates are arranged horizontally, a film-formation apparatus employing a system in which substrates are arranged vertically as illustrated in FIG. 17B can also be used.

In FIG. 17B, a film-formation chamber 951 is a vacuum chamber. The film-formation chamber 951 at least includes a substrate supporting unit which is a first substrate supporting unit 954, a deposition substrate supporting unit which is a second substrate supporting unit 955, and a light source 960.

Although not illustrated, the film-formation chamber 951 is connected to a first transport chamber to and from which a deposition substrate is transported while being placed vertically. The film-formation chamber 951 is also connected to a second transport chamber to and from which a supporting substrate is transported while being placed vertically, which is also not illustrated. In this specification, vertical arrangement of a substrate refers to placement of a substrate of which a substrate surface makes an angle which is nearly vertical (ranging from 70 to 110°) with respect to a horizontal plane. Because a large-area glass substrate is easy to sag, it is desirably placed vertically to be transferred.

A lamp is more suitable than a laser as the light source 960 for heating of a large-area glass substrate.

A film-formation process is as follows. First, in another film-formation chamber, a material layer 958 is formed over one of surfaces of a first substrate 957, which is a supporting substrate. Note that the first substrate 957 corresponds to the first substrate 101 illustrated in any of FIGS. 6A to 6C, and the material layer 958 corresponds to the material layer 105 illustrated in any of FIGS. 6A to 6C.

Next, the first substrate 957 is transferred from another film-formation chamber to the film-formation chamber 951 and is set on the substrate supporting unit. In addition, the first substrate 957 is fixed to the substrate supporting unit so that the surface of the material layer 958 formed on the first substrate 957 and the deposition surface of a second substrate 959 face each other.

Next, the supporting substrate is irradiated with light emitted from the light source 960 and is rapidly heated while the distance between the substrates is retained at the distance d. When the supporting substrate is rapidly heated, the material layer 958 over the supporting substrate is heated to be evaporated in a short time by indirect heat conduction, whereby a film of an deposition material is formed on the deposition surface of the second substrate 959, which is the deposition substrate placed to face the supporting substrate. This makes it possible to realize a small-sized film-formation apparatus the capacity of which is drastically smaller than that of a conventional evaporation apparatus which is a large-capacity chamber.

A plurality of film-formation apparatuses described in this embodiment can be provided to form a multi-chamber manufacturing apparatus. It is needless to say that a film-formation apparatus utilizing another film-formation method can be combined therewith. Alternatively, a plurality of film-formation apparatuses described in this embodiment can be disposed in series to form an in-line manufacturing apparatus.

By using such a film-formation apparatus, a light emitting device according to one embodiment of the present invention can be fabricated. Moreover, according to one embodiment of the present invention, a deposition material can be prevented from being attached to an inner wall of a film-formation chamber, and thus maintenance of the film-formation apparatus can be made easier.

Note that the structure described in this embodiment can be combined with any structure of the other embodiments in this specification as appropriate.

Embodiment 6

In Embodiment 6, an example of a film-formation apparatus in which film formation is conducted by irradiating a film-formation substrate with laser light, and a method of irradiation of laser light will be described.

Figure 18:
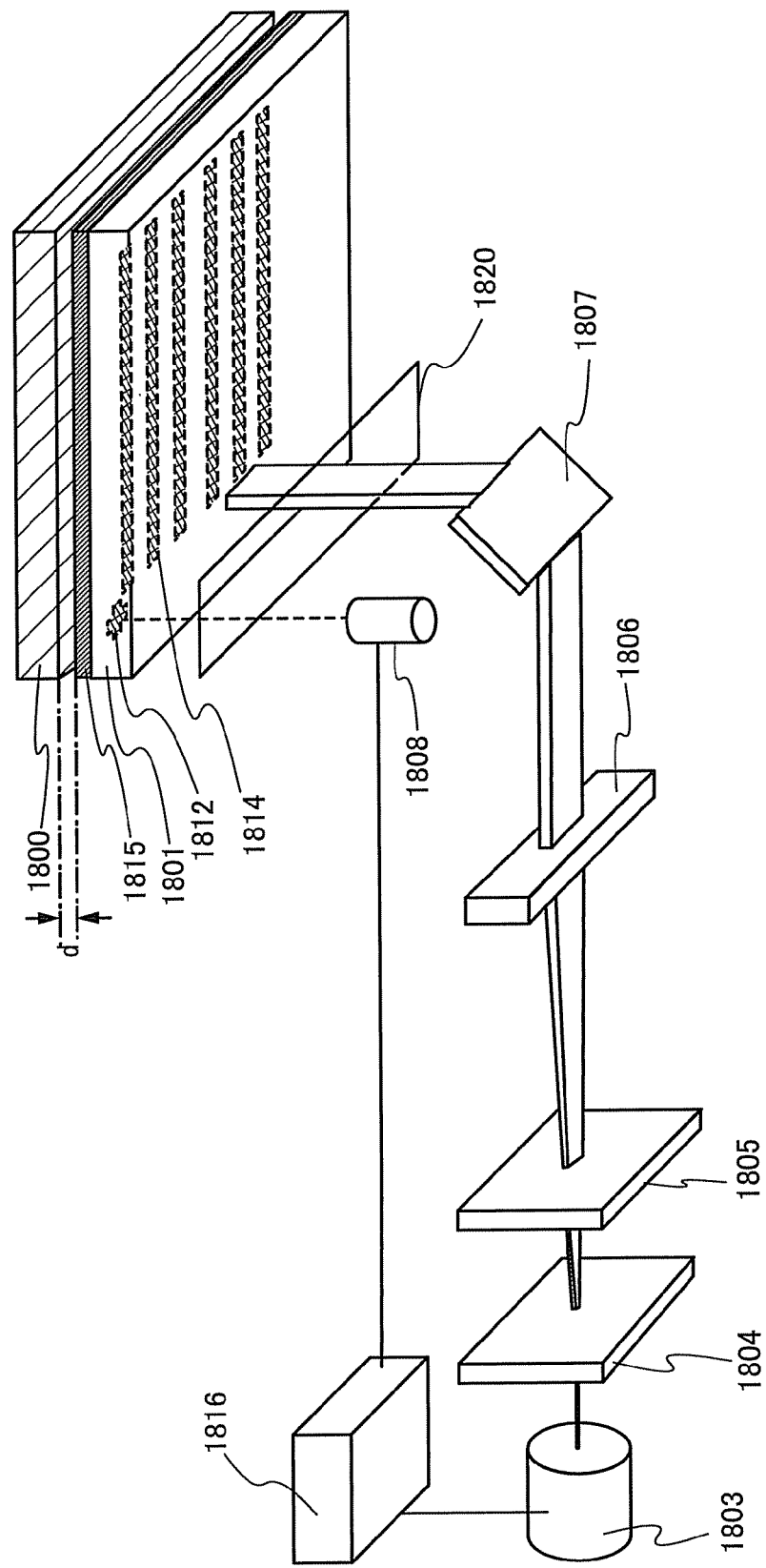
FIG. 18 illustrates a film-formation apparatus according to one embodiment of the present invention.

FIG. 18 is a perspective view illustrating an example of a film-formation apparatus using a laser. Laser light is outputted from a laser device 1803 (a YAG laser device, an excimer laser device, or the like) and transmitted through a first optical system 1804 for changing a laser beam shape into a rectangular shape, a second optical system 1805 for shaping the laser beam, and a third optical system 1806 for collimating the laser beam; and an optical path is bent in a direction perpendicular to a first substrate 1801, which is an film-formation substrate by using a reflecting mirror 1807. Then, the film-formation substrate is irradiated with the laser beam.

The structure of the film-formation substrate in this embodiment is the same as those in Embodiments 1 and 2. In other words, it is a structure in which at least the light-absorbing layer and the material layer 1815, etc., are formed over the first substrate 1801. In FIG. 18, a film-formation substrate having a reflective layer is illustrated as an example. In addition, the reflective layer has an opening portion 1814. In addition, although FIG. 18 illustrates the stripe opening portion 1814, the opening portion can have a desired shape, without being limited to the stripe shape. For example, the opening portion may have a dot shape, or the same shape as the first electrode provided for the first substrate.

Next, the first substrate 1801 and a deposition surface of the second substrate 1800 are set so as to face each other such that the surface provided with the material layer 1815 of the first substrate 1801 faces upward. Positional alignment of the second substrate 1800 and the first substrate 1801 is conducted such that they are held with a certain distance d, at least 5 mm, kept therebetween.

A plurality of first electrodes are provided for the second substrate 1800 in advance. In a case where an insulator which serves as a partition to electrically insulate the first electrodes is also provided, the insulator and the material layer 1815 may be disposed so as to be in contact with each other.

The pair of substrates is moved with the predetermined distance d kept, and scanning with laser light is performed. Here, the pair of substrates are moved by a substrate moving means in the long-side direction or the short-side direction of a rectangular window 1820. Here, an example is described where scanning with the laser light is performed by moving the substrates; however, there is no particular limitation and the substrates may be fixed and scanning may be performed by moving the laser light with the substrates fixed.

A positional alignment marker 1812 formed using the same material as the light-absorbing layer is provided for the first substrate 1801 and a reference position of scanning is observed by an imaging element 1808 for knowing the positional alignment marker 1812. The apparatus preferably has a structure where the view of the imaging element 1808 such as a CCD is not blocked. Note that since the positional alignment marker 1812 is observed from the bottom side of the first substrate 1801, the first substrate 1801 may be irradiated with auxiliary illumination light. An example where the imaging element 1808 observes the positional alignment marker 1812 through the window 1820 is described; however, there is no particular limitation, and a window may be provided separately, and alternatively, the imaging element may be provided inside the chamber.

Laser light is outputted from the laser device 1803 and transmitted through a first optical system 1804 for changing a laser beam shape into a rectangular shape, a second optical system 1805 for shaping the laser beam, and a third optical system 1806 for collimating the laser beam; and an optical path is bent to a direction perpendicular to the first substrate 1801 by using a reflecting mirror 1807. After that, a laser beam is transmitted through the window 1820 which transmits light and the first substrate 1801, so that the light-absorbing layer is irradiated with the laser beam. The window 1820 can be made to have the same size as or the smaller size than the width of the laser beam to serve as a slit.

As the laser light emitted from the light source, various kinds of laser light can be used. Further, the wavelength of the laser light is not particularly limited and laser light having a variety of wavelengths can be used. For example, laser light having a wavelength of 355 nm, 515 nm, 532 nm, 1030 nm, 1064 nm, or the like can be used.

Further, as the laser light source, one or more of the following lasers can be used: a gas laser such as an Ar laser, a Kr laser, or an excimer laser; and a solid-state laser such as a laser whose medium is single-crystal YAG, $YVO_4$, forsterite ($Mg_2SiO_4$), $YAlO_3$, or $GdVO_4$ to which one or more of Nd, Yb, Cr, Ti, Ho, Er, Tm, and Ta has been added as a dopant, a polycrystalline (ceramic) YAG, $Y_2O_3$, $YVO_4$, $YAlO_3$, or $GdVO_4$ to which one or more of Nd, Yb, Cr, Ti, Ho, Er, Tm, and Ta has been added as a dopant, a glass laser, a ruby laser, an alexandrite laser, a Ti:sapphire laser, or a fiber laser. Alternatively, a second harmonic, a third harmonic, or higher harmonics oscillated from the above-described solid-state laser can be used. Note that when a solid-state laser whose laser medium is solid is used, there are advantages in that a maintenance-free condition can be maintained for a long time and output is relatively stable. In addition, the laser light may be pulsed laser light or continuation laser light.

Further, the shape of a spot of the laser beam which is delivered to the first substrate 1801 which is the film-formation substrate is preferably rectangular or linear. Specifically, a rectangular shape with, e.g., a short side of 1 to 5 mm and a long side of 10 to 50 mm is preferable. Further, in a case where a substrate with a large area is used, in order to reduce processing time, a long side of the laser beam spot is preferably from 20 to 100 cm. Further, a plurality of laser devices and optical systems may be provided illustrated in FIG. 18 so that a substrate with a large area is processed in a short time. Specifically, a laser beam may be emitted from each of the plurality of laser devices in such a way that the area to be processed of one substrate is divided by the laser beams.

A control device 1816 is preferably operated such that it can also control the substrate moving means which moves the pair of substrates. Furthermore, the control device 1816 is preferably operated such that it can also control the laser device 1803. Moreover, the control device 1816 is preferably operated together with a positional alignment mechanism which has the imaging element 1808 for observing the positional alignment marker 1812.

After scanning with the laser light, over the first substrate 1801, the material layer 1815 which overlaps with the light-absorbing layer disappears, and film formation is selectively performed on the second substrate 1800 disposed so as to face the first substrate 1801. Note that over the first substrate 1801, the material layer 1815 which does not overlap with the light-absorbing layer is left. When the first substrate 1801 on which scanning with the laser light has been performed is collected and the remaining material layer is removed, the first substrate 1801 can be reused.

Note that FIG. 18 illustrates an example, and there are no particular limitations on positional relationship among optical systems and electro-optical element placed in the optical path of laser light. For example, a reflective mirror is not always needed if the laser device 1803 is disposed under the first substrate 1801 which is the film-formation substrate so that laser light is emitted from the laser device 1803 in a direction perpendicular to a principle plane of the first substrate 1801. Furthermore, an optical system may be a condenser lens, a beam expander, a homogenizer, a polarizer, or the like, and these may be combined. Further, an optical system may be combined with a slit.

By appropriate two-dimensional scanning an irradiation region with a laser beam on an irradiated plane, a wide area of the substrate is irradiated. The scanning is performed by relatively mobbing a laser beam irradiation region and the substrate. Here, the scanning is performed with a moving unit (not illustrated) for moving a substrate stage holding the substrate in X and Y directions.

When film formation is performed with the film-formation apparatus illustrated in FIG. 18, at least the first substrate 1801 which is the film-formation substrate, and the second substrate 1800 which is the deposition substrate are disposed in a vacuum chamber. All of the components illustrated in FIG. 18 may be placed in the vacuum chamber.

Although FIG. 18 illustrates an example of the film-formation apparatus employing a so-called face-down system in which a deposition surface of the second substrate 1800 which is the deposition substrate faces downward, a film-formation apparatus employing a face-up system may be used. When the deposition substrate is a large-area substrate, an apparatus employing a so-called vertical placement may also be employed in which a principal plane of the deposition substrate is placed perpendicular to a horizontal plane in order to suppress sag of the center of the substrate due to its own weight.

When a plurality of film-formation apparatuses described in this embodiment are provided, a multi-chamber manufacturing apparatus can be obtained. It is needless to say that a film-formation apparatus using another film-formation method can be combined therewith. In addition, when a plurality of film-formation apparatuses described in this embodiment is arranged in series, an in-line manufacturing apparatus can be obtained.

By using such a film-formation apparatus, a light emitting device according to one embodiment of the present invention can be fabricated. According to one embodiment of the present invention, a deposition material can be prevented from being attached to an inner wall of a film-formation chamber, and thus maintenance of a film-formation apparatus can be made easier.

Note that the structure described in this embodiment can be combined with any structure of the other embodiments in this specification as appropriate.

Embodiment 7

In Embodiment 7, a light emitting element and a light emitting device which can be fabricated according to one embodiment of the present invention will be described.

Figure 19A:
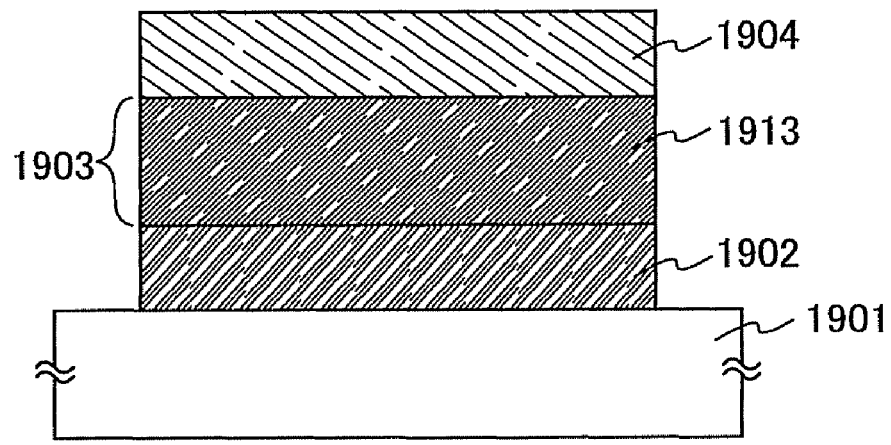
FIGS. 19A and 19B each illustrate a light emitting element.
Figure 19B:
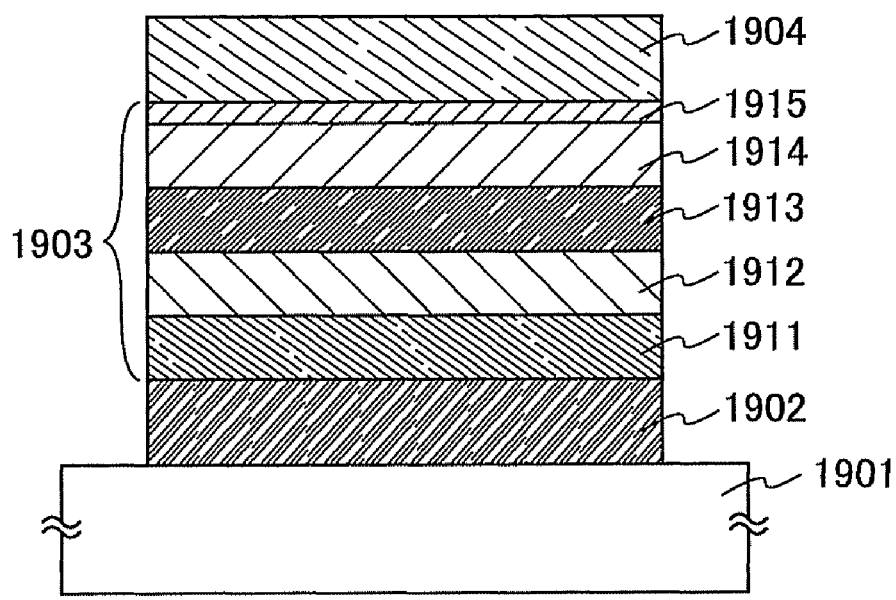

For example, light emitting elements illustrated in FIGS. 19A and 19B can be fabricated according to one embodiment of the present invention. In the light emitting element illustrated in FIG. 19A, a first electrode 1902, an EL layer 1903 which includes only a light emitting layer 1913 and a second electrode 1904 are stacked in that order over a substrate 1901. One of the first electrode 1902 and the second electrode 1904 functions as an anode, and the other functions as a cathode. Holes injected from an anode and electrons injected from a cathode are recombined in the EL layer 1903, whereby light emission can be obtained. In this embodiment, the first electrode 1902 functions as the anode and the second electrode 1904 functions as the cathode.

In the light emitting element illustrated in FIG. 19B, the EL layer 1903 in FIG. 19A has a stacked structure including a plurality of layers. Specifically, a hole injecting layer 1911, a hole transporting layer 1912, the light emitting layer 1913, an electron transporting layer 1914, and an electron injecting layer 1915 are provided in that order from the first electrode 1902 side. Note that the EL layer 1903 functions by including at least the light emitting layer 1913 as in FIG. 19A; therefore, all of the above layers are not always necessary and may be selected as appropriate to be provided as needed.

As the substrate 1901 in FIGS. 19A and 19B, a substrate having an insulating surface or an insulating substrate is employed. Specifically, any of a variety of glass substrates used for the electronics industry such as an aluminosilicate glass substrate, an aluminoborosilicate glass substrate, or a barium borosilicate glass substrate; a quartz substrate; a ceramic substrate; a sapphire substrate; or the like can be used.

For the first electrode 1902 and the second electrode 1904, any of various types of metals, alloys, conductive compounds, mixtures thereof, and the like can be used. Specific examples are given below: indium tin oxide (ITO), indium tin oxide containing silicon or silicon oxide, indium zinc oxide (IZO), indium oxide containing tungsten oxide and zinc oxide, and the like. In addition, gold (Au), platinum (Pt), nickel (Ni), tungsten (W), chromium (Cr), molybdenum (Mo), iron (Fe), cobalt (Co), copper (Cu), palladium (Pd), nitride of a metal material (such as titanium nitride), and the like can be given.

A film of any of those materials is generally formed by sputtering. For example, a film of indium zinc oxide can be formed by a sputtering method using a target in which zinc oxide is added to indium oxide at 1 to 20 wt %. A film of indium oxide containing tungsten oxide and zinc oxide can be formed by a sputtering method using a target in which tungsten oxide and zinc oxide are added to indium oxide at 0.5 to 5 wt % and 0.1 to 1 wt %, respectively. Further, a film of any of those materials may be formed by an ink-jet method, a spin coating method, or the like by application of a sol-gel process or the like.

Furthermore, aluminum (Al), silver (Ag), an alloy containing aluminum, or the like can be used. Moreover, any of the following materials having a low work function can be used: elements which belong to Group 1 and Group 2 of the periodic table, that is, alkali metals such as lithium (Li) and cesium (Cs) and alkaline-earth metals such as magnesium (Mg), calcium (Ca), and strontium (Sr), and alloys thereof (an alloy of aluminum, magnesium, and silver, and an alloy of aluminum and lithium); rare earth metals such as europium (Eu) and ytterbium (Yb), and alloys thereof; and the like.

A film of an alkali metal, an alkaline earth metal, and an alloy thereof can be formed by a vacuum evaporation method. A film of an alloy containing an alkali metal or an alkaline earth metal can be formed by a sputtering method. Further, a film of a silver paste or the like can be formed by an ink-jet method or the like. The first electrode 1902 and the second electrode 1904 are not limited to a single-layer film and can be formed as a stacked-layer film.

Note that in order to extract light emitted from the EL layer 1903 to the outside, one or both of the first electrode 1902 and the second electrode 1904 are formed so as to transmit light. For example, the first electrode 1902 and/or the second electrode 1904 are/is formed using a conductive material having a light-transmitting property, such as indium tin oxide, or formed using silver, aluminum, or the like with a thickness of several nanometers to several tens of nanometers. Alternatively, the first electrode 1902 and/or the second electrode 1904 can have a stacked-layer structure including a thin film of a metal such as silver, aluminum, or the like with a reduced thickness and a thin film of a conductive material having a light-transmitting property, such as ITO.

The EL layer 1903 (the hole injecting layer 1911, the hole transporting layer 1912, the light emitting layer 1913, the electron transporting layer 1914, or the electron injecting layer 1915) of the light emitting element in this embodiment can be formed by application of the film-formation method described in Embodiments 1 and 2. In addition, in one embodiment of the present invention, the film-formation method described in any of Embodiments 1 and 2 may be adopted for at least one layer included in the EL layer, and formation methods of the other layers are not particularly limited.

For example, in the case where the light emitting element illustrated in FIG. 19A is formed, a material layer of the film-formation substrate described in any of Embodiments 1 and 2 is formed using a material which forms the light emitting layer 1913, and the light emitting layer 1913 is formed over the first electrode 1902 over the substrate 1901 using the film-formation substrate. Then, the second electrode 1904 is formed over the light emitting layer 1913, whereby the light emitting element in FIG. 19A can be obtained.

Any of a variety of materials can be used for the light emitting layer 1913. For example, a fluorescent compound which exhibits fluorescence or a phosphorescent compound which exhibits phosphorescence can be used.

Examples of a phosphorescent compound which is used for the light emitting layer 1913 include organometallic complexes given below. As a material for blue light emission, bis[2-(4',6'-difluorophenyl)pyridinato-N,$C^{2'}$]iridium(III)tetrakis(1-pyrazolyl)borate (abbr.: FIr6), bis[2-(4',6'-difluorophenyl)pyridinato-N,$C^{2'}$]iridium(III)picolinate (abbr.: FIrpic), bis[2-(3',5' bistrifluoromethylphenyl)pyridinato-N, $C^{2'}$]iridium(III)picolinate (abbr.: Ir(CF$_3$ ppy)$_2$(pic)), bis[2-(4',6'-difluorophenyl)pyridinato-N,$C^{2'}$]iridium(III)acetylacetonate (abbr.: FIr(acac)) or the like can be given. As a material for green light emission, tris(2-phenylpyridinato-N, $C^{2'}$)iridium(III) (abbr.: Ir(ppy)$_3$), bis[2-phenylpyridinato-N, $C^{2'}$]iridium(III)acetylacetonate (abbr.: Ir(ppy)$_2$(acac)), bis(1,2-diphenyl-1H-benzimidazolato)iridium(III)acetylacetonate (abbr.: Ir(pbi)$_2$(acac)), bis(benzo[h]quinolinato)iridium(III) acetylacetonate (abbr.: Ir(bzq)$_2$(acac)) or the like can be given. As a material for yellow light emission, bis(2,4-diphenyl-1,3-oxazolato-N, Oiridium(III)acetylacetonate (abbr.: Ir(dpo)$_2$(acac)), bis[2-(4'-perfluorophenylphenyl)pyridinato] iridium(III)acetylacetonate (abbr.: Ir(p-PF-ph)$_2$(acac)), bis (2-phenylbenzothiazolato-N,$C^{2'}$)iridium(III)acetylacetonate (abbr.: Ir(bt)$_2$(acac)) or the like can be given. As a material for orange light emission, tris(2-phenylquinolinato-N,$C^{2'}$)iridium(III) (abbr.: Ir(pq)$_3$), bis(2-phenylquinolinato-N,$C^{2'}$)iridium(III)acetylacetonate (abbr.: Ir(pq)$_2$(acac)) or the like can be given. As a material for red light emission, bis[2-(2'-benzo [4,5-a]thienyl)pyridinato-N,$C^{3'}$]iridium(III)acetylacetonate (abbr.: Ir(btp)$_2$(acac)), bis(1-phenylisoquinolinato-N,$C^{2'}$)iridium(III)acetylacetonate (abbr.: Ir(piq)$_2$(acac)), (acetylacetonato)bis[2,3-bis(4-fluorophenyl)quinoxalinato]iridium (III) (abbr.: Ir(Fdpq)$_2$(acac)), or (2,3,7,8,12,13,17,18-octaethyl-21H,23H-porphyrinato)platinum(II) (abbr.: PtOEP) can be given. In addition, a rare earth metal complex such as tris(acetylacetonato)(monophenanthroline)terbium (III) (abbr.: Tb(acac)$_3$(Phen)), tris(1,3-diphenyl-1,3-propanedionato)(monophenanthroline)europium(III) (abbr.: Eu(DBM)$_3$(Phen)), or tris[1-(2-thenoyl)-3,3,3-trifluoroacetonato](monophenanthroline)europium(III) (abbr.: Eu(TTA)$_3$(Phen)) performs light emission (electron transition between different multiplicities) from a rare earth metal ion; therefore, such a rare earth metal complex can be used as a phosphorescent compound.

Examples of a fluorescent compound which is used for the light emitting layer 1913 are given below. As a material for blue light emission, N,N'-bis[4-(9H-carbazol-9-yl)phenyl]-N,N'-diphenylstilbene-4,4'-diamine (abbr.: YGA2S), 4-(9H-carbazol-9-yl)-4'-(10-phenyl-9-anthryl)triphenylamine (abbr.: YGAPA), or the like can be given. As a material for green light emission, N-(9,10-diphenyl-2-anthryl)-N,9-diphenyl-9H-carbazol-3-amine (abbr.: 2PCAPA), N-[9,10-bis(1,1'-biphenyl-2-yl)-2-anthryl]-N,9-diphenyl-9H-carbazol-3-amine (abbr.: 2PCABPhA), N-(9,10-diphenyl-2-anthryl)-N,N',N'-triphenyl-1,4-phenylenediamine (abbr.: 2DPAPA), N-[9,10-bis(1,1'-biphenyl-2-yl)-2-anthryl]-N,N',N'-triphenyl-1,4-phenylenediamine (abbr.: 2DPABPhA), N-[9,10-bis(1,1'-biphenyl-2-yl)]-N-[4-(9H-carbazol-9-yl)phenyl]-N-phenylanthracen-2-amine (abbr.: 2YGABPhA), N,N,9-triphenylanthracen-9-amine (abbr.: DPhAPhA), or the like can be given. As a material for yellow light emission, rubrene, 5,12-bis(1,1'-biphenyl-4-yl)-6,11-diphenyltetracene (abbr.: BPT), or the like can be given. As a material for red light emission, N,N,N',N'-tetrakis(4-methylphenyl)tetracene-5,11-diamine (abbr.: p-mPhTD), 7,13-diphenyl-N,N,N',N'-tetrakis(4-methylphenyl)acenaphtho[1,2-a]fluoranthene-3,10-diamine (abbr.: p-mPhAFD), or the like can be given.

The light emitting layer 1913 may have a structure in which a substance having a high light emitting property (dopant material) is dispersed in another substance (host material), whereby crystallization of the light emitting layer can be suppressed. In addition, concentration quenching which results from high concentration of the substance having a high light emitting property can be suppressed.

As the substance in which the substance having a high light emitting property is to be dispersed, when the substance having a high light emitting property is a fluorescent compound, a substance having higher singlet excitation energy (the energy difference between a ground state and a singlet excited state) than the fluorescent compound is preferably used. When the substance having a high light emitting property is a phosphorescent compound, a substance having higher triplet excitation energy (the energy difference between a ground state and a triplet excited state) than the phosphorescent compound is preferably used.

Examples of host materials used for the light emitting layer 1913 include 4,4'-bis[N-(1-naphthyl)-N-phenylamino]biphenyl (abbr.: NPB), tris(8-quinolinolato)aluminum(III) (abbr.: Alq), [N-(9,9-dimethylfluoren-2-yl)-N-phenylamino]biphenyl (abbr.: DFLDPBi), bis(2-methyl-8-quinolinolato)(4-phenylphenolato)aluminum(III) (abbr.: BAlq), 4,4'-di(9-carbazolyl)biphenyl (abbr.: CBP), 2-tert-butyl-9,10-di(2-naphthyl)anthracene (abbr.: t-BuDNA), and 9-[4-(9-carbazolyl)phenyl]-10-phenylanthracene (abbr.: CzPA).

As the dopant material, any of the above-mentioned phosphorescent compounds and fluorescent compounds can be used.

When the light emitting layer 1913 has a structure in which a substance having a high light emitting property (dopant material) is dispersed in another substance (host material), a mixed layer of a host material and a guest material is formed as a material layer provided on the film-formation substrate. Alternatively, the material layer provided on the film-formation substrate may have a structure in which a layer containing a host material and a layer containing a dopant material are stacked. By forming the light emitting layer 1913 using a film-formation substrate with the material layer having such a structure, the light emitting layer 1913 has a structure in which the substance having a high light emitting property (dopant material) is dispersed in the substance in which a light emitting material is dispersed (host material). Note that for the light emitting layer 1913, two or more kinds of host materials and a dopant material may be used, or two or more kinds of dopant materials and a host material may be used. Alternatively, two or more kinds of host materials and two or more kinds of dopant materials may be used.

In the case where the light emitting element illustrated in FIG. 19B is formed, the deposition substrate described in Embodiments 1 and 2, which has a material layer for forming each layer in the EL layer 1903 (the hole injecting layer 1911, the hole transporting layer 1912, the light emitting layer 1913, the electron transporting layer 1914, and the electron injecting layer 1915) is prepared (see Embodiments 1 and 2). Film formation of each layer is performed using a different film-formation substrate by the method described in Embodiments 1 and 2, whereby the EL layer 1903 can be formed over the first electrode 1902 over the substrate 1901. Then, the second electrode 1904 is formed over the EL layer 1903; thus, the light emitting element illustrated in FIG. 19B can be formed.

For example, the hole injecting layer 1911 can be formed using molybdenum oxide, vanadium oxide, ruthenium oxide, tungsten oxide, manganese oxide, or the like. Alternatively, the hole injecting layer can be formed using a phthalocyanine-based compound such as phthalocyanine (abbr.: H$_2$Pc) or copper phthalocyanine (abbr.: CuPc), or the like.

As the hole injecting layer 1911, a layer which contains a substance having a high hole transporting property and a substance having an electron accepting property can be used. The layer which contains a substance having a high hole transporting property and a substance having an electron accepting property has high carrier density and an excellent hole injecting property. When the layer which contains a substance having a high hole transporting property and a substance having an electron accepting property is used as a hole injecting layer which is in contact with the electrode on the anode side, any of a variety of metals, alloys, electrically conductive compounds, mixtures thereof, and the like can be used as an anode material regardless of the magnitude of work function of a material of the electrode.

The layer which contains a substance having a high hole-transporting property and a substance having an electron-accepting property can be formed using, for example, a film-formation substrate having a material layer which is a stack of a layer containing a substance having a high hole-transporting property and a layer containing a substance having an electron-accepting property.

Examples of the substance having an electron-accepting property which is used for the hole injecting layer 1911 include 7,7,8,8-tetracyano-2,3,5,6-tetrafluoroquinodimethane (abbr.: F$_4$-TCNQ), chloranil, and the like, transition metal oxides, and further oxide of metal belonging to Group 4 to Group 8 of the periodic table. Specifically, vanadium oxide, niobium oxide, tantalum oxide, chromium oxide, molybdenum oxide, tungsten oxide, manganese oxide, and rhenium oxide having high electron-accepting properties are preferable. Among them, molybdenum oxide which is stable also in air, has a low hygroscopic property, and can be easily handled is especially preferable.

As the substance having a high hole-transporting property used for the hole injecting layer 1911, any of various compounds such as an aromatic amine compound, a carbazole derivative, and an aromatic hydrocarbon can be used. Note that preferably, the substance having a high hole-transporting property used for the hole injecting layer is a substance having a hole mobility of $10^{-6}$ cm$^2$/Vs or higher. Note that any other substance that has a hole-transporting property higher than an electron-transporting property may be used. Specific examples of the substance having a high hole-transporting property, which can be used for the hole injecting layer 1911, are given below.

Examples of an aromatic amine compound which can be used for the hole injecting layer 1911 include 4,4'-bis[N-(1-naphthyl)-N-phenylamino]biphenyl (abbr.: NPB), N,N'-bis(3-methylphenyl)-N,N'-diphenyl[1,1'-biphenyl]-4,4'-diamine (abbr.: TPD), 4,4',4''-tris(N,N-diphenylamino)triphenylamine (abbr.: TDATA), 4,4',4''-tris[N-(3-methylphenyl)-N-phenylamino]triphenylamine (abbr.: MTDATA), 4,4'-bis[N-(Spiro-9,9'-bifluoren-2-yl)-N-phenylamino]biphenyl (abbr.: BSPB), and the like. Other examples include N,N-bis(4-methylphenyl)(p-tolyl)-N,N'-diphenyl-p-phenylenediamine (abbr.: DTDPPA), 4,4'-bis[N-(4-diphenylaminophenyl)-N-phenylamino]biphenyl (abbr.: DPAB), 4,4'-bis(N-{4-[N'-(3-methylphenyl)-N'-phenylamino]phenyl}-N-phenylamino)biphenyl (abbr.: DNTPD), and 1,3,5-tris[N-(4-diphenylaminophenyl)-N-phenylamino]benzene (abbr.: DPA3B).

Specific examples of a carbazole derivative which can be used for the hole injecting layer 1911 include 3-[N-(9-phenylcarbazol-3-yl)-N-phenylamino]-9-phenylcarbazole (abbr.: PCzPCA1), 3,6-bis[N-(9-phenylcarbazol-3-yl)-N-phenylamino]-9-phenylcarbazole (abbr.: PCzPCA2), 3-[N-(1-naphthyl)-N-(9-phenylcarbazol-3-yl)amino]-9-phenylcarbazole (abbr.: PCzPCN1), and the like.

Other examples of a carbazole derivative which can be used for the hole injecting layer 1911 include 4,4'-di(N-carbazolyl)biphenyl (abbr.: CBP), 1,3,5-tris[4-(N-carbazolyl)phenyl]benzene (abbr.: TCPB), 9-[4-(10-phenyl-9-anthryl)phenyl]-9H-carbazole (abbr.: CzPA), 1,4-bis-[4-(N-carbazolyl)phenyl]-2,3,5,6-tetraphenylbenzene, and the like.

Examples of an aromatic hydrocarbon which can be used for the hole injecting layer 1911 include 2-tert-butyl-9,10-di(2-naphthyl)anthracene (abbr.: t-BuDNA), 2-tert-butyl-9,10-di(1-naphthyl)anthracene; 9,10-bis(3,5-diphenylphenyl)anthracene (abbr.: DPPA), 2-tert-butyl-9,10-bis(4-phenylphenyl)anthracene (abbr.: t-BuDBA), 9,10-di(2-naphthyl)anthracene (abbr.: DNA), 9,10-diphenylanthracene (abbr.: DPAnth), 2-tert-butylanthracene (abbr.: t-BuAnth), 9,10-bis(4-methyl-1-naphthyl)anthracene (abbr.: DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can also be used. As described above, an aromatic hydrocarbon having a hole mobility of $1\times10^{-6}$ cm$^2$/Vs or higher and having 14 to 42 carbon atoms is preferably used.

Note that an aromatic hydrocarbon which can be used for the hole injecting layer 1911 may have a vinyl skeleton. Examples of an aromatic hydrocarbon having a vinyl group include 4,4'-bis(2,2-diphenylvinyl)biphenyl (abbr.: DPVBi), 9,10-bis[4-(2,2-diphenylvinyl)phenyl]anthracene (abbr.: DPVPA), and the like.

The hole injecting layer 1911 can be formed by using a film-formation substrate having a material layer which is a stack of a layer containing a substance having a high hole transporting property and a layer containing a substance having an electron accepting property. When metal oxide is used as the substance having an electron accepting property, preferably, a layer which contains the metal oxide is formed after the layer which contains a substance having a high hole-transporting property be formed over the film-formation substrate. This is because, in many cases, metal oxide has a higher temperature at which deposition can be performed than a substance having a high hole transporting property. The film-formation substrate with such a structure makes it possible to efficiently form a substance having a high hole transporting property and metal oxide. In addition, local non-uniformity of the concentration in the formed film can be suppressed. Further, there are few kinds of solvents which allow both a substance having a high hole-transporting property and metal oxide to be dissolved or dispersed therein, and a mixed solution is not easily formed; therefore, it is difficult to directly form a mixed layer by a wet process. However, the use of the film-formation method according to one embodiment of the present invention makes it possible to easily form a mixed layer which contains a substance having a high hole transporting property and metal oxide.

In addition, the layer which contains a substance having a high hole transporting property and a substance having an electron accepting property is excellent in not only a hole injecting property but also a hole transporting property, and thus the above-described hole injecting layer 1911 may be used as the hole transporting layer.

The hole transporting layer 1912 is a layer which contains a substance having a high hole-transporting property. Examples of the substance having a high hole-transporting property include an aromatic amine compound such as 4,4'-bis[N-(1-naphthyl)-N-phenylamino]biphenyl (abbr.: NPB or α-NPD), N,N'-bis(3-methylphenyl)-N,N'-diphenyl-[1,1'-biphenyl]-4,4'-diamine (abbr.: TPD), 4,4',4''-tris(N,N-diphenylamino)triphenylamine (abbr.: TDATA), 4,4',4''-tris[N-(3-methylphenyl)-N-phenylamino]triphenylamine (abbr.: MTDATA), 4,4'-bis[N-(spiro-9,9'-bifluoren-2-yl)-N-phenylamino]biphenyl (abbr.: BSPB), and the like. Most of the substances mentioned here have a hole mobility of $10^{-6}$ cm$^2$/Vs or higher. Note that any other material which has a hole transporting property higher than an electron transporting property may be used. Note that the layer which contains a substance having a high hole transporting property is not limited to a single layer and may be a stacked layer of two or more layers formed using the above-mentioned substances.

The electron transporting layer 1914 is a layer which contains a substance having a high electron transporting property. Examples thereof include metal complexes having a quinoline skeleton or a benzoquinoline skeleton, such as tris(8-quinolinolato)aluminum (abbr.: Alq), tris(4-methyl-8-quinolinolato)aluminum (abbr.: Almq$_3$), bis(10-hydroxybenzo[h]quinolinato)beryllium (abbr.: BeBq$_2$), bis(2-methyl-8-quinolinolato)(4-phenylphenolato)aluminum (abbr.: BAlq), and the like. Other examples include metal complexes having an oxazole-based ligand or a thiazole-based ligand, such as bis[2-(2-hydroxyphenyl)benzoxazolato]zinc (abbr.: Zn(BOX)$_2$), and bis[2-(2-hydroxyphenyl)benzothiazolato]

zinc (abbr.: Zn(BTZ)$_2$). Besides metal complexes, other examples include 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-biphenylyl)-4-phenyl-5-(4-tert-butylbiphenyl)-1,2,4-triazole (abbr.: TAZ01), bathophenanthroline (abbr.: BPhen), bathocuproine (abbr.: BCP), and the like. Most of the substances mentioned here have an electron mobility of 10$^{-6}$ cm$^2$/Vs or higher. Note that any other material that has an electron transporting property higher than a hole transporting property may be used for the electron transporting layer. The electron transporting layer is not limited to a single layer and may be a stacked layer of two or more layers formed using the above-mentioned substances.

The electron injecting layer 1915 can be formed using an alkali metal compound or an alkaline earth metal compound, such as lithium fluoride (LiF), cesium fluoride (CsF), or calcium fluoride (CaF$_2$). Further, a layer in which a substance having an electron transporting property is combined with an alkali metal or an alkaline earth metal can be employed. For example, a layer of Alq containing magnesium (Mg) can be used. Note that, preferably, the layer in which a substance having an electron-transporting property is combined with an alkali metal or an alkaline earth metal is used as the electron injecting layer because electrons are efficiently injected from the second electrode 1904.

Note that there is no particular limitation on a stacked-layer structure of layers of the EL layer 1903. The EL layer 1903 may be formed by an appropriate combination of a light emitting layer with a layer formed using a substance having a high electron transporting property, a substance having a high hole transporting property, a substance having a high electron injecting property, a substance having a high hole injecting property, a bipolar substance (a substance having high electron transporting and hole transporting properties), or the like.

Light emission from the EL layer 1903 is extracted to the outside through one or both of the first electrode 1902 and the second electrode 1904. Therefore, one or both of the first electrode 1902 and the second electrode 1904 is/are an electrode having a light-transmitting property. In the case where only the first electrode 1902 is an electrode having a light-transmitting property, light is extracted from the substrate 1901 side through the first electrode 1902. In the case where only the second electrode 1904 is an electrode having a light-transmitting property, light is extracted from the side opposite to the substrate 1901 side through the second electrode 1904. In the case where both the first electrode 1902 and the second electrode 1904 are electrodes having a light-transmitting property, light is extracted from both the substrate 1901 side and the side opposite to the substrate 1901 side through the first electrode 1902 and the second electrode 1904.

Note that, although FIGS. 19A and 19B illustrate the structure in which the first electrode 1902 functioning as an anode is provided on the substrate 1901 side, the second electrode 1904 functioning as a cathode may be provided on the substrate 1901 side.

In addition, the formation method of the EL layer 1903 may be the film-formation method described in any of Embodiments 1 and 2. In particular, in separate formation of light-emitting layers, the film-formation method described in any of Embodiments 1 and 2 is preferably used. The film-formation method described in any of Embodiments 1 and 2 makes it possible to form a highly fine pattern, increase use efficiency of a material, improve characteristics of a light-emitting element, further, improve productivity and reduction fabrication cost.

In the method for fabricating a light emitting device according to one embodiment of the present invention, unlike a case where an EL layer is formed by a wet process directly on the deposition substrate, it is not necessary to take into consideration solubility of the layer which has been formed, or the like; therefore, a material to be formed as a film can be chosen from a wider range. Further, the number of layers to be stacked can be set freely. Accordingly, a light emitting device having a desired stacked structure can be fabricated using a desired material by the method for fabricating a light emitting element according to one embodiment of the present invention. In particular, it is important in terms of improvement in performance of the light emitting device that a kind of a material to be used or a stacked structure can be set freely when the size of a substrate is increased.

Note that the structure described in this embodiment can be combined with any structure of the other embodiments in this specification as appropriate.

Embodiment 8

In Embodiment 8, a light emitting device which is formed using the film-formation method described in any of Embodiments 1 to 6 will be described.

First, a passive-matrix light emitting device will be described with reference to FIGS. 20A to 20C and FIG. 21.

In a passive-matrix (also called simple-matrix) light emitting device, a plurality of anodes arranged in stripes (in stripe form) are provided to be perpendicular to a plurality of cathodes arranged in stripes. A light emitting layer is interposed at each intersection. Therefore, a pixel at an intersection of an anode which is selected (to which a voltage is applied) and a cathode which is selected emits light.

Figure 20A:
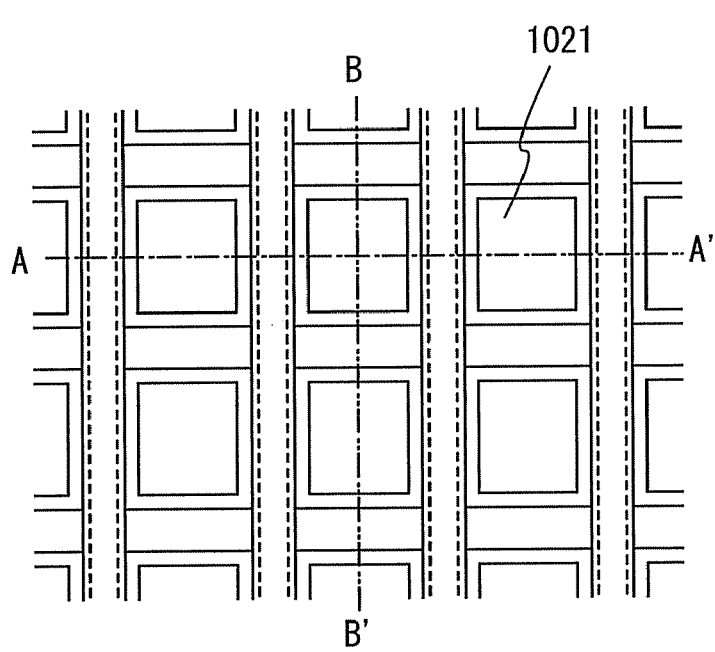
FIGS. 20A to 20C illustrate a passive-matrix light emitting device.
Figure 20C:
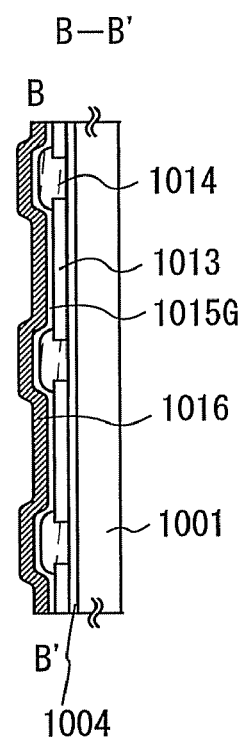
Figure 20B:
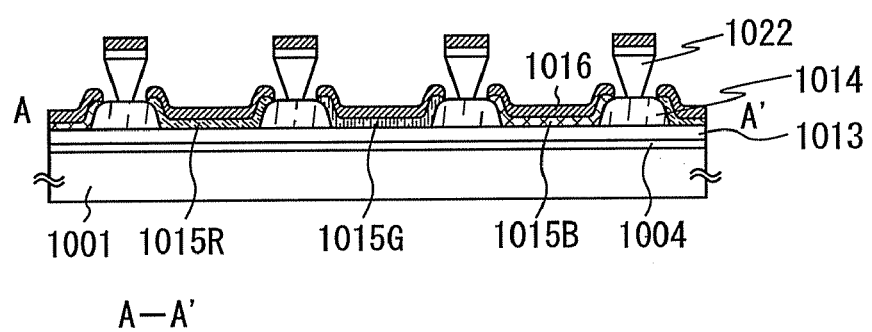

FIG. 20A illustrates a top view of a pixel portion before sealing. FIG. 20B illustrates a cross-sectional view taken along a dashed line A-A' in FIG. 20A. FIG. 20C illustrates a cross-sectional view taken along a dashed line B-B'.

Over a substrate 1001, an insulating layer 1004 is formed as a base insulating layer. Note that the base insulating layer is not necessarily provided. A plurality of first electrodes 1013 are arranged in stripes at regular intervals over the insulating layer 1004. A partition wall 1014 having openings each corresponding to a pixel is provided over the first electrodes 1013. The partition wall 1014 having openings is formed using an insulating material (a photosensitive or non-photosensitive organic material (polyimide, acrylic, polyamide, polyimide amide, resist, or benzocyclobutene) or an SOG film (such as a SiO$_x$ film including an alkyl group)). Note that each opening corresponding to a pixel is a light emitting region 1021.

Over the partition wall 1014 having openings, a plurality of inversely tapered partition walls 1022 which are parallel to each other are provided to intersect with the first electrodes 1013. The inversely tapered partition walls 1022 are formed by a photolithography method using a positive-type photosensitive resin, of which portion unexposed to light remains as a pattern, in which the amount of light exposure or the length of development time is adjusted so that a lower portion of the pattern is etched more.

The total thickness of the partition wall 1014 having openings and the inversely tapered partition wall 1022 is set to be larger than the total thickness of an EL layer and a second electrode 1016. Thus, an EL layer which is divided into plural regions, specifically, an EL layer (R) (1015R) formed using a material which exhibits red light emission, an EL layer (G) (1015G) formed using a material which exhibits green light emission, and an EL layer (B) (1015B) formed using a material which exhibits blue light emission; and the second electrode 1016 are formed. Note that the plurality of separated regions are electrically isolated from each other.

The second electrodes 1016 are electrodes in stripes which are parallel to each other and extended along a direction intersecting with the first electrodes 1013. Note that the EL layer and part of a conductive layer forming the second electrode 1016 are also formed over the inversely tapered partition walls 1022; however, they are separated from the EL layer (R) (1015R), the EL layer (G) (1015G), the EL layer (B) (1015B), and the second electrodes 1016. Note that the EL layer in this embodiment is a layer including at least a light emitting layer and may include a hole injecting layer, a hole transporting layer, an electron transporting layer, an electron injecting layer, or the like in addition to the light emitting layer.

Here, an example is described in which the EL layer (R) (1015R), the EL layer (G) (1015G), and the EL layer (B) (1015B) are selectively formed to form a light emitting device which provides three kinds of light emission (red (R), green (G), blue (B)) and is capable of performing full color display. The EL layer (R) (1015R), the EL layer (G) (1015G), and the EL layer (B) (1015B) are formed into stripes parallel to each other. These EL layers may be formed by the film-formation method described in any of Embodiment 1 to 6.

Furthermore, if necessary, sealing is performed using a sealant such as a sealant can or a glass substrate for sealing. Here, a glass substrate is used as a sealing substrate, and the substrate 1001 and the sealing substrate are attached to each other with an adhesive material such as a sealant to seal a space surrounded by the adhesive material such as a sealant. The space that is sealed is filled with a filler or a dry inert gas. In addition, a desiccant or the like may be put between the substrate and the sealant so that reliability of the light emitting device is increased. A small amount of moisture is removed by the desiccant, whereby sufficient drying is performed. The desiccant may be a substance which absorbs moisture by chemical adsorption, such as oxide of an alkaline earth metal as typified by calcium oxide or barium oxide. Note that a substance which adsorbs moisture by physical adsorption such as zeolite or silica gel may alternatively be used.

Note that, if the sealant is provided covering and being in contact with the light emitting element to sufficiently block the outside air, the desiccant is not necessarily provided.

Figure 21:
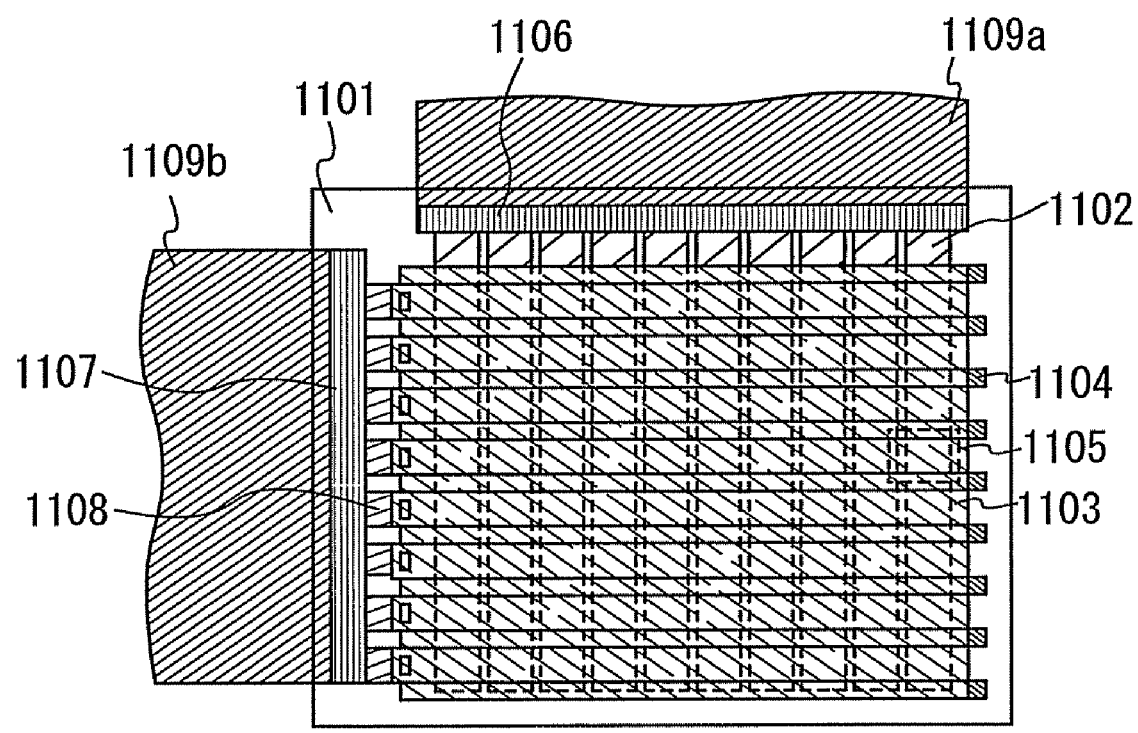
FIG. 21 illustrates a passive-matrix light emitting device.

Next, FIG. 21 illustrates a top view of the case in which the passive-matrix light emitting device in FIGS. 20A to 20C is mounted with an FPC or the like.

In FIG. 21, scan lines and data lines intersect with each other perpendicularly in a pixel portion for displaying images.

Here, the first electrodes 1013 in FIGS. 20A to 20C correspond to scan lines 1103 in FIG. 21; the second electrodes 1016 in FIGS. 20A to 20C correspond to data lines 1102 in FIG. 21; and the inversely tapered partition walls 1022 correspond to partition walls 1104. EL layers are sandwiched between the data lines 1102 and the scan lines 1103, and an intersection portion indicated by a region 1105 corresponds to one pixel.

Note that the scan line 1103 is electrically connected at its end to a connection wiring 1108, and the connection wiring 1108 is connected to an FPC 1109b through an input terminal 1107. The data line 1102 is connected to an FPC 1109a through an input terminal 1106.

If necessary, an optical film such as a polarizing plate, a circularly polarizing plate (including an elliptically polarizing plate), a retardation plate (a quarter-wave plate or a half-wave plate), or a color filter may be provided as appropriate over an emission surface. Further, the polarizing plate or the circularly polarizing plate may be provided with an antireflection film. For example, anti-glare treatment may be carried out by which reflected light can be diffused by surface roughness so as to reduce glare.

Although FIG. 21 illustrates the example in which a driver circuit is not provided over the substrate 1101, one embodiment of the present invention is not particularly limited to this example. An IC chip including a driver circuit may be mounted on the substrate 1101.

In the case where an IC chip is mounted, a data line side IC and a scan line side IC, in each of which a driver circuit for transmitting signals to the pixel portion is formed, are mounted on the periphery of (outside of) the pixel portion by a COG method. The mounting may be performed using a TCP or a wire bonding method other than a COG method. A TCP is a TAB tape mounted with an IC, and the TAB tape is connected to a wiring over an element-forming substrate for mounting the IC. Each of the data line side IC and the scan line side IC may be formed using a silicon substrate. Alternatively, a driver circuit may be formed using TFTs over a glass substrate, a quartz substrate, or a plastic substrate. Alternatively, a single IC is provided on one side, or a plurality of ICs may be provided on one side.

Figure 22A:
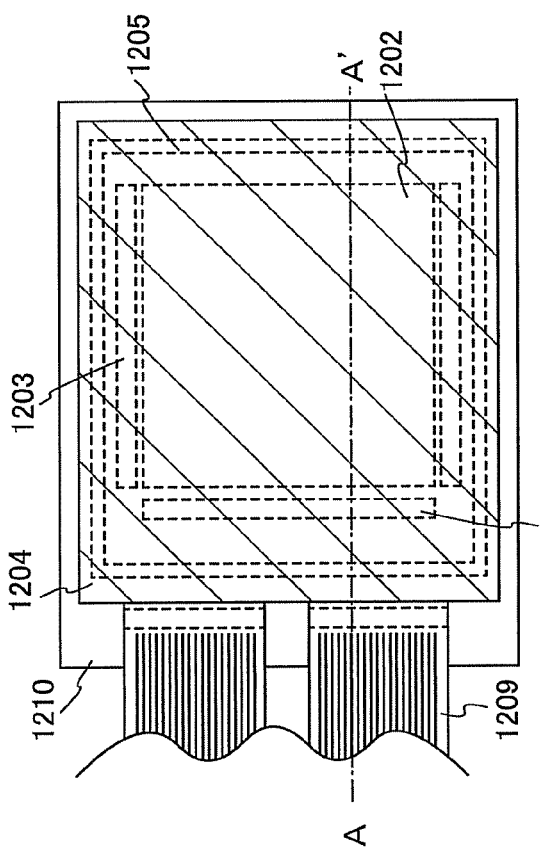
FIGS. 22A and 22B illustrate an active-matrix light emitting device.
Figure 22B:
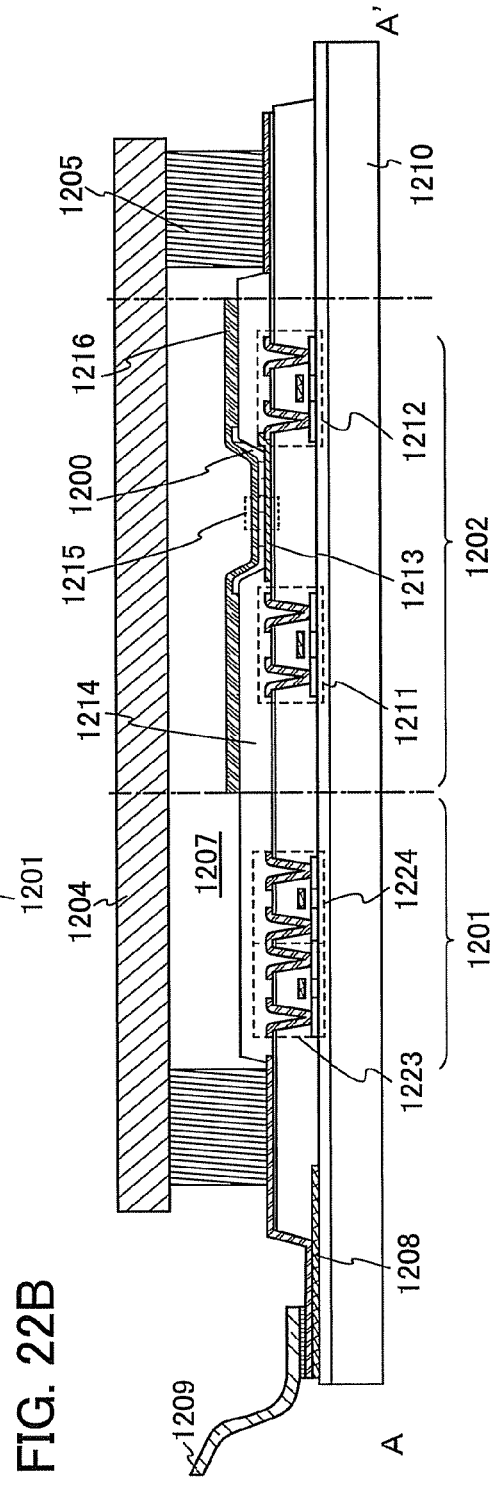

Next, an example of an active-matrix light emitting device is described with reference to FIGS. 22A and 22B. Note that FIG. 22A is a top view showing a light emitting device and FIG. 22B is a cross-sectional view taken along a dashed line A-A' in FIG. 22A. The active-matrix light emitting device of this embodiment includes a pixel portion 1202 provided over an element substrate 1210, a driver circuit portion (a source-side driver circuit) 1201, and a driver circuit portion (a gate-side driver circuit) 1203. The pixel portion 1202, the driver circuit portion (source-side driver circuit) 1201, and the driver circuit portion (gate-side driver circuit) 1203 are sealed, with a sealant 1205, between the element substrate 1210 and a sealing substrate 1204.

In addition, over the element substrate 1210, a lead wiring 1208 for connecting an external input terminal, through which an external signal (e.g., a video signal, a clock signal, a start signal, a reset signal, or the like) or an electric potential is transmitted to the driver circuit portion (source-side driver circuit) 1201 and the driver circuit portion (gate-side driver circuit) 1203 is provided. Here, an example is described in which a flexible printed circuit (FPC) 1209 is provided as the external input terminal. Note that only the FPC is illustrated here; however, the FPC may be provided with a printed wiring board (PWB). The light emitting device in this specification includes not only the light emitting device itself, but also the light emitting device with an FPC or a PWB attached thereto.

Then, a cross-sectional structure is described with reference to FIG. 22B. Although the driver circuit portion and the pixel portion are provided over an element substrate 1210, FIG. 22B illustrates the driver circuit portion 1201, which is the source side driver circuit, and the pixel portion 1202.

An example is illustrated in which a CMOS circuit which is a combination of an n-channel TFT 1223 and a p-channel TFT 1224 is formed as the driver circuit portion (source-side driver circuit) 1201. Note that a circuit included in the driver circuit portion may be formed using various CMOS circuits, PMOS circuits, or NMOS circuits. In this embodiment, a driver-integrated type in which a driver circuit is formed over the same substrate as the pixel portion is described, but not limited to, a driver circuit can be formed not over but outside the substrate.

The pixel portion 1202 includes a plurality of pixels, each of which includes a switching TFT 1211, a current-controlling TFT 1212, and a first electrode 1213 which is electrically connected to a wiring (a source electrode or a drain electrode) of the current-controlling TFT 1212. Note that an insulator 1214 is formed covering an end portion of the first electrode 1213. In this embodiment, the insulator 1214 is formed using a positive photosensitive acrylic resin.

The insulator 1214 is preferably formed so as to have a curved surface with curvature at an upper end portion or a lower end portion in order to obtain favorable coverage by a film which is to be stacked over the insulator 1214. For example, in the case of using a positive photosensitive acrylic resin as a material for the insulator 1214, the insulator 1214 is preferably formed so as to have a curved surface with a curvature radius (0.2 µm to 3 µm) at the upper end portion thereof. Note that either a negative photosensitive material which becomes insoluble in an etchant by light irradiation or a positive photosensitive material which becomes soluble in an etchant by light irradiation can be used for the insulator 1214. As the insulator 1214, without limitation to an organic compound, either an organic compound or an inorganic compound such as silicon oxide or silicon oxynitride can be used.

An EL layer 1200 and a second electrode 1216 are stacked over the first electrode 1213. Note that when an ITO film is used as the first electrode 1213, and a stacked-layer film of a titanium nitride film and a film containing aluminum as its main component or a stacked-layer film of a titanium nitride film, a film containing aluminum as its main component, and a titanium nitride film is used as the wiring of the current-controlling TFT 1212 which is connected to the first electrode 1213, resistance of the wiring is low and favorable ohmic contact with the ITO film can be obtained. Note that, although not illustrated, the second electrode 1216 is electrically connected to the FPC 1209, which is an external input terminal.

In the EL layer 1200, at least the light emitting layer is provided, and in addition to the light emitting layer, a hole injecting layer, a hole transporting layer, an electron transporting layer, or an electron injecting layer is provided as appropriate. The first electrode 1213, the EL layer 1200, and the second electrode 1216 are stacked, whereby a light emitting element 1215 is formed.

Although the cross-sectional view in FIG. 22B illustrates only one light emitting element 1215, a plurality of light emitting elements are arranged in matrix in the pixel portion 1202. Light emitting elements which provide three kinds of light emissions (R, G, and B) are formed in the pixel portion 1202, whereby a light emitting device capable of full color display can be formed. Alternatively, a light emitting device capable of full color display may be formed by a combination with color filters.

Furthermore, the sealing substrate 1204 and the element substrate 1210 are attached to each other with the sealant 1205, whereby the light emitting element 1215 is provided in a space 1207 surrounded by the element substrate 1210, the sealing substrate 1204, and the sealant 1205. Note that the space 1207 may be filled with the sealant 1205 or with an inert gas (such as nitrogen or argon).

Note that an epoxy-based resin is preferably used as the sealant 1205. Preferably, such a material transmits as little moisture and oxygen as possible. As the sealing substrate 1204, a plastic substrate formed from fiberglass-reinforced plastics (FRP), polyvinyl fluoride (PVF), polyester, acrylic, or the like can be used besides a glass substrate or a quartz substrate.

As described above, a light emitting device can be obtained by applying one embodiment of the present invention. Since TFTs are needed for an active-matrix light emitting device, such a device tends to require higher manufacturing cost per device; however, application of one embodiment of the present invention makes it possible to suppress material loss of a light emitting device. Accordingly, the fabrication cost can be reduced totally.

By the method for fabricating the light emitting device according to one embodiment of the present invention, film formation can be conducted only in a desired region even when a large deposition substrate is used, and thus a finer pattern can be formed, and a high-definition light emitting device can be fabricated.

In the method for fabricating a light emitting device according to one embodiment of the present invention, film-formation substrates are prepared in advance and the used film-formation substrate is replaced with another, so that film formation can be performed on the deposition substrate one after another. Accordingly, the time needed for fabrication of the light emitting device (process time) can be shortened, and thus productivity can be increased.

The material layer of the film-formation substrate which has been used for film-formation once is removed and a new material layer is formed again, so that the film-formation substrate can be used plural times. Accordingly, the fabrication cost of a light emitting device can be reduced.

In the method for fabricating a light emitting device according to one embodiment of the present invention, unlike a case where an EL layer is formed directly on a deposition substrate by a wet process, it is not necessary to take into consideration solubility of the layer which has been formed, or the like; therefore, a material to be formed as a film can be chosen from a wider range. Further, the number of layers to be stacked can be set freely. Accordingly, a light emitting device having a desired stacked structure can be fabricated using a desired material by the method for fabricating a light emitting device according to one embodiment of the present invention. In particular, it is important in terms of improvement in performance of the light emitting device that a kind of a material to be used or a stacked structure can be set freely when the size of a substrate is increased.

By using the method for fabricating a light emitting device according to one embodiment of the present invention, a user does not have to adjust the deposition rate with a thickness monitor, and the film-formation process can be fully automated. Accordingly, productivity can be increased.

Note that the structure described in this embodiment can be combined with any structure of the other embodiments in this specification as appropriate.

Embodiment 9

In this embodiment, a variety of electronic devices completed using the light emitting device manufactured according to one embodiment of the present invention will be described with reference to FIGS. 23A to 23E.

Examples of electronic devices manufactured using the light emitting device according to one embodiment of the present invention include a television, a camera such as a video camera or a digital camera, a goggle type display (head mounted display), a navigation system, an audio reproducing device (such as a car audio and an audio component), a notebook type computer, a game machine, a portable information terminal (such as a mobile computer, a cellular phone, a portable game machine, and an electronic book reader), an image reproducing device provided with a recording medium (specifically, a device for reproducing a recording medium such as a digital video disc (DVD) and having a display device for displaying the reproduced image), a lighting device, and the like. Specific examples of these electronic devices are illustrated in FIGS. 23A to 23E.

Figure 23A:
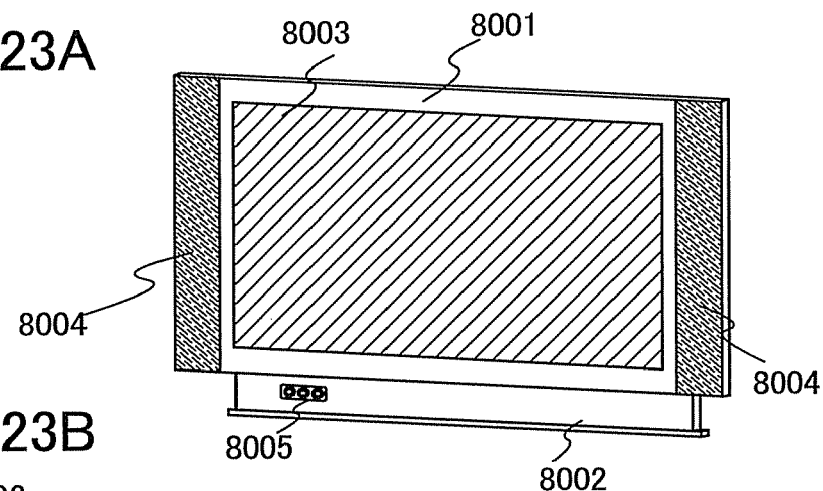
FIGS. 23A to 23E each illustrate an electronic device.

FIG. 23A illustrates a display device, which includes a chassis 8001, a support 8002, a display portion 8003, a speaker portion 8004, a video input terminal 8005, and the like. This display device is manufactured using a light emitting device which is formed according to one embodiment the present invention in the display portion 8003. Note that the display device includes all devices for displaying information in its category, such as for a computer, for receiving TV broadcasting, and for displaying an advertisement. According to one embodiment the present invention, use efficiency of a material and fabrication efficiency can be mainly improved in a film-formation process of a light emitting device. Accordingly, manufacturing cost can be reduced and productivity can be increased in manufacturing a display device; thus, an inexpensive display device can be provided.

Figure 23B:
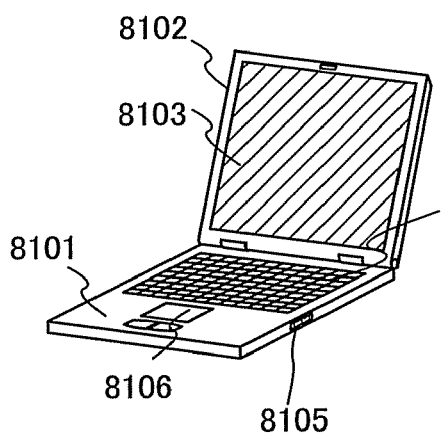

FIG. 23B illustrates a computer which includes a main body 8101, a chassis 8102, a display portion 8103, a keyboard 8104, an external connecting port 8105, a pointing device 8106, and the like. This computer is manufactured using a light emitting device which is formed according to one embodiment the present invention in the display portion 8103. According to one embodiment the present invention, use efficiency of a material and fabrication efficiency can be mainly improved in a film-formation process of a light emitting device. Accordingly, manufacturing cost can be reduced and productivity can be increased in manufacturing a computer; thus, an inexpensive computer can be provided.

Figure 23C:
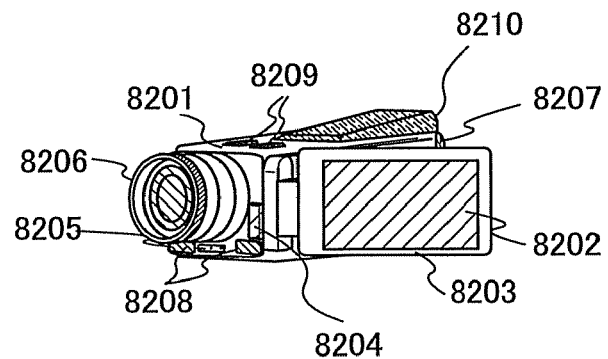

FIG. 23C illustrates a video camera which includes a main body 8201, a display portion 8202, a chassis 8203, an external connecting port 8204, a remote control receiving portion 8205, an image receiving portion 8206, a battery 8207, an audio input portion 8208, an operation key 8209, an eye piece portion 8210, and the like. This video camera is manufactured using a light emitting device which is formed according to one embodiment the present invention in the display portion 8202. According to one embodiment the present invention, use efficiency of a material and fabrication efficiency can be mainly improved in a film-formation process of a light emitting device. Accordingly, manufacturing cost can be reduced and productivity can be increased in manufacturing a video camera; thus, an inexpensive video camera can be provided.

Figure 23D:
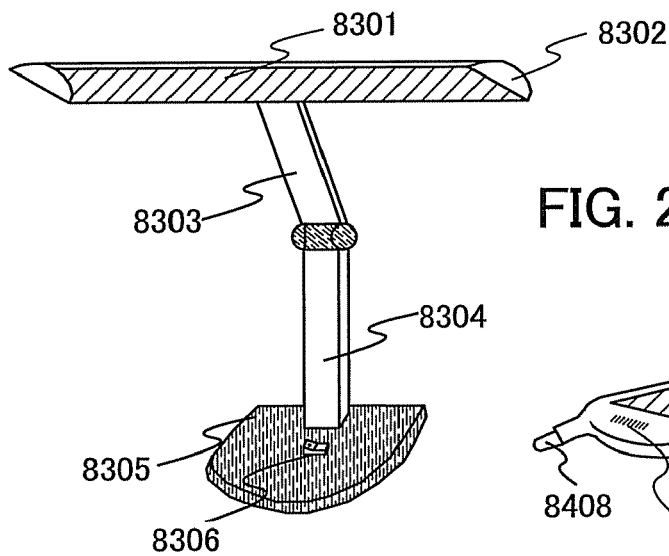

FIG. 23D illustrates a desk lamp which includes a lighting portion 8301, a shade 8302, an adjustable arm 8303, a support 8304, a base 8305, and a power supply switch 8306. This desk lamp is manufactured using a light emitting device which is formed according to one embodiment the present invention in the lighting portion 8301. Note that a lamp includes a ceiling light, a wall light, and the like in its category. According to one embodiment the present invention, use efficiency of a material and fabrication efficiency can be mainly improved in a film-formation process of a light emitting device. Accordingly, manufacturing cost can be reduced and productivity can be increased in manufacturing a desk lamp; thus, an inexpensive desk lamp can be provided.

Figure 23E:
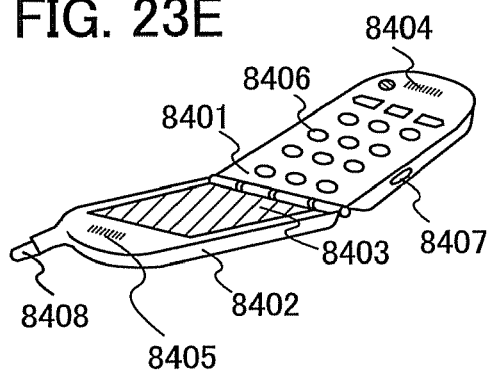

FIG. 23E illustrates a cellular phone which includes a main body 8401, a chassis 8402, a display portion 8403, an audio input portion 8404, an audio output power portion 8405, an operation key 8406, an external connecting port 8407, an antenna 8408, and the like. This cellular phone is manufactured using a light emitting device which is formed according to one embodiment the present invention in the display portion 8403. According to one embodiment the present invention, use efficiency of a material and fabrication efficiency can be mainly improved in a film-formation process of a light emitting device. Accordingly, manufacturing cost can be reduced and productivity can be increased in manufacturing a cellular phone; thus, an inexpensive cellular phone can be provided.

Figure 24A:
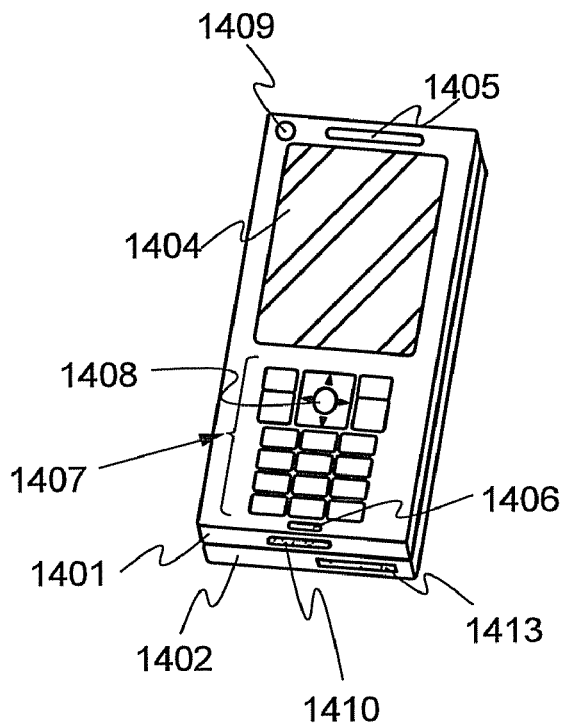
FIGS. 24A to 24C illustrate an electronic device.
Figure 24B:
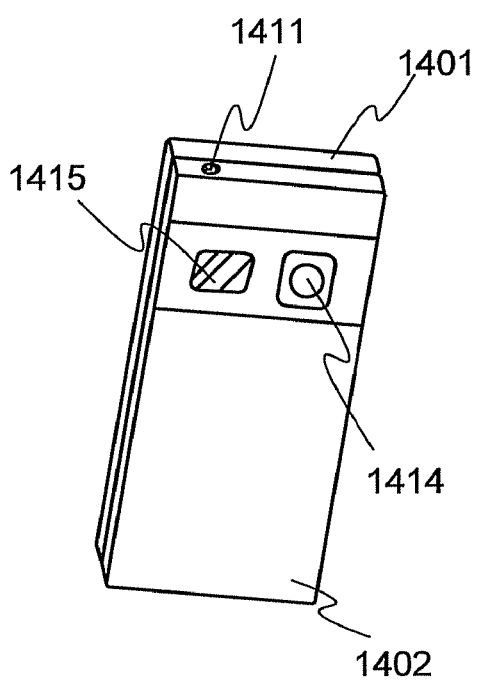
Figure 24C:
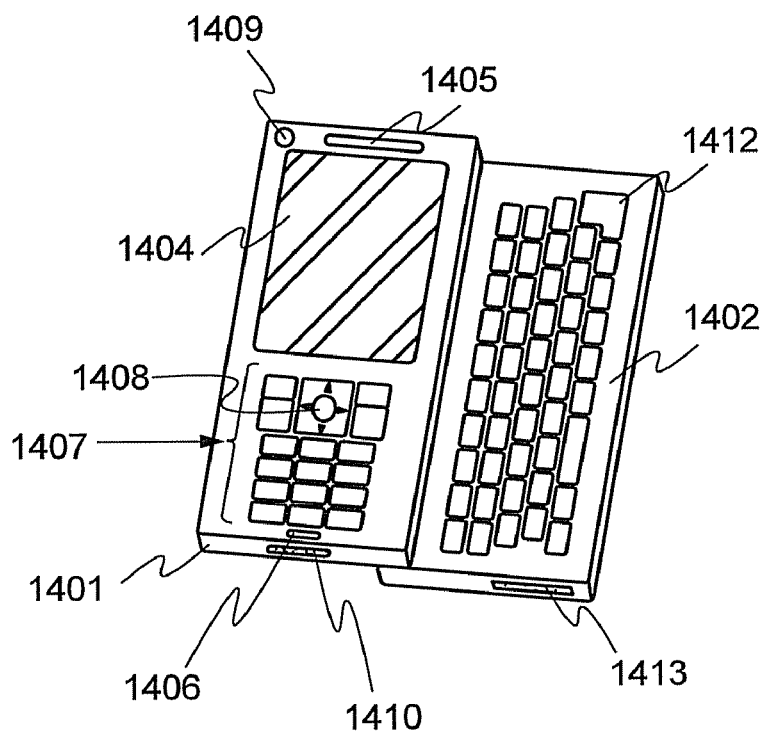

FIGS. 24A to 24C also illustrate a cellular phone and FIG. 24A is a front view, FIG. 24B is a rear view, and FIG. 24C is a development view. The cellular phone is a so-called smartphone which has both functions of a cellular phone and a portable information terminal, and incorporates a computer and can process a variety of data processing in addition to voice calls.

The main body has two chassis: a chassis 1401 and a chassis 1402. The chassis 1401 includes a display portion 1404, a speaker 1405, a microphone 1406, operation keys 1407, a pointing device 1408, a camera lens 1409, an external connection terminal 1410, and the like, while the chassis 1402 includes an earphone terminal 1411, a keyboard 1412, an external memory slot 1413, a camera lens 1414, a light 1415, and the like. In addition, an antenna is incorporated in the chassis 1401.

Further, in addition to the above-described structure, the smartphone may incorporate a non-contact IC chip, a small size memory device, or the like.

The light emitting device described in the above embodiments can be incorporated in the display portion 1404, and a display orientation can be changed as appropriate according to a usage pattern. Because the camera lens 1409 is provided in the same plane as the display portion 1404, the smartphone can be used as a videophone. Further, a still image and a moving image can be taken with the camera lens 1414 and the light 1415 using the display portion 1404 as a viewfinder. The speaker 1405 and the microphone 1406 can be used for video calling, recording and playing sound, and the like without being limited to voice calls.

With operation keys 1407, making and receiving calls, inputting simple information such as e-mails or the like, scrolling the screen, moving the cursor, and the like are possible. Furthermore, the chassis 1401 and the chassis 1402 (FIG. 24A), which are lapped with each other, can be slid open as illustrated in FIG. 24C, so that the cellular phone can be used as a portable information terminal. At this time, smooth operation can be conducted using the keyboard 1412 and the pointing device 1408. The external connection terminal 1410 can be connected to an AC adaptor and various types of cables such as a USB cable, and charging, data communication with a computer, or the like are possible. Furthermore, a large amount of data can be stored and moved by inserting a recording medium into the external memory slot 1413.

In addition to the above described functions, the cellular phone may have an infrared communication function, a television receiver function, and the like.

Note that this cellular phone is manufactured using a light emitting device which is formed according to one embodiment the present invention in the display portion 1404. According to one embodiment the present invention, use efficiency of a material and fabrication efficiency can be mainly improved in a film-formation process of a light emitting device. Accordingly, manufacturing cost can be reduced and productivity can be increased in manufacturing a cellular phone; thus, an inexpensive cellular phone can be provided.

As described above, an electronic device or a lighting device can be obtained by using the light emitting device according to one embodiment the present invention. The range of application of the light emitting device according to one embodiment the present invention is so wide that the light emitting device can be applied to electronic devices of various fields.

Note that the structure described in this embodiment can be combined with any structure of the other embodiments in this specification as appropriate.

What is claimed is:

1. A method for fabricating a light-emitting device, comprising:
preparing a first substrate which has a light-transmitting property and whose first face is provided with a light-absorbing layer;
irradiating a mixture including an organic compound and an inorganic material with light having a wavelength, which is absorbed by the inorganic material to heat the mixture, whereby a film of the organic compound included in the mixture is formed on the light-absorbing layer and the first face of the first substrate;
arranging the first face of the first substrate and a deposition surface of a second substrate so as to be adjacent to each other; and
irradiating with light having a wavelength, which is absorbed by the light-absorbing layer from a second face side of the first substrate, to heat the organic compound in contact with the light-absorbing layer, whereby at least part of the organic compound is formed as a film on the deposition surface of the second substrate.

2. The method for fabricating a light-emitting device according to claim 1, wherein a reflective layer having an opening portion is formed between the first substrate and the light-absorbing layer.

3. The method for fabricating a light-emitting device according to claim 2, wherein the reflective layer has a reflectance of 85% or higher with respect to the light delivered to the first substrate.

4. The method for fabricating a light-emitting device according to claim 2, wherein the reflective layer includes at least one of aluminum, silver, gold, platinum, copper, an alloy containing aluminum, and an alloy containing silver.

5. The method for fabricating a light-emitting device according to claim 2, wherein the first substrate includes a relieving layer between the reflective layer and the light-absorbing layer.

6. The method for fabricating a light-emitting device according to claim 5, wherein the relieving layer has a transmittance of 60% or higher with respect to light delivered to the first substrate, and thermal conductivity of a material used for the relieving layer is smaller than thermal conductivity of materials used for the reflective layer and the light-absorbing layer.

7. The method for fabricating a light-emitting device according to claim 5, wherein the relieving layer includes at least one of titanium oxide, silicon oxide, silicon nitride oxide, zirconium oxide, and silicon carbide.

8. The method for fabricating a light-emitting device according to claim 5, wherein a thickness of the relieving layer is from 10 nm to 2 µm inclusive.

9. The method for fabricating a light-emitting device according to claim 1, wherein the light-absorbing layer has a reflectance of 70% or lower with respect to the light delivered to the first substrate.

10. The method for fabricating a light-emitting device according to claim 1, wherein the light-absorbing layer includes at least one selected from the group consisting of metal nitride, metal, and carbon.

11. The method for fabricating a light-emitting device according to claim 1, wherein a thickness of the light-absorbing layer is from 10 nm to 600 nm inclusive.

12. The method for fabricating a light-emitting device according to claim 1, wherein the light delivered to the first substrate is laser light or lamp light.

13. The method for fabricating a light-emitting device according to claim 1, wherein the organic compound is a light-emitting material.

14. The method for fabricating a light-emitting device according to claim 1, wherein the inorganic material is at least one selected from the group consisting of metal nitride, metal, and carbon.

15. A method for fabricating a light-emitting device, comprising:
preparing a first substrate which has a light-transmitting property and whose first face is provided with a light-absorbing layer, and a second substrate whose first face is provided with a first electrode;
irradiating a mixture including an organic compound and an inorganic material with light having a wavelength, which is absorbed by the inorganic material to heat the mixture, whereby a film of the organic compound included in the mixture is formed on the light-absorbing layer and the first face of the first substrate;
arranging the first face of the first substrate and the first face of the second substrate so as to be adjacent to each other;
irradiating with light having a wavelength, which is absorbed by the light-absorbing layer from a second face side of the first substrate, to heat the organic compound in contact with the light-absorbing layer, whereby at least part of the organic compound is formed as a film on the first electrode on the second substrate; and
forming a second electrode on the organic compound formed as the film on the first electrode.

16. The method for fabricating a light-emitting device according to claim 15, wherein a reflective layer having an opening portion is formed between the first substrate and the light-absorbing layer.

17. The method for fabricating a light-emitting device according to claim 16, wherein the reflective layer has a reflectance of 85% or higher with respect to the light delivered to the first substrate.

18. The method for fabricating a light-emitting device according to claim 16, wherein the reflective layer includes at least one of aluminum, silver, gold, platinum, copper, an alloy containing aluminum, and an alloy containing silver.

19. The method for fabricating a light-emitting device according to claim 16, wherein the first substrate includes a relieving layer between the reflective layer and the light-absorbing layer.

20. The method for fabricating a light-emitting device according to claim 19, wherein the relieving layer has a transmittance of 60% or higher with respect to light delivered to the first substrate, and thermal conductivity of a material used for the relieving layer is smaller than thermal conductivity of materials used for the reflective layer and the light-absorbing layer.

21. The method for fabricating a light-emitting device according to claim 19, wherein the relieving layer includes at least one of titanium oxide, silicon oxide, silicon nitride oxide, zirconium oxide, and silicon carbide.

22. The method for fabricating a light-emitting device according to claim 19, wherein a thickness of the relieving layer is from 10 nm to 2 µm inclusive.

23. The method for fabricating a light-emitting device according to claim 15, wherein the light-absorbing layer has a reflectance of 70% or lower with respect to the light delivered to the first substrate.

24. The method for fabricating a light-emitting device according to claim 15, wherein the light-absorbing layer includes at least one selected from the group consisting of metal nitride, metal, and carbon.

25. The method for fabricating a light-emitting device according to claim 15, wherein a thickness of the light-absorbing layer is from 10 nm to 600 nm inclusive.

26. The method for fabricating a light-emitting device according to claim 15, wherein the light delivered to the first substrate is laser light or lamp light.

27. The method for fabricating a light-emitting device according to claim 15, wherein the organic compound is a light-emitting material.

28. The method for fabricating a light-emitting device according to claim 2, wherein the inorganic material is at least one selected from the group consisting of metal nitride, metal, and carbon.

29. A method for fabricating a light-emitting device, comprising:
   forming a reflective layer having an opening portion over a first face of a first substrate;
   forming a light-absorbing layer over the reflective layer and in the opening portion;
   forming a film of an organic compound on the light-absorbing layer by irradiating a mixture including the organic compound and an inorganic material with light having a wavelength, which is absorbed by the inorganic material;
   arranging the first face of the first substrate and a deposition surface of a second substrate so as to be adjacent to each other; and
   irradiating with light having a wavelength, which is absorbed by the light-absorbing layer from a second face side of the first substrate, to heat the organic compound in contact with the light-absorbing layer in the opening portion, whereby at least part of the organic compound is formed as a film on the deposition surface of the second substrate.

30. The method for fabricating a light-emitting device according to claim 29, wherein the reflective layer has a reflectance of 85% or higher with respect to the light delivered to the first substrate.

31. The method for fabricating a light-emitting device according to claim 29, wherein the reflective layer includes at least one of aluminum, silver, gold, platinum, copper, an alloy containing aluminum, and an alloy containing silver.

32. The method for fabricating a light-emitting device according to claim 29, wherein the first substrate includes a relieving layer between the reflective layer and the light-absorbing layer.

33. The method for fabricating a light-emitting device according to claim 32, wherein the relieving layer has a transmittance of 60% or higher with respect to light delivered to the first substrate, and thermal conductivity of a material used for the relieving layer is smaller than thermal conductivity of materials used for the reflective layer and the light-absorbing layer.

34. The method for fabricating a light-emitting device according to claim 32, wherein the relieving layer includes at least one of titanium oxide, silicon oxide, silicon nitride oxide, zirconium oxide, and silicon carbide.

35. The method for fabricating a light-emitting device according to claim 32, wherein a thickness of the relieving layer is from 10 nm to 2 μm inclusive.

36. The method for fabricating a light-emitting device according to claim 29, wherein the light-absorbing layer has a reflectance of 70% or lower with respect to the light delivered to the first substrate.

37. The method for fabricating a light-emitting device according to claim 29, wherein the light-absorbing layer includes at least one selected from the group consisting of metal nitride, metal, and carbon.

38. The method for fabricating a light-emitting device according to claim 29, wherein a thickness of the light-absorbing layer is from 10 nm to 600 nm inclusive.

39. The method for fabricating a light-emitting device according to claim 29, wherein the light delivered to the first substrate is laser light or lamp light.

40. The method for fabricating a light-emitting device according to claim 29, wherein the organic compound is a light-emitting material.

41. A method for fabricating a light-emitting device, comprising:
   forming a reflective layer having an opening portion over a first face of a first substrate;
   forming a light-absorbing layer over the reflective layer and in the opening portion;
   forming a film of an organic compound on the light-absorbing layer by irradiating a mixture including the organic compound and an inorganic material with light having a wavelength, which is absorbed by the inorganic material;
   forming a first electrode on a first face of a second substrate;
   arranging the first face of the first substrate and the first face of the second substrate so as to be adjacent to each other;
   irradiating with light having a wavelength, which is absorbed by the light-absorbing layer from a second face side of the first substrate, to heat the organic compound in contact with the light-absorbing layer in the opening portion, whereby at least part of the organic compound is formed as a film on the first electrode on the second substrate; and
   forming a second electrode on the organic compound farmed as the film on the first electrode.

42. The method for fabricating a light-emitting device according to claim 41, wherein the reflective layer has a reflectance of 85% or higher with respect to the light delivered to the first substrate.

43. The method for fabricating a light-emitting device according to claim 41, wherein the reflective layer includes at least one of aluminum, silver, gold, platinum, copper, an alloy containing aluminum, and an alloy containing silver.

44. The method for fabricating a light-emitting device according to claim 41, wherein the first substrate includes a relieving layer between the reflective layer and the light-absorbing layer.

45. The method for fabricating a light-emitting device according to claim 44, wherein the relieving layer has a transmittance of 60% or higher with respect to light delivered to the first substrate, and thermal conductivity of a material used for the relieving layer is smaller than thermal conductivity of materials used for the reflective layer and the light-absorbing layer.

46. The method for fabricating a light-emitting device according to claim 44, wherein the relieving layer includes at least one of titanium oxide, silicon oxide, silicon nitride oxide, zirconium oxide, and silicon carbide.

47. The method for fabricating a light-emitting device according to claim 44, wherein a thickness of the relieving layer is from 10 nm to 2 μm inclusive.

48. The method for fabricating a light-emitting device according to claim 41, wherein the light-absorbing layer has a reflectance of 70% or lower with respect to the light delivered to the first substrate.

49. The method for fabricating a light-emitting device according to claim 41, wherein the light-absorbing layer includes at least one selected from the group consisting of metal nitride, metal, and carbon.

50. The method for fabricating a light-emitting device according to claim 41, wherein a thickness of the light-absorbing layer is from 10 nm to 600 nm inclusive.

51. The method for fabricating a light-emitting device according to claim 41, wherein the light delivered to the first substrate is laser light or lamp light.

52. The method for fabricating a light-emitting device according to claim 41, wherein the organic compound is a light-emitting material.

* * * * *